(12) United States Patent
Nagashima

(10) Patent No.: US 10,985,175 B2
(45) Date of Patent: Apr. 20, 2021

(54) SEMICONDUCTOR MEMORY DEVICE

(71) Applicant: TOSHIBA MEMORY CORPORATION, Tokyo (JP)

(72) Inventor: Satoshi Nagashima, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 48 days.

(21) Appl. No.: 16/294,728

(22) Filed: Mar. 6, 2019

(65) Prior Publication Data

US 2020/0091181 A1 Mar. 19, 2020

(30) Foreign Application Priority Data

Sep. 19, 2018 (JP) .............................. JP2018-174660

(51) Int. Cl.

| | |
|---|---|
| H01L 27/11582 | (2017.01) |
| H01L 21/28 | (2006.01) |
| H01L 29/423 | (2006.01) |
| H01L 27/11565 | (2017.01) |
| H01L 27/1157 | (2017.01) |
| H01L 27/11556 | (2017.01) |
| H01L 27/11519 | (2017.01) |
| H01L 27/11524 | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/40117* (2019.08); *H01L 29/4234* (2013.01); *H01L 29/42324* (2013.01)

(58) Field of Classification Search
CPC ......... H01L 27/11582; H01L 29/40117; H01L 27/11556; H01L 27/11521; H01L 27/11563

See application file for complete search history.

(56) References Cited

U.S. PATENT DOCUMENTS

| | | | |
|---|---|---|---|
| 8,946,023 B2 | 2/2015 | Makala et al. | |
| 9,443,868 B1* | 9/2016 | Hu | ................... H01L 27/11556 |
| 9,666,594 B2 | 5/2017 | Mizuno et al. | |
| 9,728,552 B1* | 8/2017 | Fukumoto | ......... H01L 27/11568 |

(Continued)

FOREIGN PATENT DOCUMENTS

| | | |
|---|---|---|
| JP | 2016-092044 A | 5/2016 |
| JP | 2016-171243 A | 9/2016 |

*Primary Examiner* — Khaja Ahmad
*Assistant Examiner* — Khatib A Rahman
(74) *Attorney, Agent, or Firm* — Foley & Lardner LLP

(57) ABSTRACT

A semiconductor memory device comprises: stacked bodies adjacent to each other in a second direction, each comprising conductive layers stacked in a first direction; semiconductor portions arranged in a third direction between the stacked bodies, and comprising semiconductor layers facing the conductive layers, and a first insulating layer; and a second insulating layer provided between the semiconductor portions. The smallest distance from a geometrical center of gravity of the second insulating layer to the stacked body on a predetermined first cross-section being represented by D1; a distance from surfaces of the stacked bodies facing the semiconductor portion on a predetermined second cross-section being represented by D2, the relationship 2D1>D2 is satisfied.

13 Claims, 46 Drawing Sheets

(56) References Cited

U.S. PATENT DOCUMENTS

| | | | |
|---|---|---|---|
| 2012/0241843 A1* | 9/2012 | Iino | H01L 27/11582 |
| | | | 257/324 |
| 2016/0268282 A1* | 9/2016 | Ishibashi | H01L 27/11582 |
| 2016/0268304 A1 | 9/2016 | Ikeda et al. | |
| 2017/0018566 A1* | 1/2017 | Sonehara | H01L 27/11565 |
| 2017/0062467 A1* | 3/2017 | Hamanaka | H01L 21/26513 |
| 2017/0069646 A1* | 3/2017 | Arisumi | H01L 27/1157 |
| 2017/0069656 A1* | 3/2017 | Minami | H01L 27/11565 |
| 2017/0069657 A1* | 3/2017 | Hamanaka | H01L 21/32133 |
| 2017/0077128 A1* | 3/2017 | Uchiyama | H01L 27/1157 |
| 2017/0077131 A1* | 3/2017 | Konagai | H01L 27/11565 |
| 2017/0162596 A1 | 6/2017 | Tsuda et al. | |
| 2017/0256563 A1* | 9/2017 | Matsuda | H01L 27/11582 |
| 2017/0263612 A1* | 9/2017 | Yamashita | H01L 27/115 |
| 2017/0263614 A1* | 9/2017 | Tokuhira | H01L 29/40117 |
| 2017/0263630 A1* | 9/2017 | Noda | H01L 27/1157 |
| 2017/0271348 A1* | 9/2017 | Arai | H01L 29/40114 |
| 2017/0271349 A1* | 9/2017 | Miyagawa | H01L 27/11519 |
| 2017/0271359 A1* | 9/2017 | Sakamoto | H01L 27/11582 |
| 2017/0278852 A1* | 9/2017 | Kawai | H01L 28/00 |
| 2017/0278857 A1* | 9/2017 | Arai | H01L 27/11568 |

* cited by examiner

SEMICONDUCTOR MEMORY DEVICE

CROSS-REFERENCE TO RELATED APPLICATIONS

This application is based upon and claims the benefit of Japanese Patent Application No. 2018-174660, filed on Sep. 19, 2018, the entire contents of which are incorporated herein by reference.

BACKGROUND

Field

The embodiments presented herein relate to a semiconductor memory device.

Description of the Related Art

A semiconductor memory device comprising a substrate, a plurality of gate electrodes stacked in a first direction intersecting with a surface of the substrate, a semiconductor layer extending in the first direction and facing the plurality of gate electrodes, and a gate insulating film provided between the gate electrodes and the semiconductor layer, is known. The gate insulating film has a memory portion of, e.g., a silicon nitride (SiN) film or a floating gate, which can store data.

DETAILED DESCRIPTION

Figure 1:
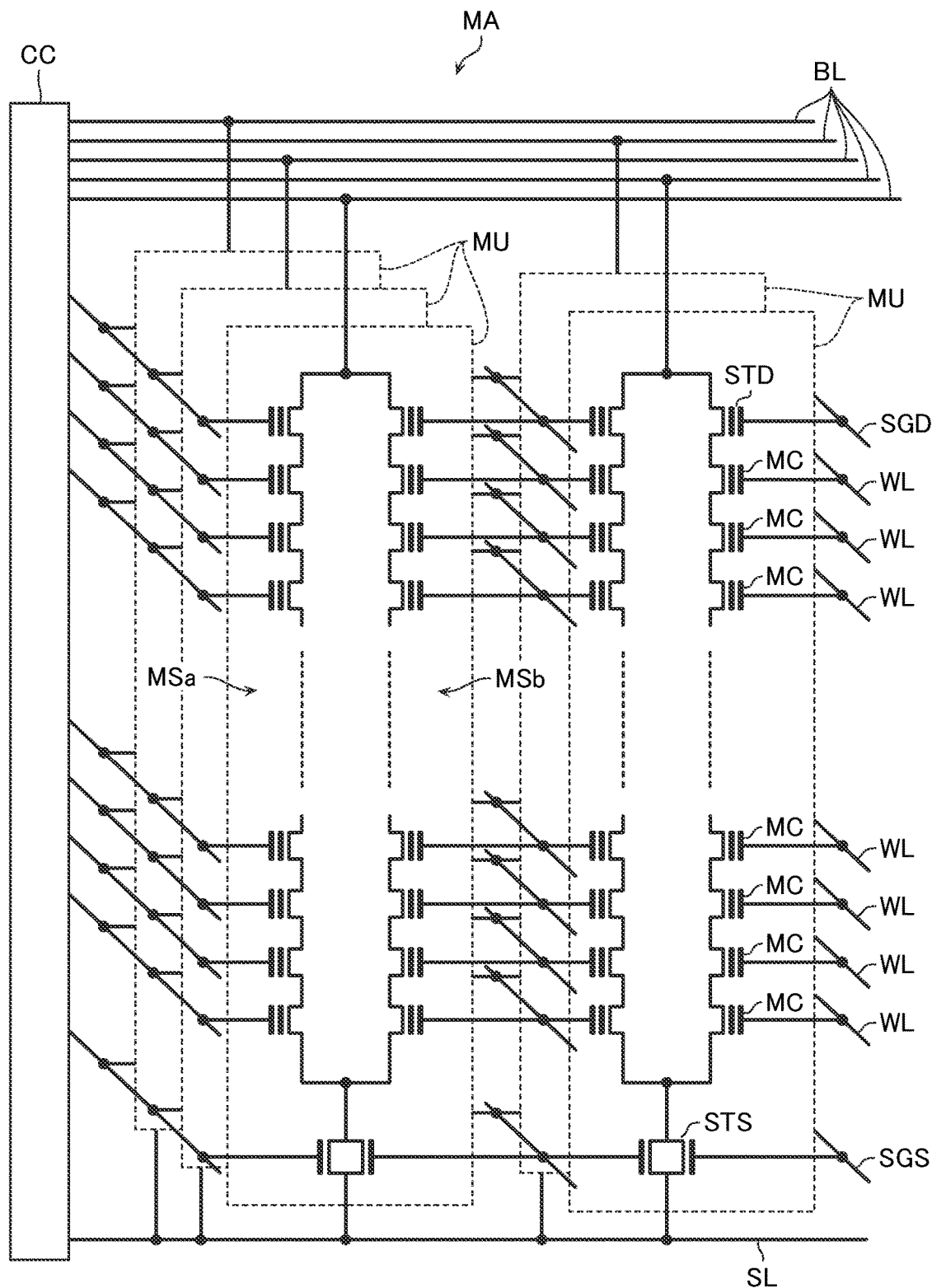
FIG. 1 is a schematic equivalent circuit diagram showing a configuration of a semiconductor memory device according to a first embodiment.

A semiconductor memory device according to one embodiment comprises: a substrate; a first stacked body comprising a plurality of first conductive layers stacked in a first direction intersecting with a surface of the substrate; a second stacked body comprising a plurality of second conductive layers stacked in the first direction, and being adjacent to the first stacked body in a second direction intersecting with the first direction; a plurality of semiconductor portions provided between the first stacked body and the second stacked body and arranged in a third direction intersecting with the first and second directions, the plurality of semiconductor portions comprising a first semiconductor layer facing the plurality of first conductive layers, a second semiconductor layer facing the plurality of second conductive layers, and a first insulating layer provided between the first semiconductor layer and the second semiconductor layer; a first memory portion storing information between the first conductive layers and the first semiconductor layer; a second memory portion storing information between the second conductive layers and the second semiconductor layer; and a second insulating layer provided between the semiconductor portions adjacent to each other in the third direction. The width in the second direction of the first insulating layer has local maxima at a first position in the first direction and a second position in the first direction different from the first position. In addition, referring to a cross-section which intersects with the first direction and on which the width in the second direction of at least one of the first insulating layers is the smallest in the range between the first and second positions as a first cross-section; the smallest distance from a geometrical center of gravity of the second insulating layer to the first or second stacked body on the first cross-section being represented by D1; referring to a cross-section which intersects with the first direction and on which a width in the second direction of at least one of the first insulating layers is the largest as a second cross-section; a distance from a surface of the first stacked body facing a predetermined one of the semiconductor portions to a surface of the second stacked body facing the predetermined one of the semiconductor portions on the second cross-section being represented by D2, a relationship 2D1>D2 is satisfied.

A semiconductor memory device according to another embodiment comprises: a substrate; a first stacked body comprising a plurality of first conductive layers stacked in a first direction intersecting with a surface of the substrate; a second stacked body comprising a plurality of second conductive layers stacked in the first direction, and being adjacent to the first stacked body in a second direction intersecting with the first direction; a plurality of semiconductor portions provided between the first stacked body and the second stacked body and arranged in a third direction intersecting with the first and second directions, the plurality of semiconductor portions comprising a first semiconductor layer facing the plurality of first conductive layers, a second semiconductor layer facing the plurality of second conductive layers, and a first insulating layer provided between the first semiconductor layer and the second semiconductor layer; a first memory portion storing information between the first conductive layer and the first semiconductor layer; a second memory portion storing information between the second conductive layer and the second semiconductor layer; and a second insulating layer provided between the semiconductor portions adjacent to each other in the third direction. The first insulating layer comprises a first insulating portion extending in the first direction and a second insulating portion extending in the first direction farther from the substrate than the first insulating portion. The second insulating layer comprises a third insulating portion extending in the first direction and a fourth insulating portion extending in the first direction farther from the substrate than the third insulating portion. In addition, referring to a distance between a center position in the second direction of the first insulating portion and a center position in the second direction of the second insulating portion as d1, and referring to a distance between the center position in the second direction of the second insulating portion and a center position in the second direction of the fourth insulating portion as d2, the relationship d1>d2 is satisfied.

Next, the semiconductor memory devices according to some embodiments will be described in detail with reference to drawings. Note that the following embodiments are presented by way of example only, and are not intended to limit the scope of the inventions.

In this specification, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as the Z direction.

In addition, in this specification, a direction along a predetermined plane may be referred to as a first direction, a direction along the predetermined plane and intersecting with the first direction as a second direction, and a direction intersecting with the predetermined plane as a third direction. Any of the first, second and third directions may or may not correspond to any of the X, Y, and Z directions.

In this specification, "up" and "down" signify relations to the substrate as a reference. For example, coming away from the substrate along the first direction may be represented as moving up, and coming closer to the substrate along the first direction is represented as moving down. In addition, a lower surface or a lower end of a component indicates the surface or end of the component on the substrate side, and an upper surface or an upper end of the component indicates an opposite surface or end of the component from the substrate. The surfaces of the component intersecting the second or third direction are referred to as lateral surfaces.

First Embodiment

[Configuration]

Next, a circuit configuration or the like of a semiconductor memory device according to a first embodiment will be described with reference to FIG. 1. For the convenience of description, some part of the configuration is omitted in FIG. 1.

A semiconductor memory device according to this embodiment comprises a memory cell array MA and a control circuit CC which controls the memory cell array MA.

The memory cell array MA comprises a plurality of memory units MU. Each of the plurality of memory units MU has two memory strings MSa, MSb, electrically independent of each other. One end of each of the memory strings MSa, MSb is connected to a drain selection transistor STD, and connected to a common bit line BL via the drain selection transistor STD. The other end of each of the memory strings MSa, MSb is connected to a common source selection transistor STS, and connected to a common source line SL via the source selection transistor STS.

Each of the memory strings MSa, MSb comprises a plurality of memory cells MC connected in series. The memory cell MC is a field-effect transistor comprising a semiconductor layer, a gate insulating film, and a gate electrode. The semiconductor layer functions as a channel region. The gate insulating film has a memory portion which can store data. The memory portion is, for example, a charge accumulation film such as silicon nitride (SiN) film or a floating gate. In that case, a threshold voltage of the memory cell MC varies according to an amount of charge in the charge accumulation film. The gate electrode is a part of a word line WL.

The selection transistors (STD, STS) are field-effect transistors each having a semiconductor layer, a gate insulating film and a gate electrode. The semiconductor layer functions as a channel region. The gate electrode of the drain selection transistor STD is a part of a drain selection gate line SGD. The gate electrode of the source selection transistor STS is a part of a source selection gate line SGS.

The control circuit CC generates voltages required for, e.g., read operation, write operation and erase operation, and applies them to a bit line BL, a source line SL, a word line WL, and the selection gate lines (SGD, SGS). The control circuit CC includes, for example, a plurality of transistors and lines provided on the same chip as that of the memory cell array MA. Note that the control circuit CC may comprise, e.g., a chip for control.

Next, a schematic configuration example of the semiconductor memory device according to this embodiment will be described with reference to FIGS. 2, 3A and 3B. For the convenience of description, some part of the configuration is omitted in FIGS. 2, 3A and 3B.

The semiconductor memory device according to this embodiment comprises a substrate 110 and a memory cell array MA provided above the substrate 110. The memory cell array MA comprises a first memory layer ML1, a connection layer CL provided above the first memory layer ML1, and a second memory layer ML2 provided above the connection layer CL. In addition, the semiconductor memory device comprises stacked bodies LS each including a plurality of conductive layers 120 stacked in the Z direction. The plurality of stacked bodies LS are provided in the Y direction, and a memory trench MT is provided between the stacked bodies LS. The stacked bodies LS and the memory trenches MT are disposed alternately in the Y direction. The memory trench MT has a plurality of narrow portions mt1 and a plurality of wide portions mt2 disposed in the X direction. The narrow portion mt1 is provided with a semiconductor portion 130 and a gate insulating film 140. The wide portion mt2 is provided with an insulating layer 150. A wiring layer 160 is connected to lower ends of a plurality of semiconductor portions 130.

The substrate 110 is, for example, a semiconductor substrate of monocrystalline silicon (Si). The substrate 110 has a double-well structure in which, for example, an n-type impurity layer is in an upper surface of a semiconductor substrate, and a p-type impurity layer is in the n-type impurity layer. Note that there may be provided on the surface of the substrate 110, for example, transistors, wirings, etc., which constitute the control circuit CC.

The conductive layer 120 is a substantially plate-like conductive layer extending in the X direction, which is, for example, a laminated film of titanium nitride (TiN) and tungsten (W), polycrystalline silicon (p-Si) injected with an impurity, or the like. Each conductive layer 120 functions as a word line WL and a gate electrode of a memory cell MC (FIG. 1), or a drain selection gate line SGD and a gate electrode of a drain selection transistor STD (FIG. 1).

As described above, the memory trench provided in the conductive layers 120 comprises the narrow portions mt1 and the wide portions mt2. Each wide portion mt2 has one side being connected on its periphery to a narrow portion mt1 and going away from the narrow portion mt1 in the Y direction. Thus, the wide portion mt2 is protruded from the narrow portion mt1 in the Y direction. The wide portion mt2 has the other side also being connected in its periphery to a narrow portion mt1 and going away from the narrow portion mt1 in the Y direction. Thus, the wide portion mt2 is substantially circular. The wide portion mt2 is provided with the insulating layer 150.

The wide portions mt2 is arranged in the X direction. The narrow portions mt1 are each positioned between the wide portions mt2 arranged in the X direction. The narrow portion mt1 is provided with the gate insulating film 140.

Below the plurality of conductive layers 120, a conductive layer 121 comprising, for example, the same material as the conductive layers 120 is provided. The conductive layer 121 functions as a gate electrode of the source selection gate line SGS and the source selection transistor STS (FIG. 1).

The insulating layers 122 of silicon oxide ($SiO_2$) or the like are each provided between the conductive layers 120, between the lowest of the conductive layer 120 and the conductive layer 121, and between the conductive layer 121 and the wiring layer 160.

Take any two stacked bodies LS adjacent to each other in the Y direction: a plurality of conductive layers 120 which one of the stacked bodies LS comprises may be referred to as first conductive layers 120$a$, and a plurality of conductive layers 120 which the other of the stacked bodies LS comprises may be referred to as second conductive layers 120$b$, hereinafter.

The memory trench MT is a trench between the first conductive layers 120$a$ and the second conductive layers 120$b$, the trench extending in the X direction. As described above, the memory trench MT comprises the plurality of narrow portions mt1 and the plurality of wide portions mt2 disposed in the X direction. Each narrow portion mt1 has almost constant width in the Y direction. Each wide portion mt2 is substantially circular, and has larger widths than those of the narrow portion mt1 in the Y direction. Note that for the shape of the wide portion mt2, it may be elliptical, rectangular, or other shapes.

On a Y-Z cross-sectional plane, the width in the Y direction of each memory trench MT varies according to the position in the Z direction, and is at the maximum on the connection layer CL. The width in the Y direction of each memory trench MT is at local minima in the vicinity of lower ends of the first memory layers ML1 and the second memory layer ML2. The width in the Y direction of each memory trench MT is at local maxima in the vicinity of upper ends of the first memory layer ML1 and the second memory layer ML2. Hereinafter, the inside structure of each memory trench MT on the connection layer CL may be referred to as a connection portion J.

The semiconductor portion 130 comprises a first semiconductor layer 131a and a second semiconductor layer 131b extending in the Z direction, and a semiconductor layer 133 connected to lower ends of the first and second semiconductor layers. In addition, an insulating layer 134 of silicon oxide ($SiO_2$) or the like is provided between the first semiconductor layer 131a and the second semiconductor layer 131b.

The first semiconductor layer 131a is a semiconductor layer of, for example, non-doped polycrystalline silicon (p-Si). Each first semiconductor layer 131a faces a plurality of first conductive layers 120a. The first semiconductor layer 131a functions as a channel region for the plurality of memory cells MC contained in the memory string MSa (FIG. 1) and the drain selection transistor STD.

The second semiconductor layer 131b is a semiconductor layer of, for example, non-doped polycrystalline silicon (p-Si). Each second semiconductor layer 131b faces a plurality of second conductive layers 120b. The second semiconductor layer 131b functions as a channel region for the plurality of memory cells MC contained in the memory string MSb (FIG. 1) and the drain selection transistor STD.

The semiconductor layer 133 faces two conductive layers 121 adjacent to each other in the Y direction. The semiconductor layer 133 is a semiconductor layer of polycrystalline silicon (p-Si), or the like, and functions as a channel region for the source selection transistor STS (FIG. 1). An insulating layer 135 of silicon oxide ($SiO_2$) or the like is provided between the semiconductor layer 133 and the conductive layer 121.

Furthermore, the semiconductor portion 130 comprises a first semiconductor portion P1 extending in the Z direction, and a second semiconductor portion P2 provided above the first semiconductor portion and extending in the Z direction. The first semiconductor portion P1 is included in the first memory layer ML1 of the semiconductor portion 130, and faces the plurality of conductive layers 120. A lower end of the first semiconductor portion P1 is connected to the wiring layer 160. The second semiconductor portion P2 is included in the second memory layer ML2 of the semiconductor portion 130, and faces the plurality of conductive layers 120. A lower end of the second semiconductor portion P2 is connected to an upper end of the first semiconductor portion P1. The first semiconductor portion P1 and the second semiconductor portion P2 each are in a substantially tapered shape on a cross-sectional plane intersecting with the X direction. Although not shown in the drawings, the first and second semiconductor portions P1 and P2 each is in a substantially reverse-tapered shape on a cross-sectional plane intersecting with the Y direction. Note that for the first semiconductor layer 131a, the second semiconductor layer 131b, and the insulating layer 134, included in the semiconductor portion 130, hereinafter, a portion of each included in the first memory layer ML1 may be referred to as a first portion, and a portion of each included in the second memory layer ML2 may be referred to as a second portion. These first and second portions each extend in the Z direction. Upper ends of the first portions are connected to lower ends of the second portions, respectively.

Figure 3A:
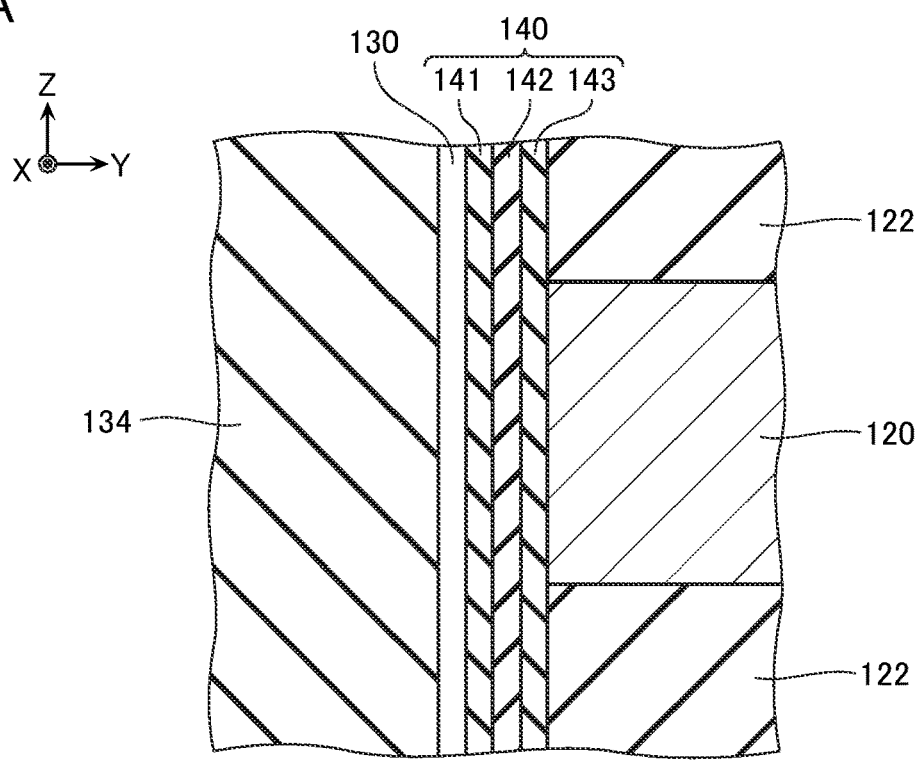
FIG. 3A is an enlarged view of a part of FIG. 2.

The gate insulating film 140 is provided between the semiconductor portion 130 and the conductive layer 120, for example, as shown in FIG. 3A. The gate insulating film 140 comprises a tunneling insulating film 141, a charge accumulation film 142, and a blocking insulating film 143. The tunneling insulating film 141 and the blocking insulating film 143 are insulating films of, for example, silicon oxide ($SiO_2$). The charge accumulation film 142 is an insulating film of, for example, silicon nitride (SiN).

Figure 3B:
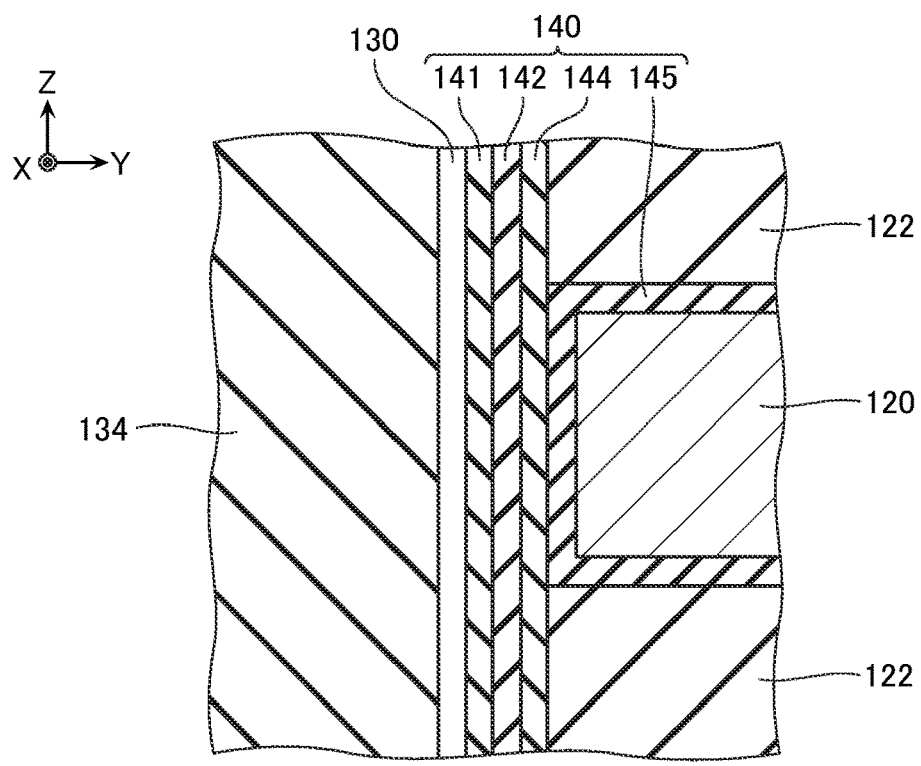
FIG. 3B shows a variation of the configuration shown in FIG. 3A.

Note that a part or the whole of films included in the gate insulating film 140 may be provided for each memory cell MC, for example, as shown FIG. 3B. In the example shown in FIG. 3B, the blocking insulating film comprises an insulating film 144 of silicon oxide ($SiO_2$) and an insulating film 145 of alumina ($Al_2O_3$). The insulating film 144 is provided to be shared by a plurality of memory cells MC arranged in the Z direction. The insulating film 145 is provided for each memory cell, and covers upper and lower surfaces of the conductive layer 120.

Figure 2:
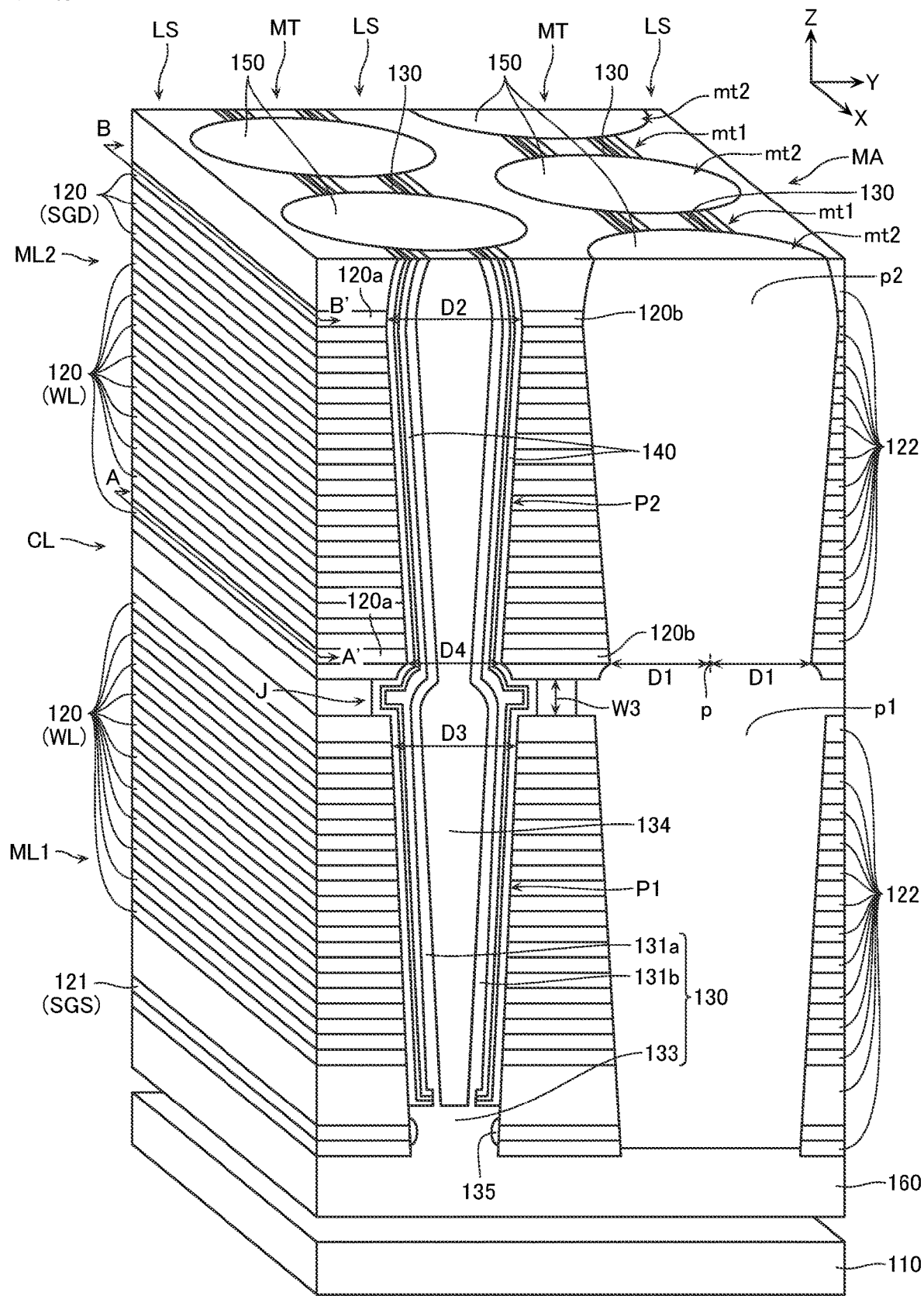
FIG. 2 is a schematic perspective view showing a semiconductor memory device.

The gate insulating film 140 is, as shown in FIG. 2, provided across the first memory layer ML1, the connection layer CL and the second memory layer ML2. In addition, a part of the gate insulating film 140 is included in the connection portion J. This part is protruded from the semiconductor portion 130 in the Y direction. Note that the structure of the connection portion J may be varied, as appropriate.

The insulating layer 150 is a substantially columnar insulating layer extending in the Z direction, for example, as shown in FIG. 2. Each of the widths in the X and Y directions of the insulating layer 150 is larger than those in the Y direction of the narrow portion mt1.

The insulating layer 150 is an insulating layer of, for example, silicon oxide ($SiO_2$). Note that the insulating layer 150 may comprise, for example, a plurality of materials, and may comprise a laminated film including the same composition as partial or complete composition of the gate insulating film 140.

In addition, the insulating layer 150 is provided with a first insulating portion p1 extending in the Z direction, and a second insulating portion p2 provided above the first insulating portion p1 and extending in the Z direction. The first insulating portion p1 and the second insulating portion p2 each are in a substantially tapered shape on a cross-sectional plane intersecting with the X direction. Although not shown in the drawings, each of the first and second insulating portions is also in an almost tapered shape on a cross-sectional plane intersecting with the Y direction.

The wiring layer 160 is a plate-like conductive layer extending in the X and Y directions. The wiring layer 160 is a conductive layer of polycrystalline silicon (p-Si) injected with an impurity, or the like, for example, and functions as the source line SL (FIG. 1). Note that the configuration of the source line may be changed, as appropriate. For example, the source line SL may be a part of a surface of the substrate 110.

Furthermore, the source line SL may include a metal layer such as titanium nitride (TiN) and tungsten (W). The source line SL may be connected to the lower end of the semiconductor portion 130 or a lateral surface in the Y direction of the semiconductor portion 130.

Figure 4:
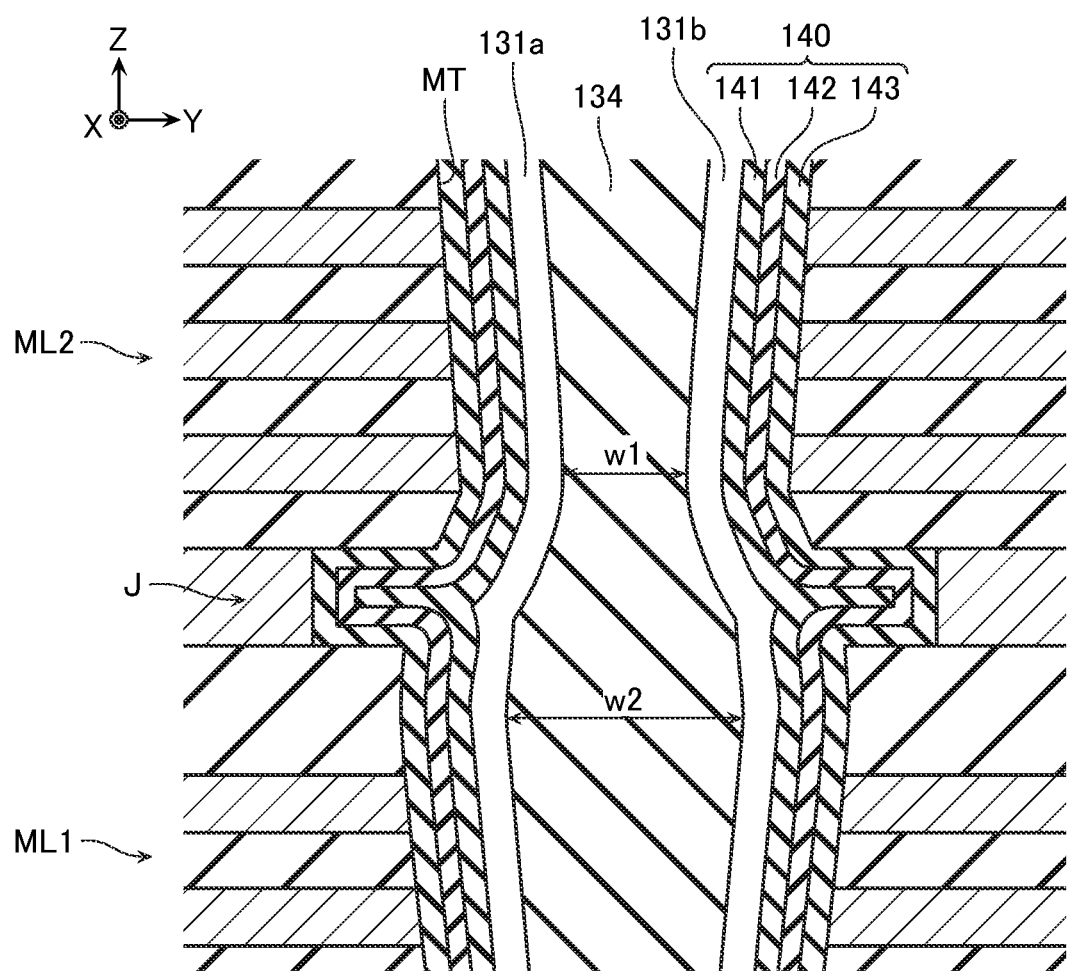
FIG. 4 is an enlarged view of a part of FIG. 2.
Figure 5:
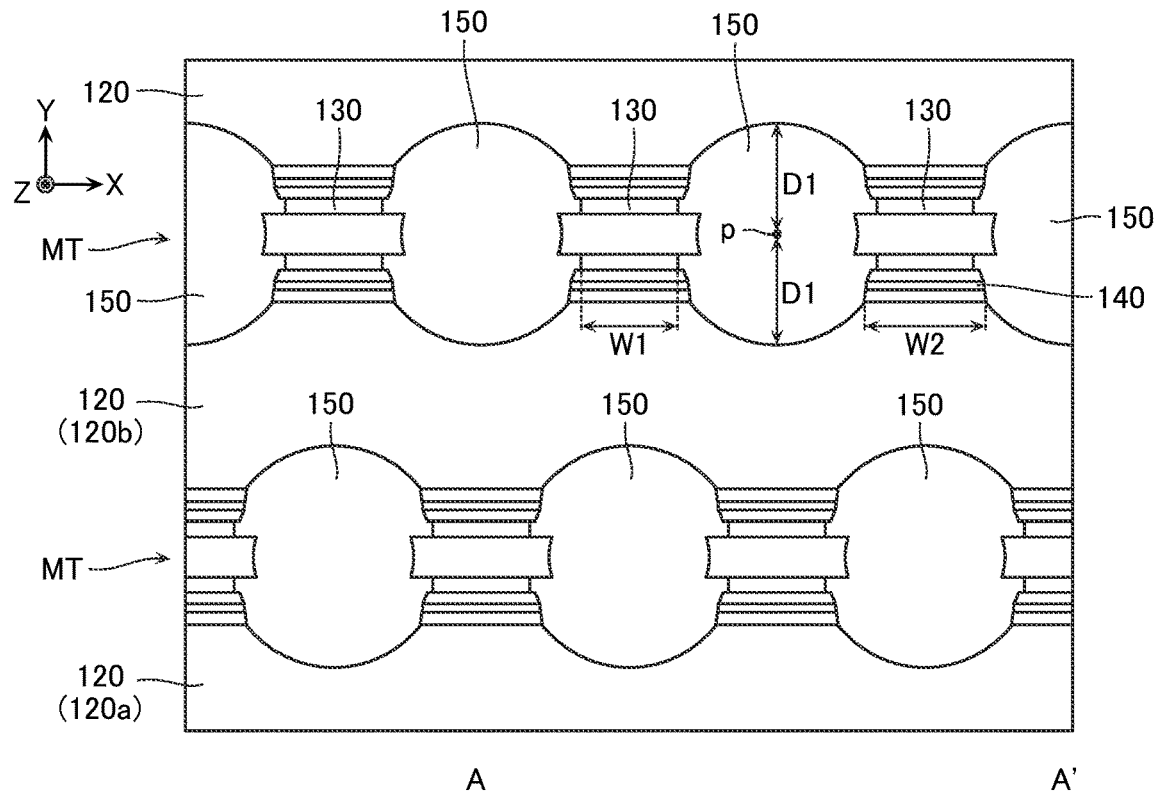
FIG. 5 is a schematic cross-sectional view that corresponds to a cutting plane indicated by a line A-A' in FIG. 2.
Figure 6:
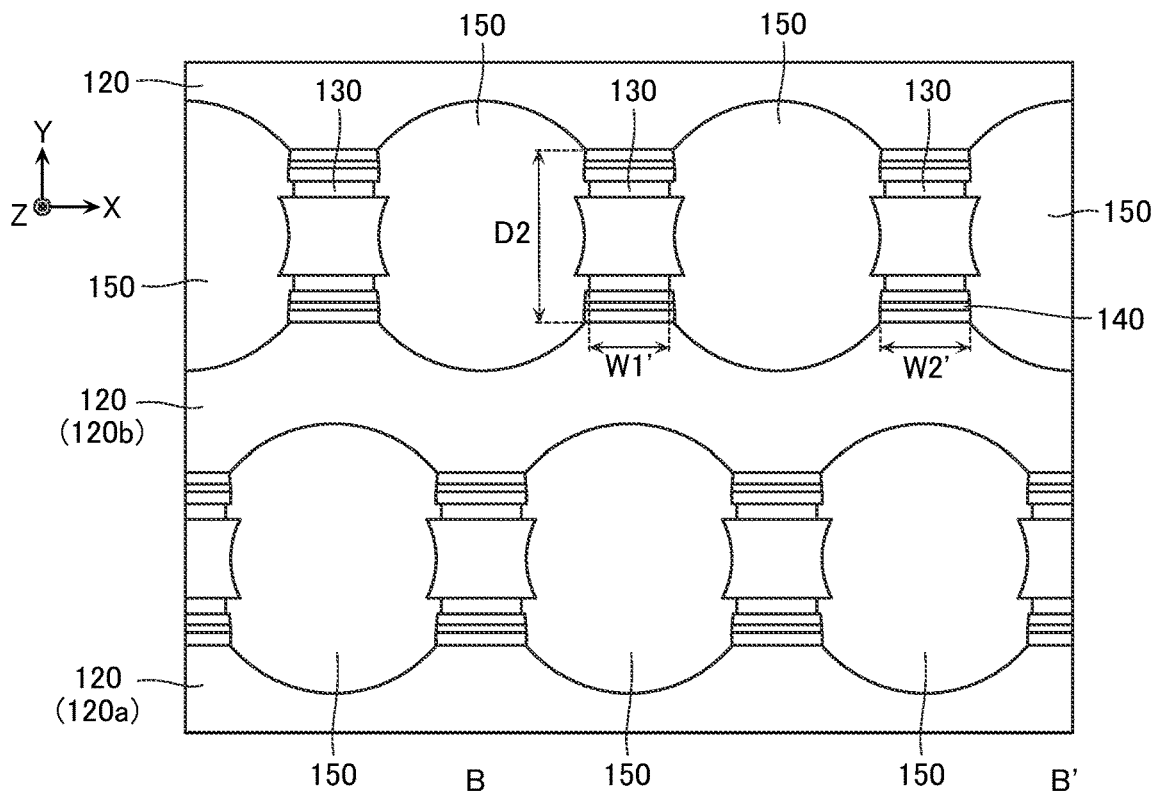
FIG. 6 is a schematic cross-sectional view that corresponds to a cutting plane indicated by a line B-B' in FIG. 2.

Next, with reference to FIGS. 2-6, widths of components, distances between components, etc., will be described. For the semiconductor memory device according to this embodiment, widths of some components, distances between some components, etc., may need to be in certain relationships owing to a manufacturing method. FIGS. 5 and 6 illustrate such relationships.

As described with reference to FIG. 2, the width in the Y direction of the memory trench MT is at local maxima in the vicinity of upper ends of the first memory layer ML1 and the second memory layer ML2, and at a local minimum in the vicinity of a lower end of the first memory layer ML1 and the second memory layer ML2, on a Y-Z cross-section plane. As shown in FIG. 4, on inside walls of the memory trench MT in the Y direction, the gate insulating film 140, and the first semiconductor layer 131a or the second semiconductor layer 131b are provided at an almost uniform thickness. Accordingly, the width in the Y direction of the insulating layer 134 is at local maxima in the vicinity of the upper ends of the first memory layer ML1 and the second memory layer ML2, and at a local minimum in the vicinity of the lower end of the first memory layer ML1 and the second memory layer ML2 corresponds to that of the memory trench MT. FIG. 4 shows an example of a local minimum value w1 and a local maximum value w2 of the width in the Y direction of the insulating layer 134. Note that assuming, for example, that the position in the Z direction at which the width in the Y direction of the insulating layer 134 in the first memory layer ML1 is at a local maximum is a first position, and that the position in the Z direction at which the width in the Y direction of the insulating layer 134 in the second memory layer ML2 is at a local maximum is a second position, the local minimum value w1 in FIG. 4 is the minimum value in a range between the first position and the second position.

FIG. 5 is an X-Y cross-sectional view that corresponds to a cross-section (a first cross-section) indicated by a line A-A' in FIG. 2. The first cross-section may be, for example, an X-Y cross-section at the position in the Z direction at which the width in the Y direction of the memory trench MT is at the minimum value or at a local minimum value. The first cross-section may also be, for example, an X-Y cross-section at the position in the Z direction at which the width in the Y direction of the insulating layer 134 is at the minimum value or at a local minimum value w1 (FIG. 4). However, the first cross-section may not be a cross-section that cuts through the vicinity of the lower end or the upper end of the memory trench MT. When the first cross-section is observed, for example, one of the plurality of first conductive layers 120a and one of the plurality of second conductive layers 120b, the distance in the Y direction between the former one and the latter one being the smallest, may be observed.

FIG. 6 is an X-Y cross-sectional view that corresponds to a cross-section (second cross-section) indicated by a line B-B' in FIG. 2. The second cross-section may be, for example, an X-Y cross-section at the position in the Z direction at which the width in the direction Y of the memory trench MT is at the maximum value or at a local maximum value. The second cross-section may also be, for example, on an X-Y cross-section at the position in the Z direction at which the width in the Y direction of the insulating layer 134 is at the maximum value or at a local maximum value w2 (FIG. 4). However, the second cross-section may be a cross-section inside the first memory layer ML1 or the second memory layer ML2, but not inside the connection layer CL. When the second cross-section is observed, for example, one of the plurality of first conductive layers 120a and one of the plurality of second conductive layers 120b, the distance in the Y direction between the former one and the latter one being the largest, may be observed.

The point "p" (FIG. 5) indicates a center point of the insulating layer 150 on the first cross-section. The center point "p" may be, for example, a geometrical center of gravity of the insulating layer 150. In that case, the geometrical center of gravity may be that of the insulating layer 150 that appears on the first cross-section on the assumption that the layer is uniform in terms of weight per area. It may also be a point indicated by the X coordinate value that indicates the center position in the X direction of the insulating layer 150 and the Y coordinate value that indicates the center position in the Y direction of the insulating layer 150. The center point "p" may also be determined by applying a circular, elliptical, rectangular, or other shape line to the contours of the insulating layer 150, and defining the center point of the applied shape as the center point.

D1 (FIG. 5) indicates the smallest distance from the center point "p" to the conductive layer 120 on the first cross-section. If the smallest distance from the center point "p" to the first conductive layer 120a is different from the smallest distance from the center point "p" to the second conductive layer 120b, for example, the smaller of the two distances may be taken as D1.

D2 (FIG. 6) indicates the distance in the Y direction between the first conductive layer 120a and the second conductive layer 120b on the second cross-section. In this embodiment, the relationship 2D1>D2 is satisfied. As shown in FIGS. 5 and 6, in this embodiment, widths W1, W1' (<W1) in the X direction of the semiconductor portion 130 are respectively smaller than widths W2, W2' (<W2) in the X direction of the gate insulating film 140. However, the widths W1, W1' of the semiconductor portion 130 may be respectively larger than the widths W2, W2' in the X direction of the gate insulating film 140.

D3 (FIG. 2) indicates the largest of the distances in the Y direction between the plurality of first conductive layers 120a and the second conductive layers 120b, included in the first memory layer ML1.

D4 (FIG. 2) indicates the smallest of the distances in the Y direction between the plurality of first conductive layers 120a and the second conductive layers 120b, included in the second memory layer ML2. In this embodiment, the relationship D3>D4 is satisfied.

W3 (FIG. 2) indicates the width in the Z direction of the connection layer CL (the width of the connection portion J in the Z direction). In this embodiment, the relationship D2>W3 is satisfied.

[Method for Manufacturing]

Next, a method for manufacturing the semiconductor memory device according to this embodiment will be described with reference to FIGS. 7-34.

Figure 7:
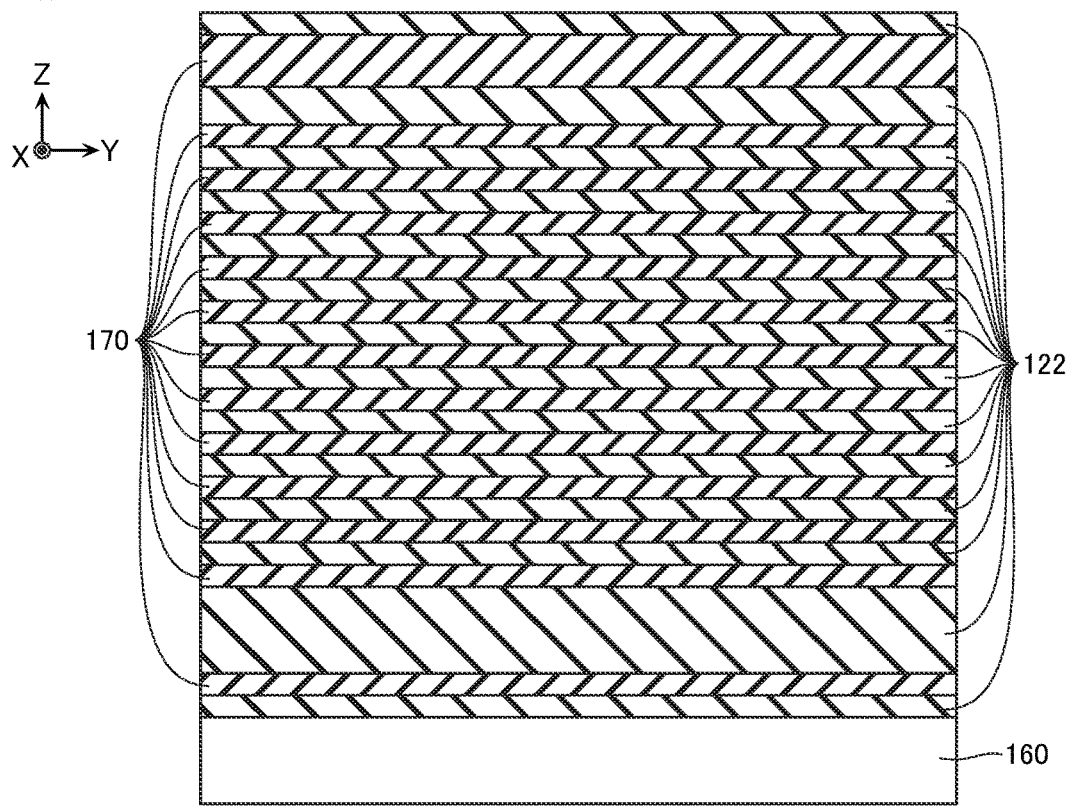
FIG. 7 is a schematic cross-sectional view showing a method for manufacturing the semiconductor memory device according to the first embodiment.

As shown in FIG. 7, in this method for manufacturing, the wiring layer 160 is formed above the substrate, which is not shown in the drawings. On the upper surface of the wiring layer 160, a plurality of insulating layers 122 and a plurality of sacrificial layers 170 are stacked alternately. The sacrificial layer 170 is composed of, for example, silicon nitride ($Si_3N_4$), etc. The wiring layer 160, the insulating layers 122 and the sacrificial layers 170 are formed by, e.g., CVD (chemical vapor deposition).

Figure 8:
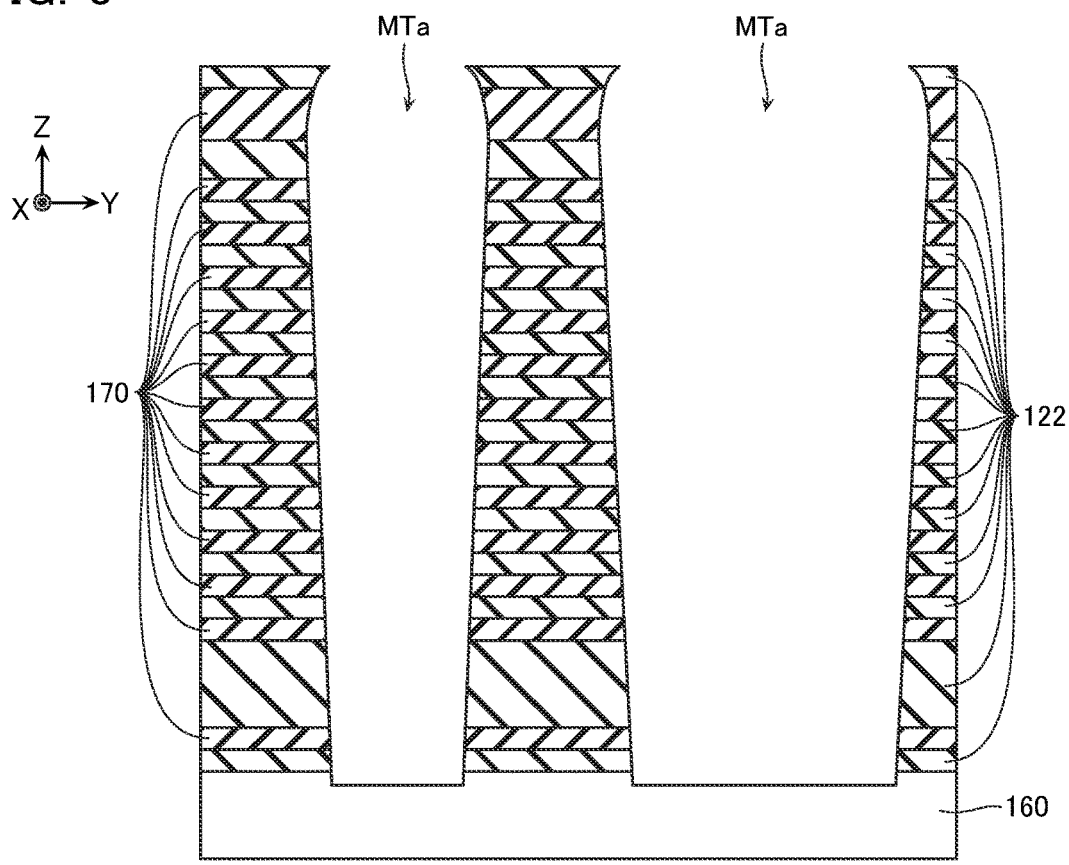
FIG. 8 is a schematic cross-sectional view showing the method for manufacturing the same.
Figure 9:
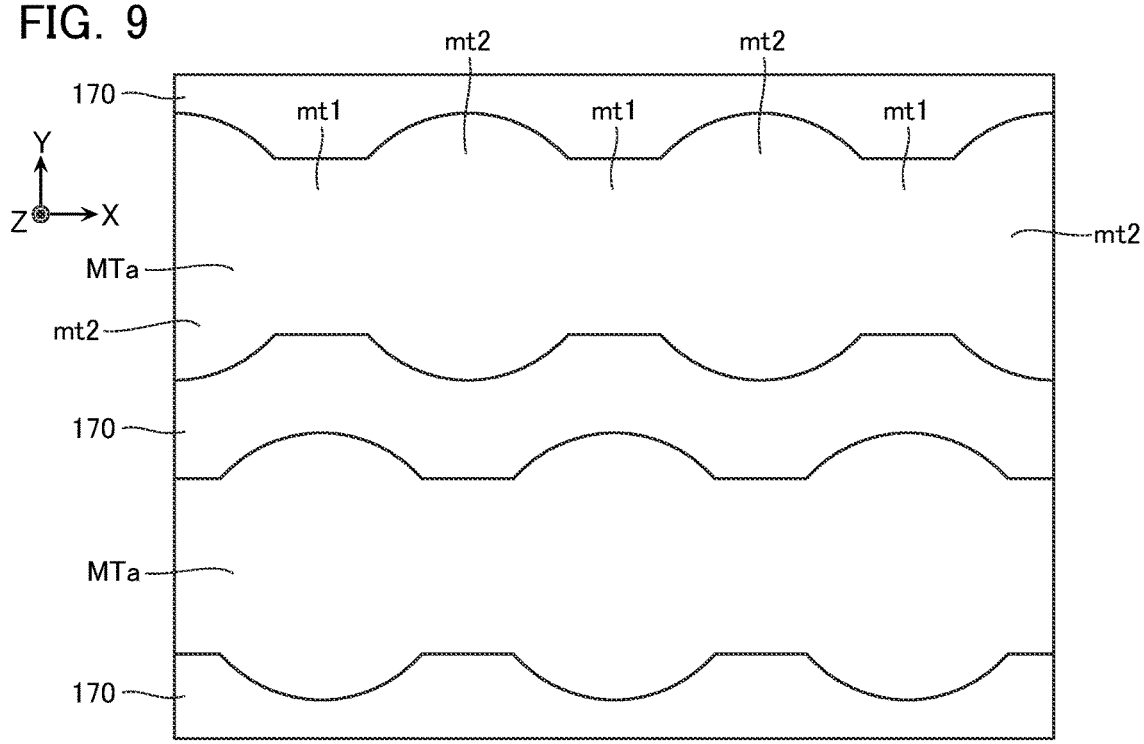
FIG. 9 is a schematic cross-sectional view showing the method for manufacturing the same.

Then, as shown in FIGS. 8 and 9, a memory trench MTa is formed in the insulating layers 122 and the sacrificial layers 170. The memory trench MTa is a portion of the memory trench MT (FIG. 2) that corresponds to the first memory layer ML1. The memory trench MTa is made, for example, by forming an insulating layer on the upper surface of the structure shown in FIG. 7, the insulating layer having an opening at a position corresponding to the memory trench MTa, and applying, e.g., RIE (reactive ion etching) to the structure with the insulating layer as a mask.

As shown in FIG. 8, the memory trench MTa extends in the Z direction, dividing the insulating layers 122 and the sacrificial layers 170 in the Y direction, and exposing the upper surface of the wiring layer 160. The width in the Y direction of the memory trench MTa varies according to the position in the Z direction.

Figure 10:
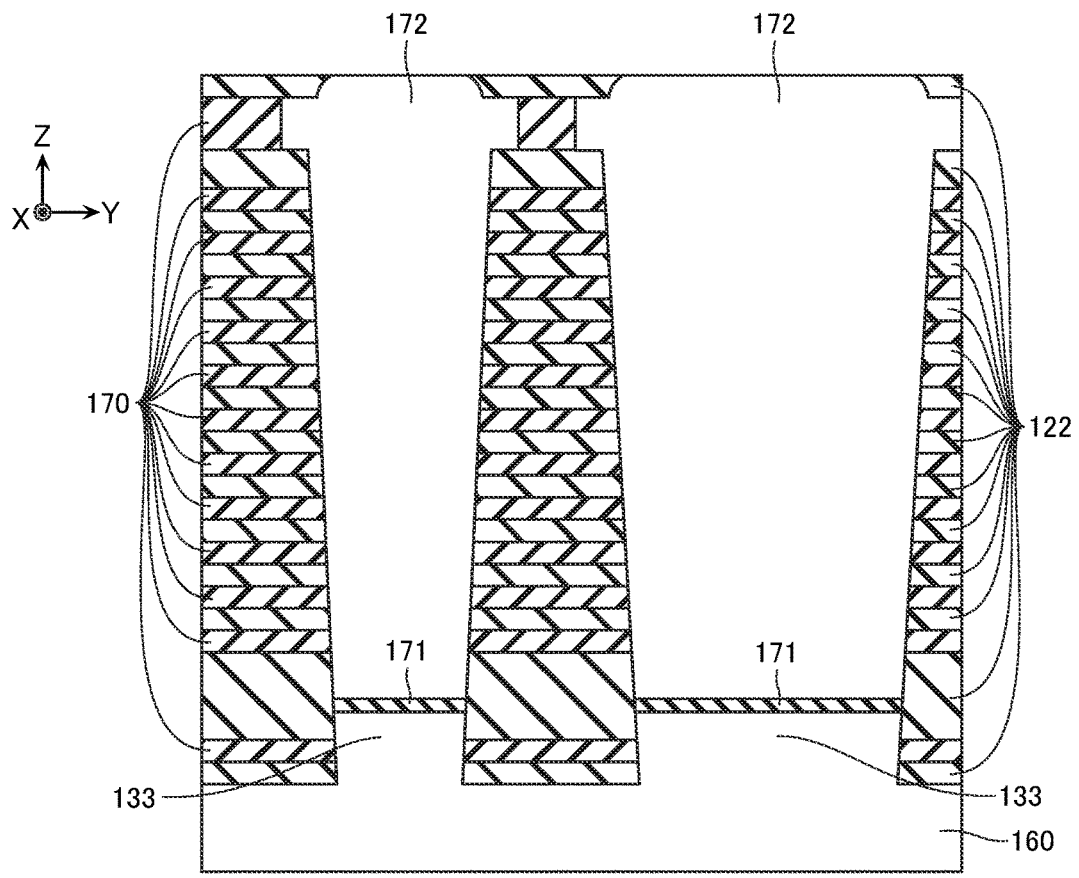
FIG. 10 is a schematic cross-sectional view showing the method for manufacturing the same.

Then, as shown in FIG. 10, inside the memory trench MTa, a semiconductor layer 133, a sacrificial layer 171 of silicon oxide (SiO2) or the like, and a sacrificial layer 172 of amorphous silicon (a-Si) or the like, are formed to fill the memory trench MTa. The semiconductor layer 133 is formed, for example, by epitaxial growth. The sacrificial layer 171 is formed, for example, by oxidation. The sacrificial layer 172 is formed, for example, by CVD and RIE etch back or the like.

Note that in this process, the portion of the memory trench MTa that corresponds to the connection layer CL (FIG. 2) may be expanded in the Y direction. The expansion is made, for example, by removing a part of the sacrificial layer 172 to expose lateral surfaces of the uppermost sacrificial layer 170, and removing a part of the uppermost sacrificial layer 170 by wet etching, or the like. Then, the sacrificial layer 172 is filled again, and the upper surface of the uppermost insulating layer 122 is exposed by RIE etch back, or the like.

Figure 11:
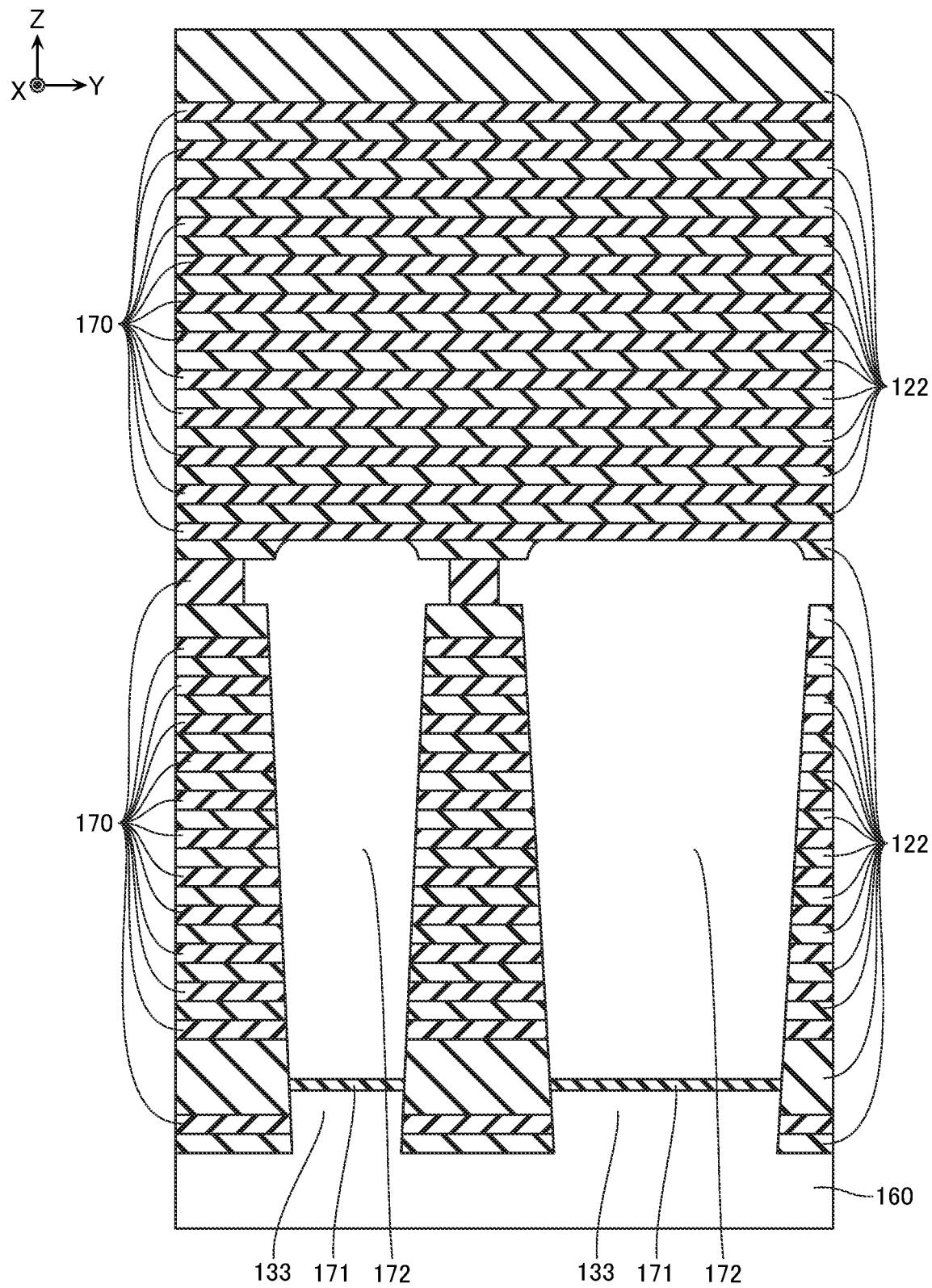
FIG. 11 is a schematic cross-sectional view showing the method for manufacturing the same.

Then, as shown in FIG. 11, the plurality of insulating layers 122 and the plurality of sacrificial layers 170 are stacked alternately on the upper surface of the structure shown in FIG. 10. This process is achieved, for example, in the same way as described with reference to FIG. 7.

Figure 12:
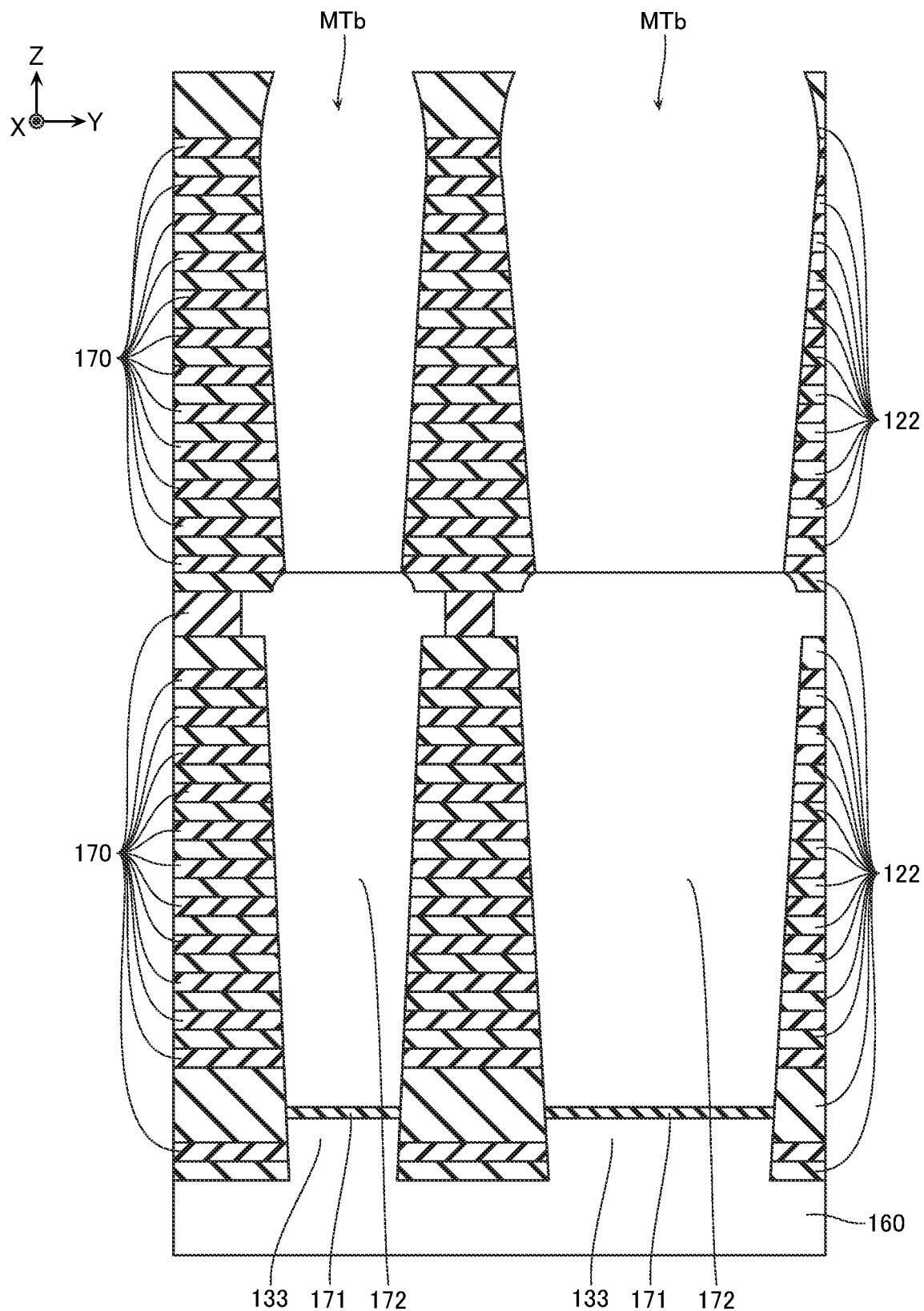
FIG. 12 is a schematic cross-sectional view showing the method for manufacturing the same.

Then, as shown in FIG. 12, a memory trench MTb is formed in the plurality of insulating layers 122 and the plurality of sacrificial layers 170, both as newly formed. The memory trench MTb is a portion of the above-mentioned memory trench MT (FIG. 2) that corresponds to the second memory layer ML2. The memory trench MTb extends in the Z direction, divides the insulating layers 122 and the sacrificial layers 170 in the Y direction, and exposes an upper surface of the sacrificial layer 172. The width in the Y direction of the memory trench MTb varies according to the position in the Z direction. This process is achieved, for example, in the same way as described with reference to FIGS. 8 and 9.

Figure 13:
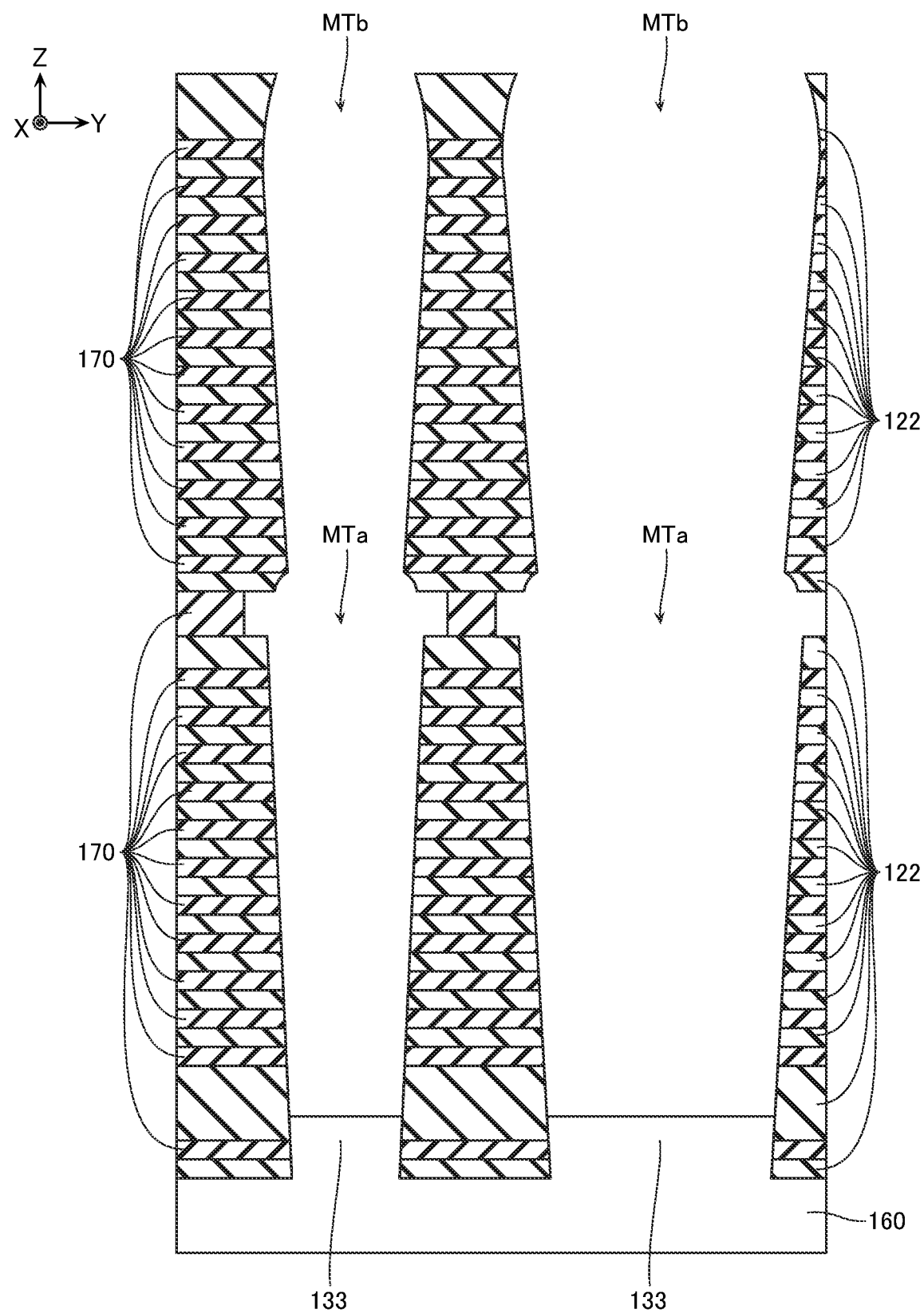
FIG. 13 is a schematic cross-sectional view showing the method for manufacturing the same.

Then, as shown in FIG. 13, the sacrificial layer 172 and the sacrificial layer 171 are removed through the memory trench MTb to expose the bottom and lateral surfaces of the memory trench MTa. This process is achieved, for example, by wet etching.

Figure 14:
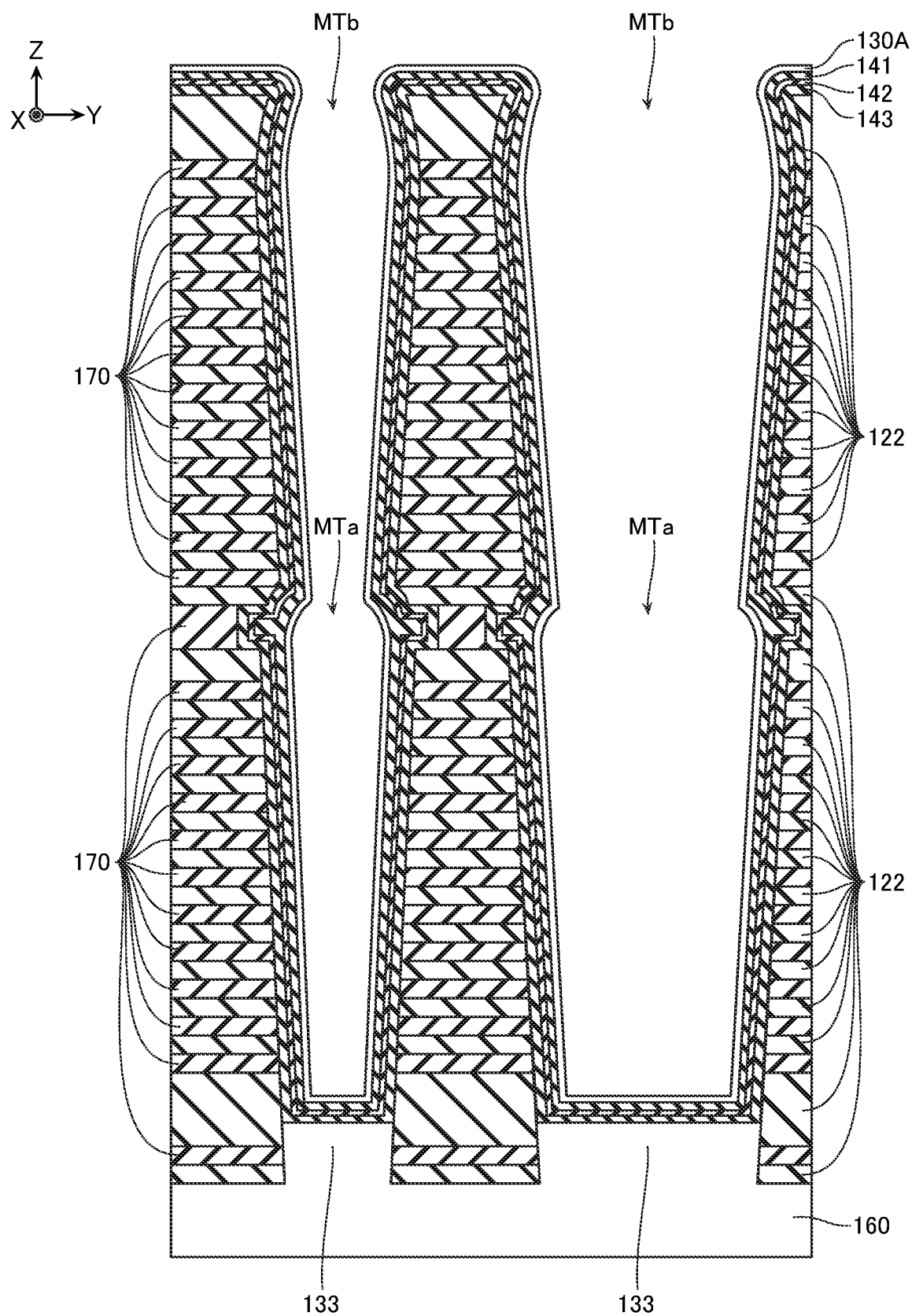
FIG. 14 is a schematic cross-sectional view showing the method for manufacturing the same.

Then, as shown in FIG. 14, a blocking insulating film 143, a charge accumulation film 142, a tunneling insulating film 141, and an amorphous silicon film 130A are formed on the bottom and lateral surfaces of the memory trench MTa and the memory trench MTb. This process is achieved, for example, by CVD.

Note that in this process, the blocking insulating film 143, the charge accumulation film 142 and the tunneling insulating film 141 may be formed, for example, on a lateral surface in the Y direction of the sacrificial layer 170, the lateral surface corresponding to the connection layer CL (FIG. 2), on the upper surface of the insulating layer 122 provided on the lower surface of the sacrificial layer 170, and on the lower surface of the insulating layer 122 provided on the upper surface of the sacrificial layer 17, and bury a recess portion corresponding to the connection layer CL by the blocking insulating film 143, the charge accumulation film 142 and the tunneling insulating film 141.

Figure 15:
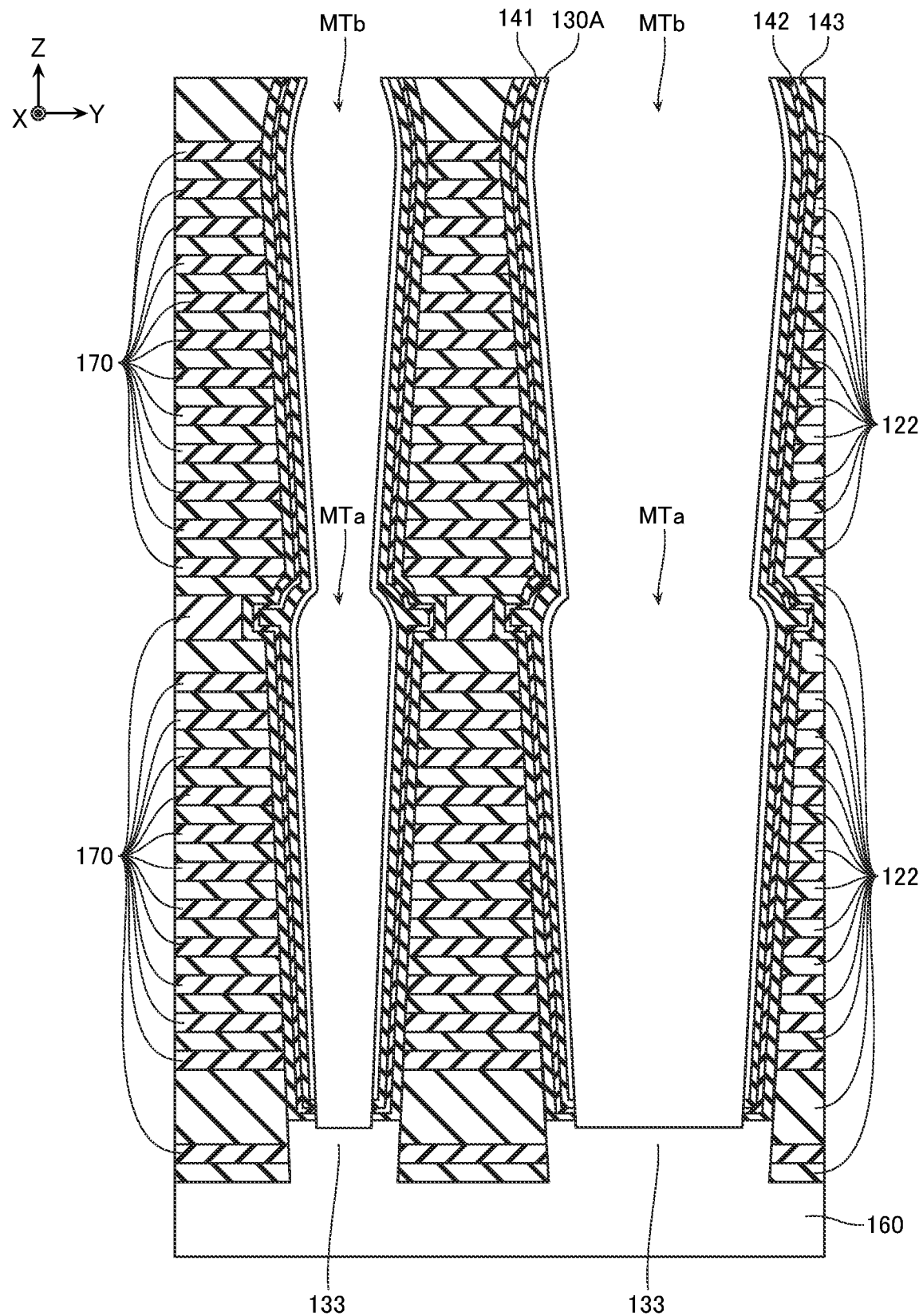
FIG. 15 is a schematic cross-sectional view showing the method for manufacturing the same.

Then, as shown in FIG. 15, parts of the formed films (143, 142, 141 and 130A) are removed to expose the upper surface of the semiconductor layer 133 and the upper surface of the uppermost insulating layer 122. This process is achieved, for example, by RIE.

Figure 16:
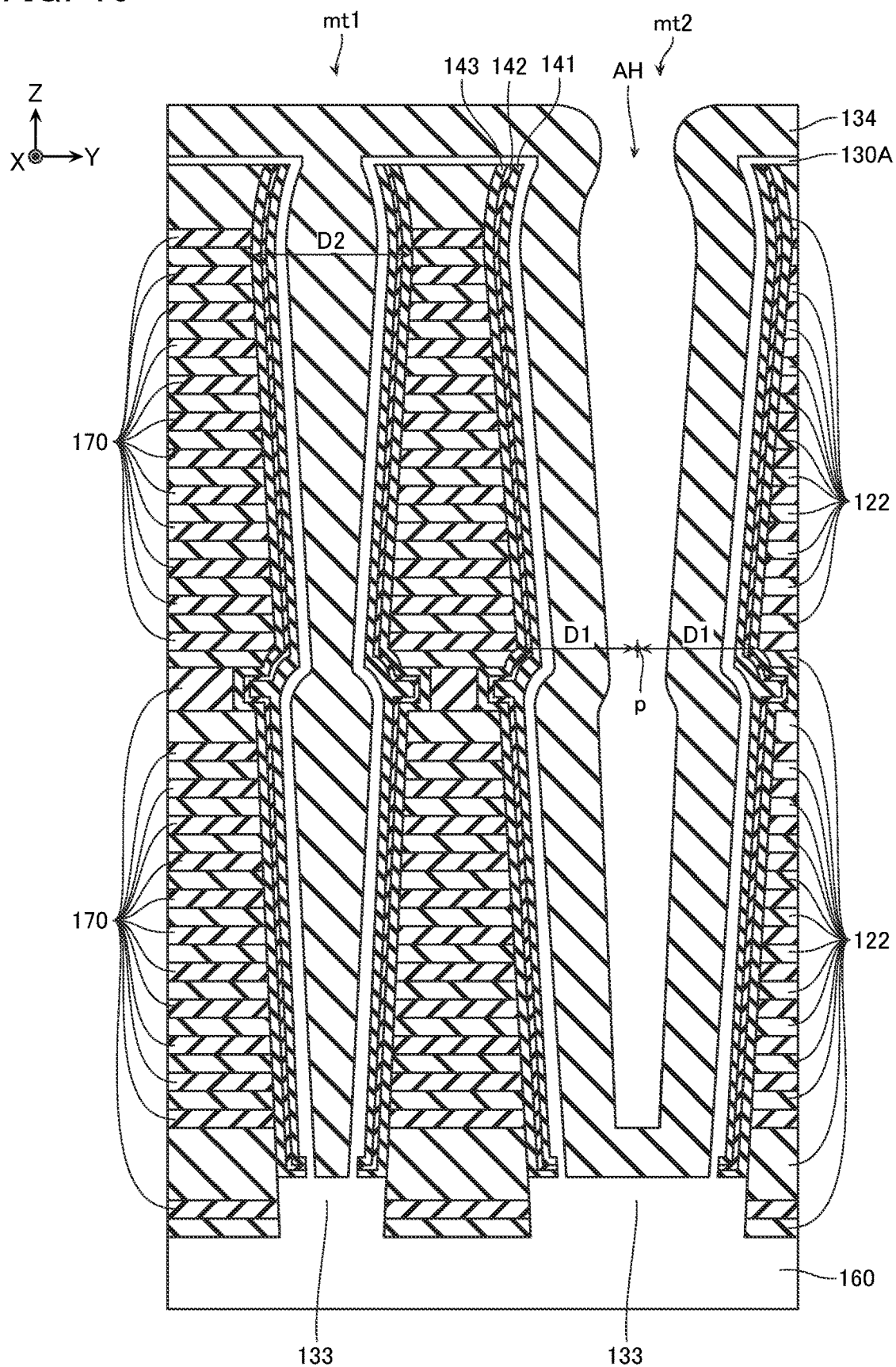
FIG. 16 is a schematic cross-sectional view showing the method for manufacturing the same.
Figure 17:
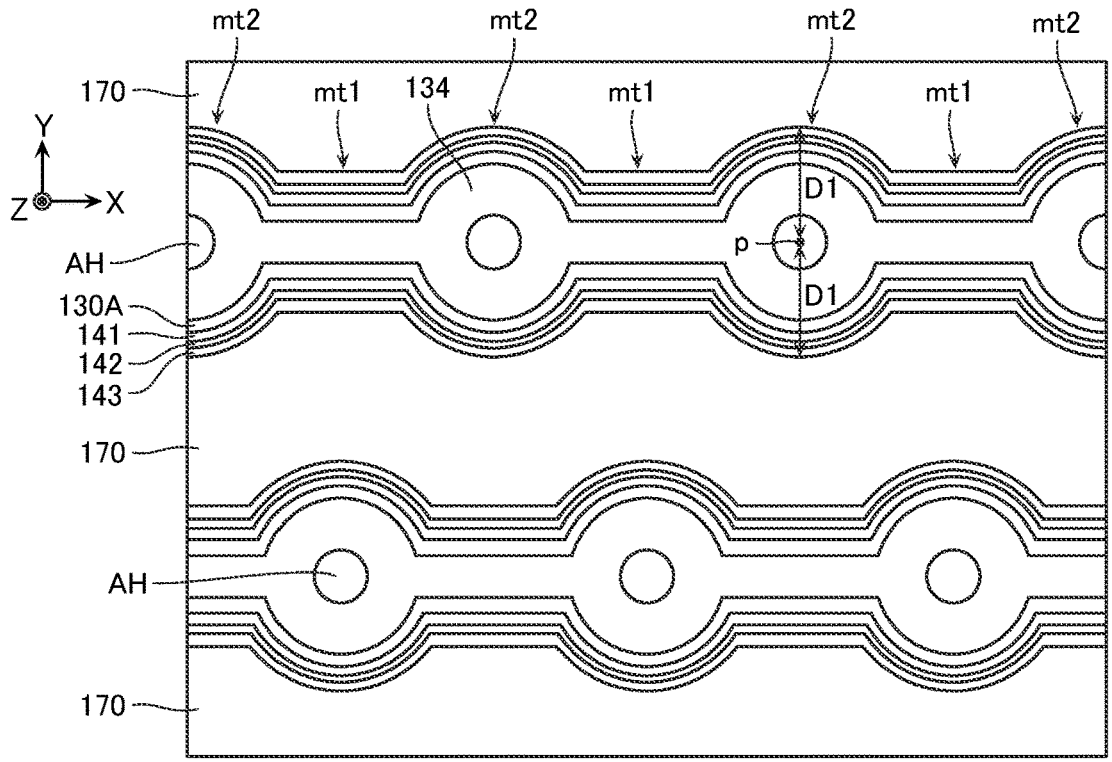
FIG. 17 is a schematic cross-sectional view showing the method for manufacturing the same.
Figure 18:
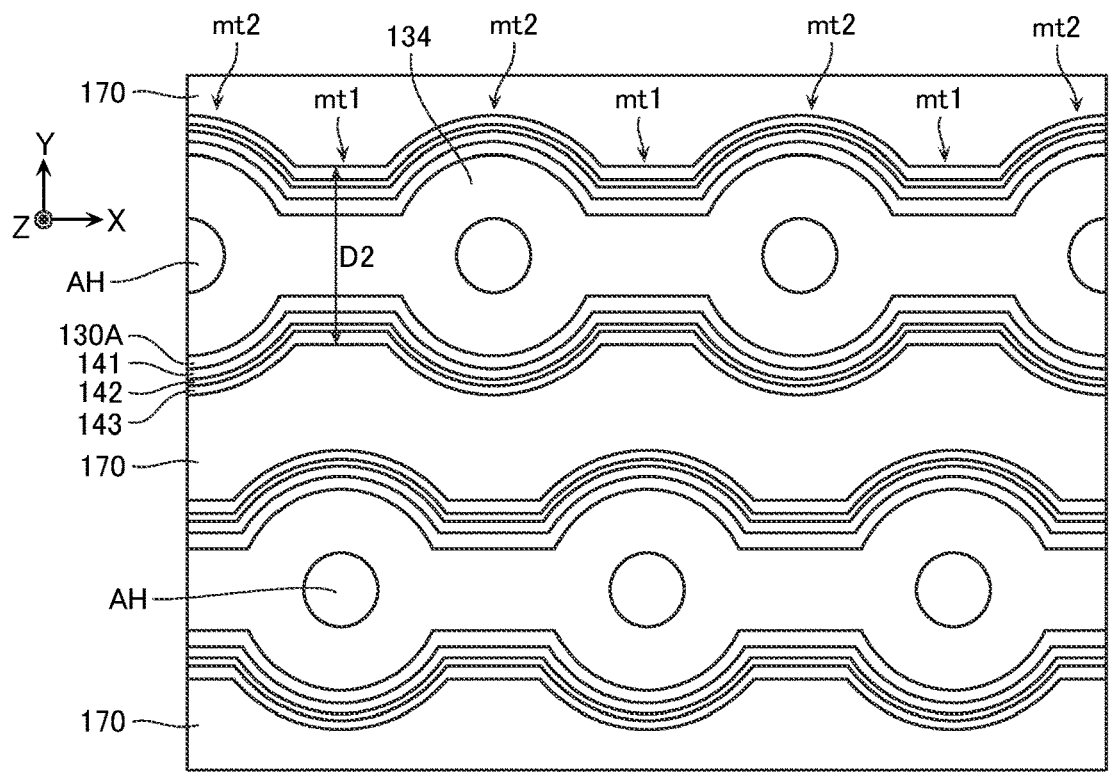
FIG. 18 is a schematic cross-sectional view showing the method for manufacturing the same.

Then, as shown in FIGS. 16-18, the amorphous silicon film 130A and the insulating layer 134 are formed on the upper surface of the semiconductor layer 133, lateral surfaces of the amorphous silicon film 130A, and the upper surface of the uppermost insulating layer 122. The narrow portions mt1 of the memory trench MTa and the memory trench MTb are filled with the amorphous silicon film 130A and the insulating layer 134. On the other hand, the wide portions mt2 of the memory trench MTa and the memory trench MTb are not filled with the amorphous silicon film 130A and the insulating layer 134. Accordingly, openings AH each extending in the Z direction are each formed in a self-aligning manner in each of the wide portions mt2.

Figure 19:
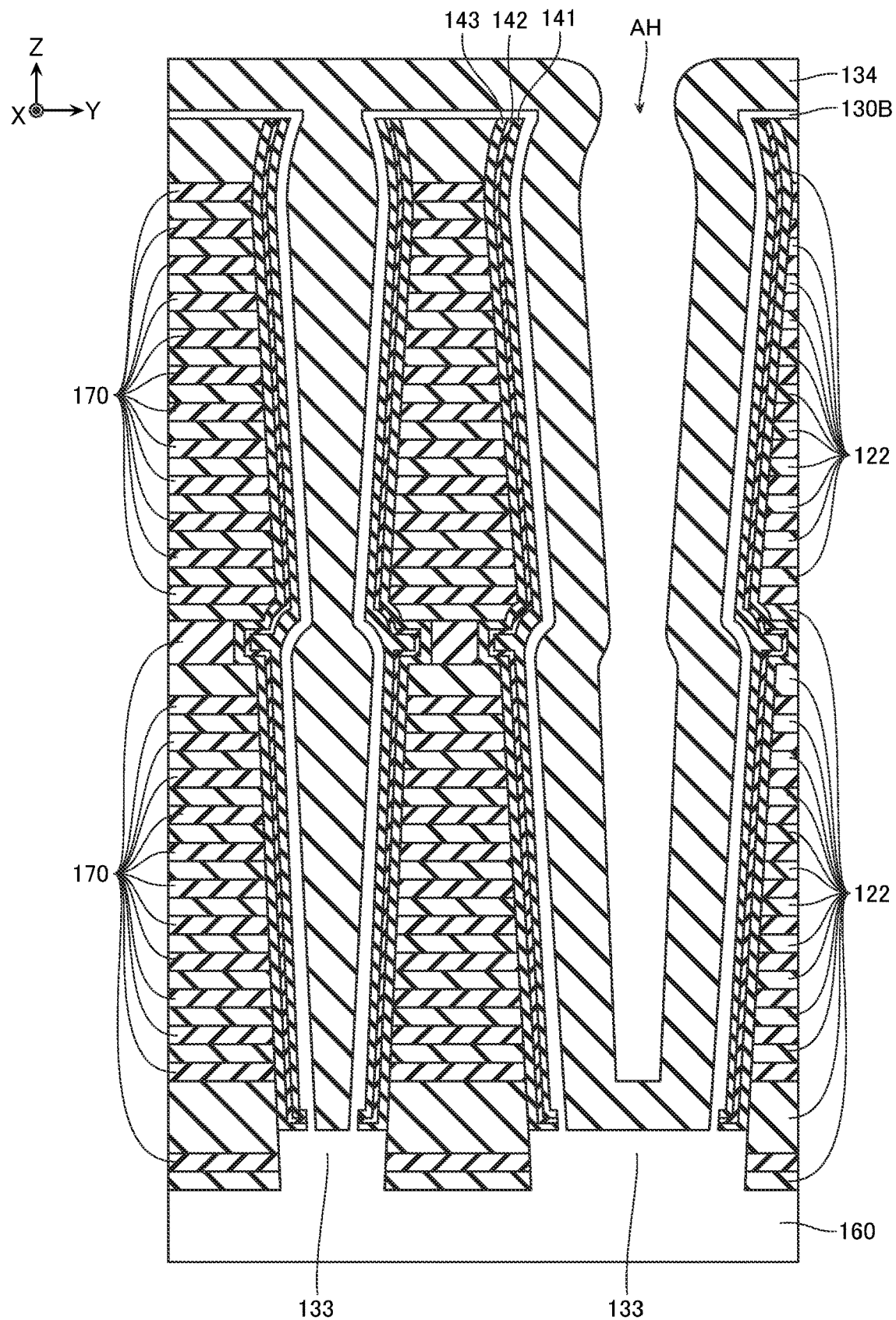
FIG. 19 is a schematic cross-sectional view showing the method for manufacturing the same.

Then, as shown in FIG. 19, the amorphous silicon film 130A is put through thermal treatment or the like to reform its crystal structure to form a semiconductor layer 130B of polycrystalline silicon (p-Si) or the like.

Figure 20:
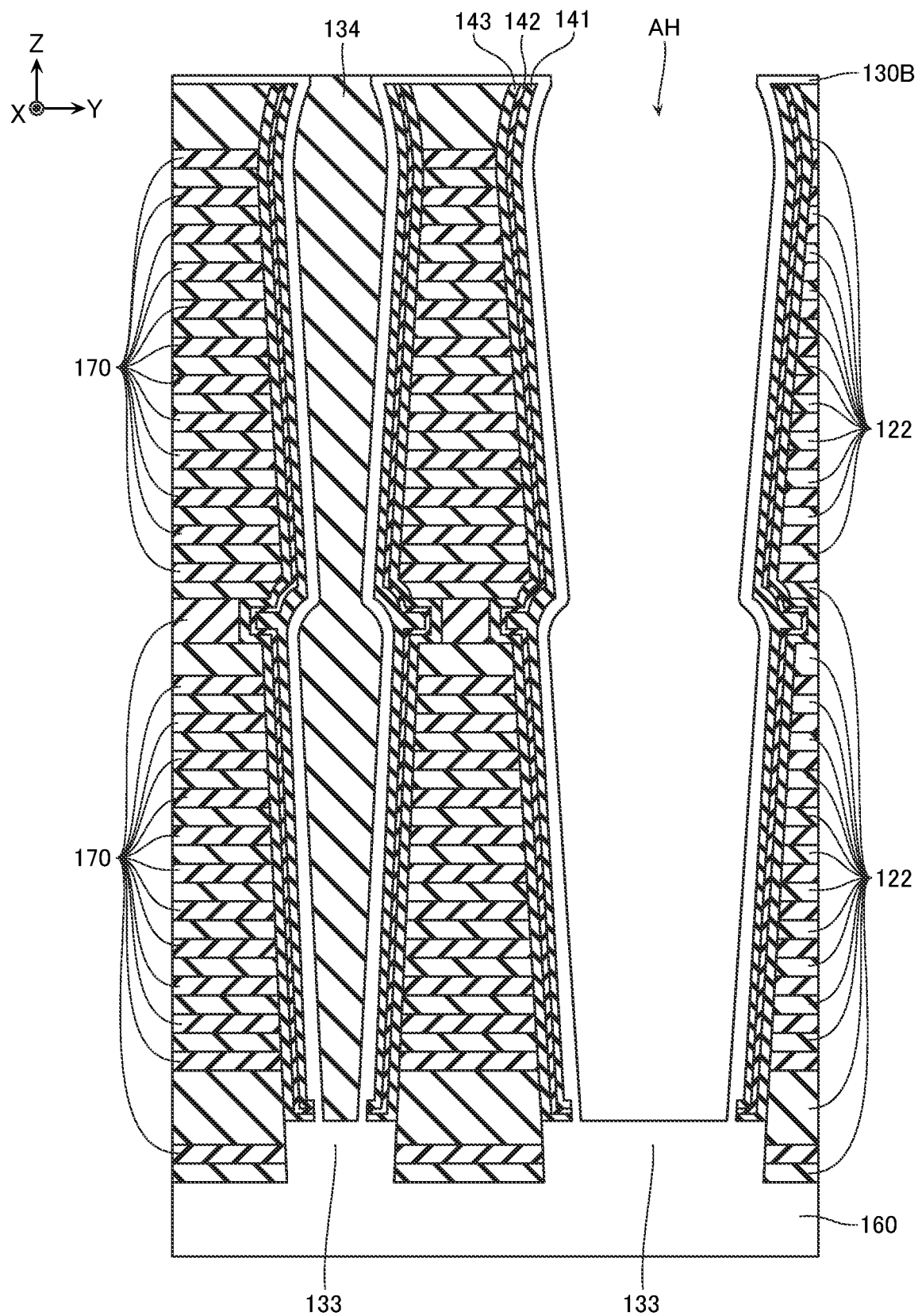
FIG. 20 is a schematic cross-sectional view showing the method for manufacturing the same.
Figure 21:
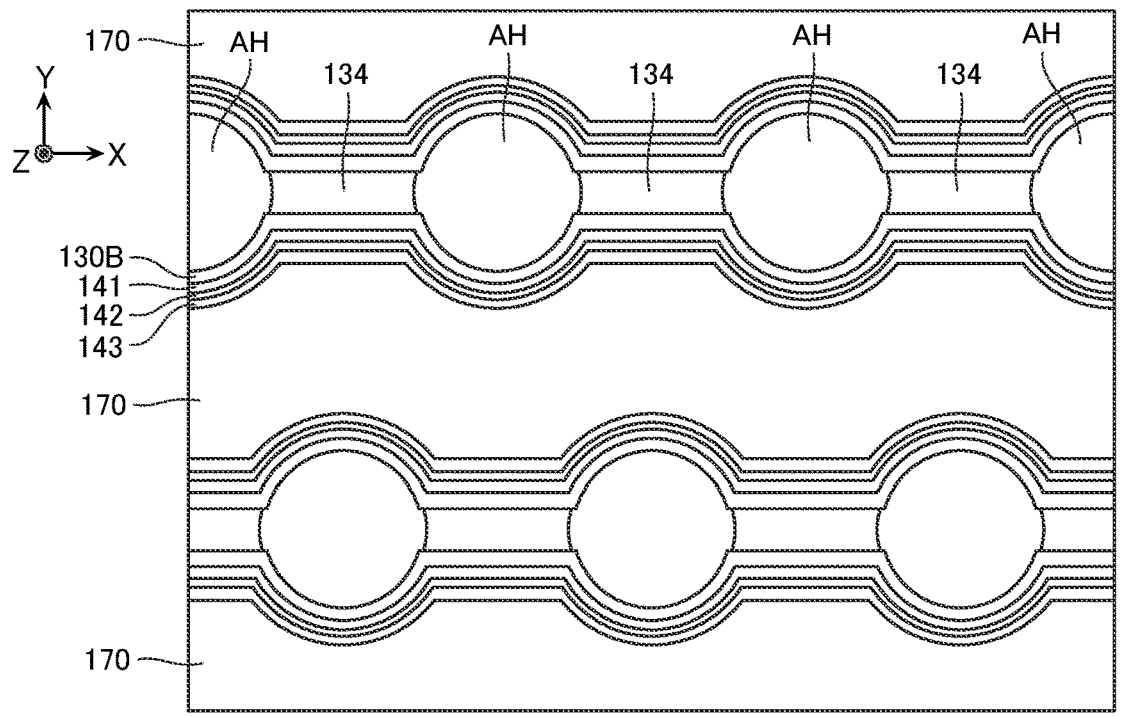
FIG. 21 is a schematic cross-sectional view showing the method for manufacturing the same.
Figure 22:
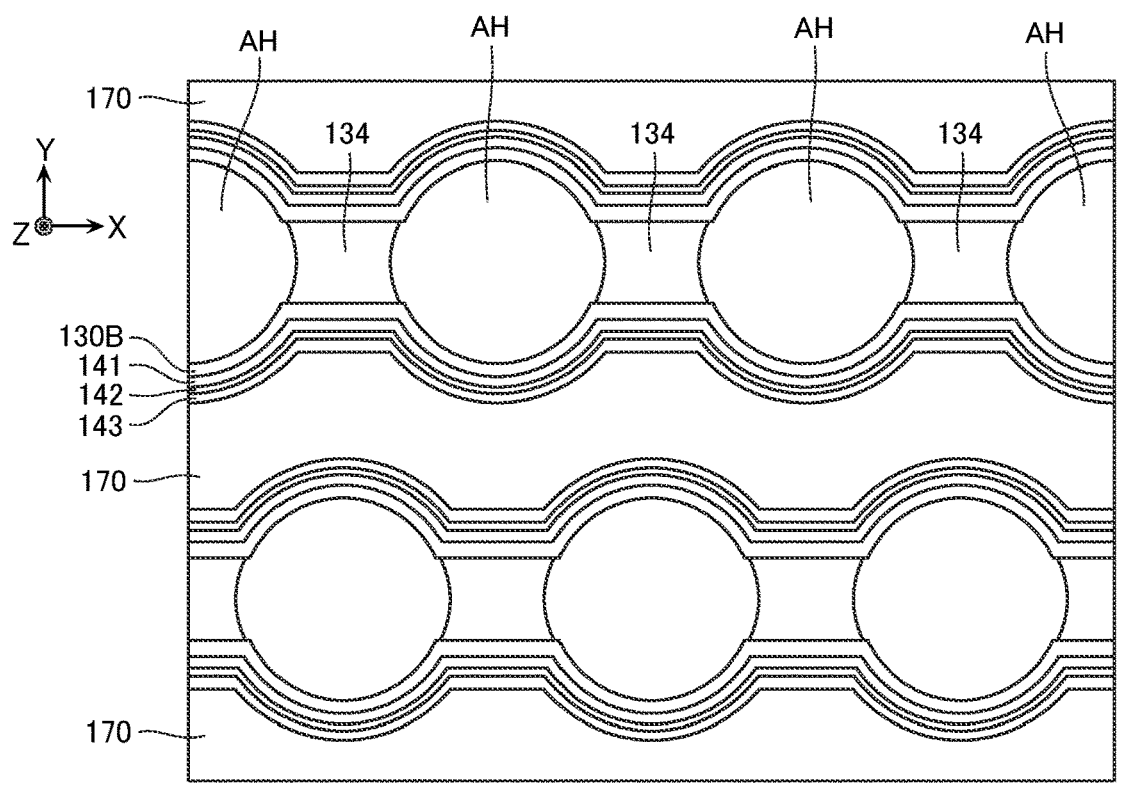
FIG. 22 is a schematic cross-sectional view showing the method for manufacturing the same.

Then, as shown in FIGS. 20-22 a part of the insulating layer 134 is removed to expose the semiconductor layer 130B on the circumferential inside surface of each opening AH. This process is achieved, for example, by means of wet etching through each opening AH. This process divides the insulating layer 134 in the X direction.

Figure 23:
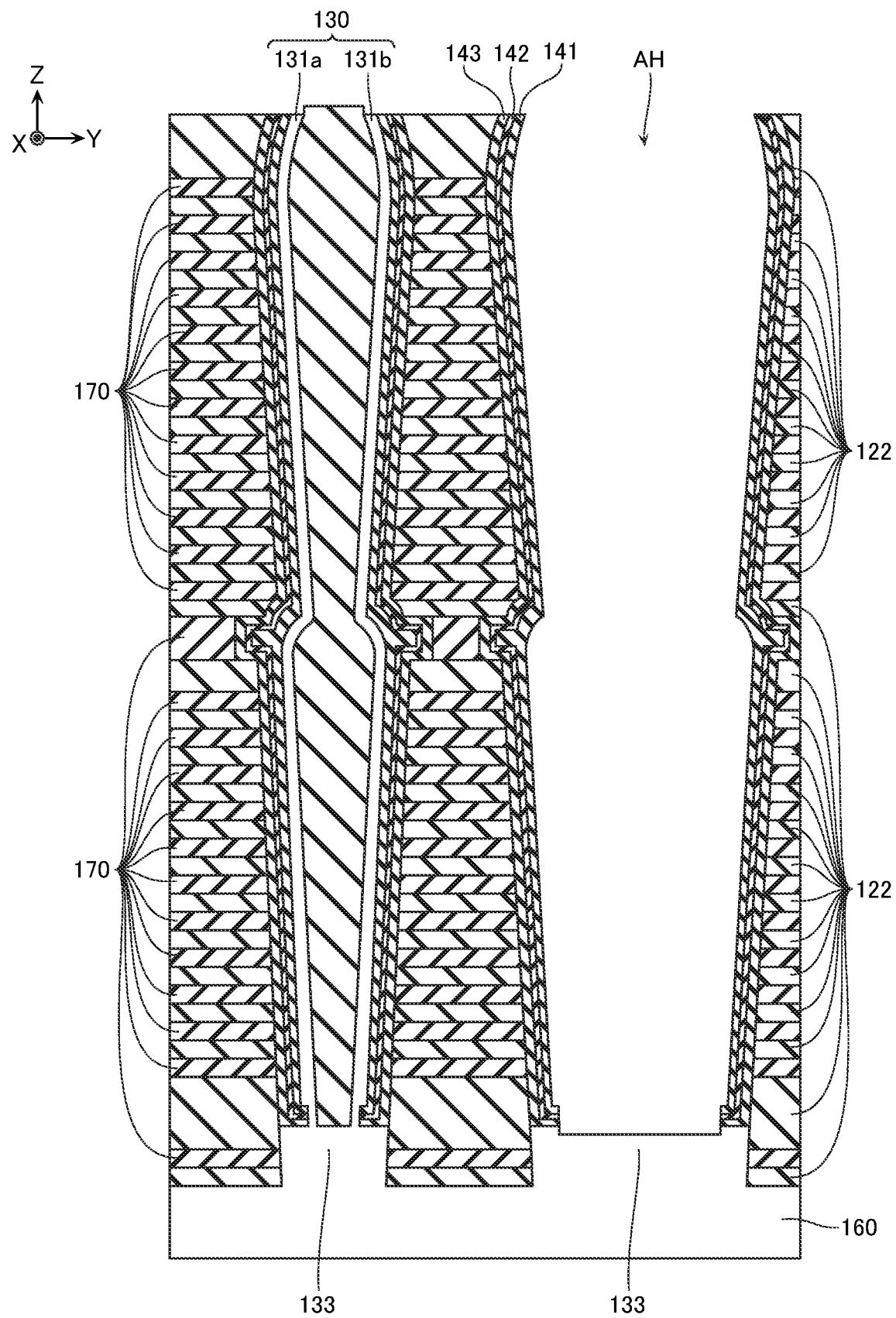
FIG. 23 is a schematic cross-sectional view showing the method for manufacturing the same.
Figure 24:
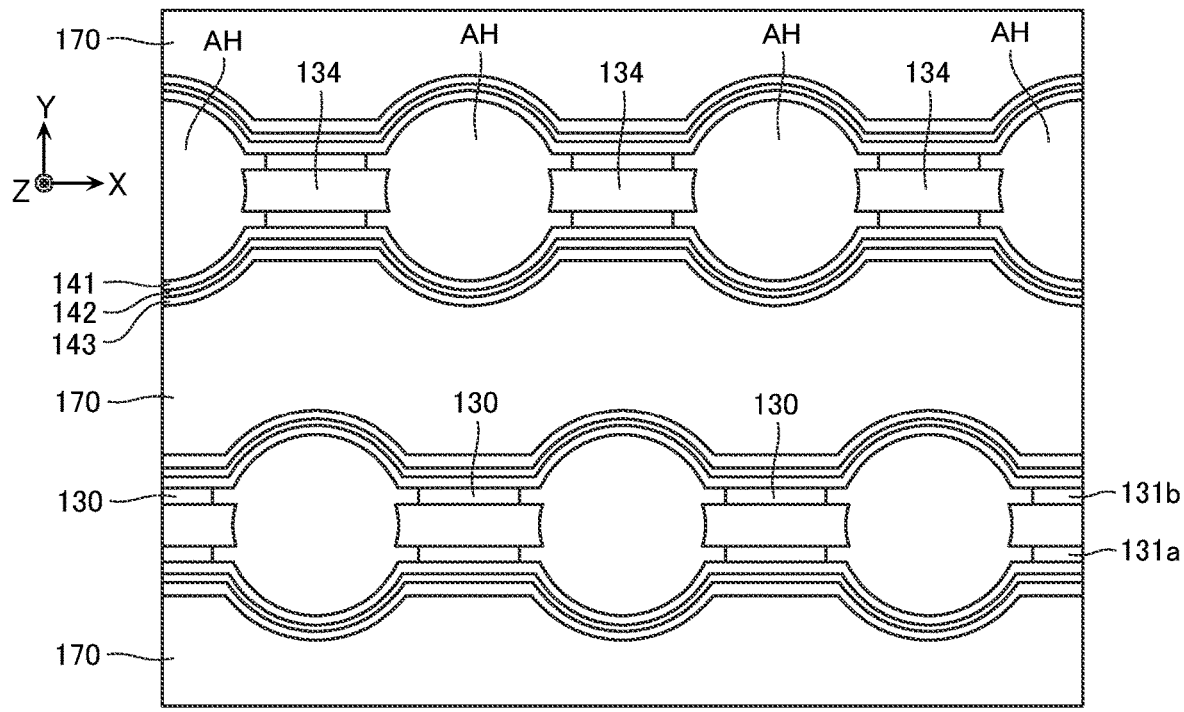
FIG. 24 is a schematic cross-sectional view showing the method for manufacturing the same.
Figure 25:
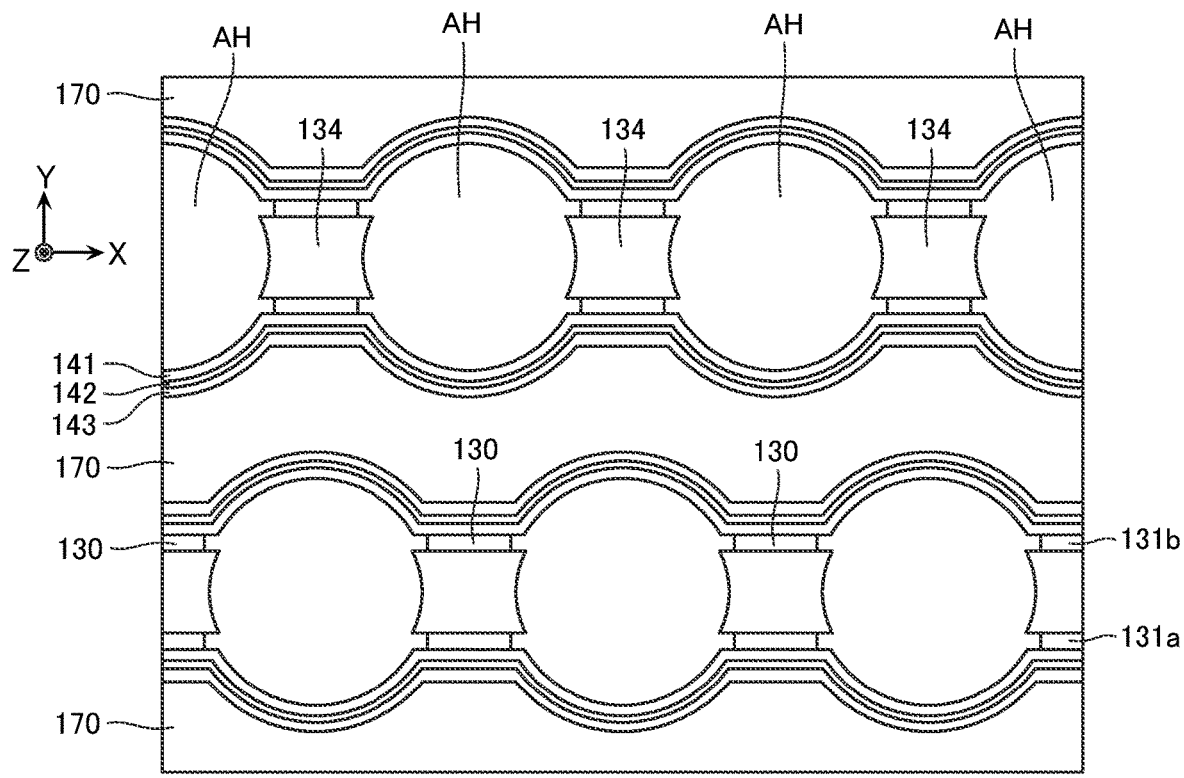
FIG. 25 is a schematic cross-sectional view showing the method for manufacturing the same.

Then, as shown in FIGS. 23-25, a part of the semiconductor layer 130B is removed to expose the tunneling insulating film 141 on the circumferential inside surface of each opening AH. This process is achieved, for example, by, wet etching through the openings AH. This process divides the semiconductor layer 130B in the X direction to form the semiconductor portion 130 including the first semiconductor layer 131a and the second semiconductor layer 131b.

Figure 26:
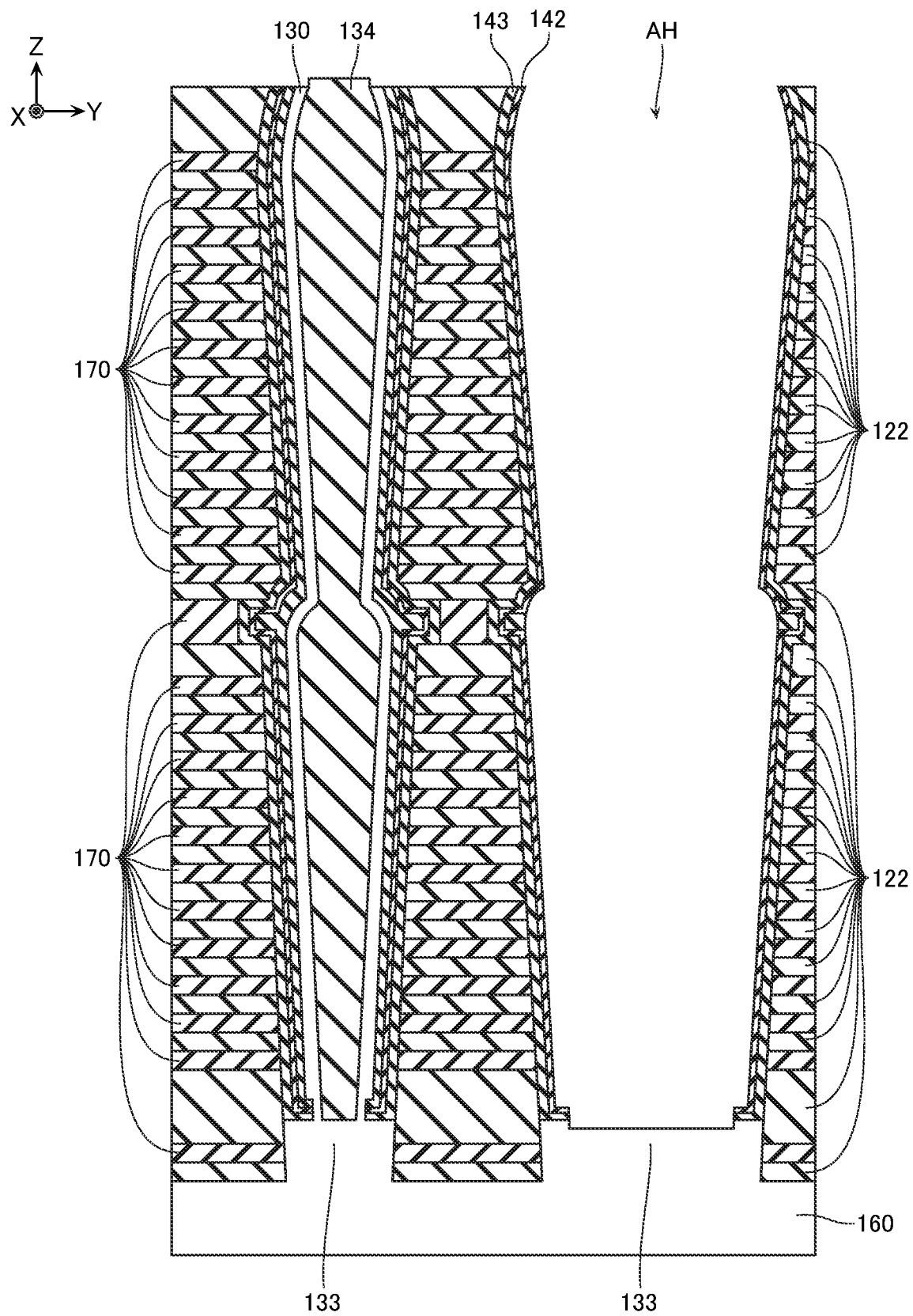
FIG. 26 is a schematic cross-sectional view showing the method for manufacturing the same.
Figure 27:
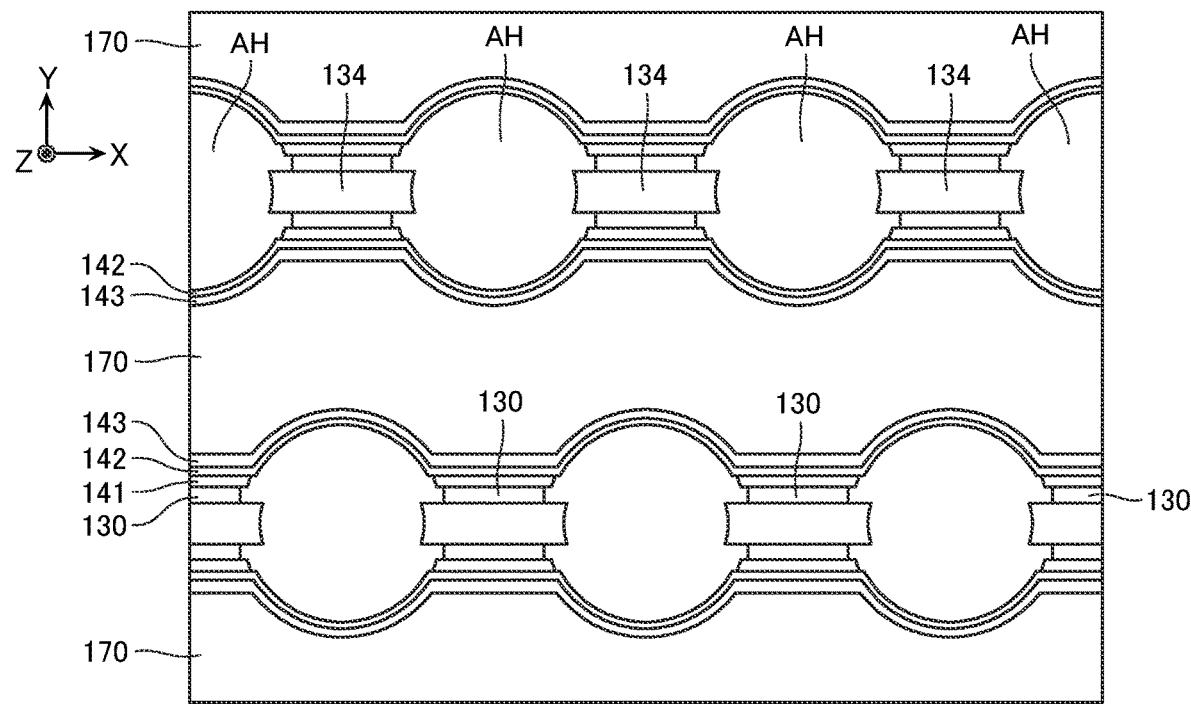
FIG. 27 is a schematic cross-sectional view showing the method for manufacturing the same.
Figure 28:
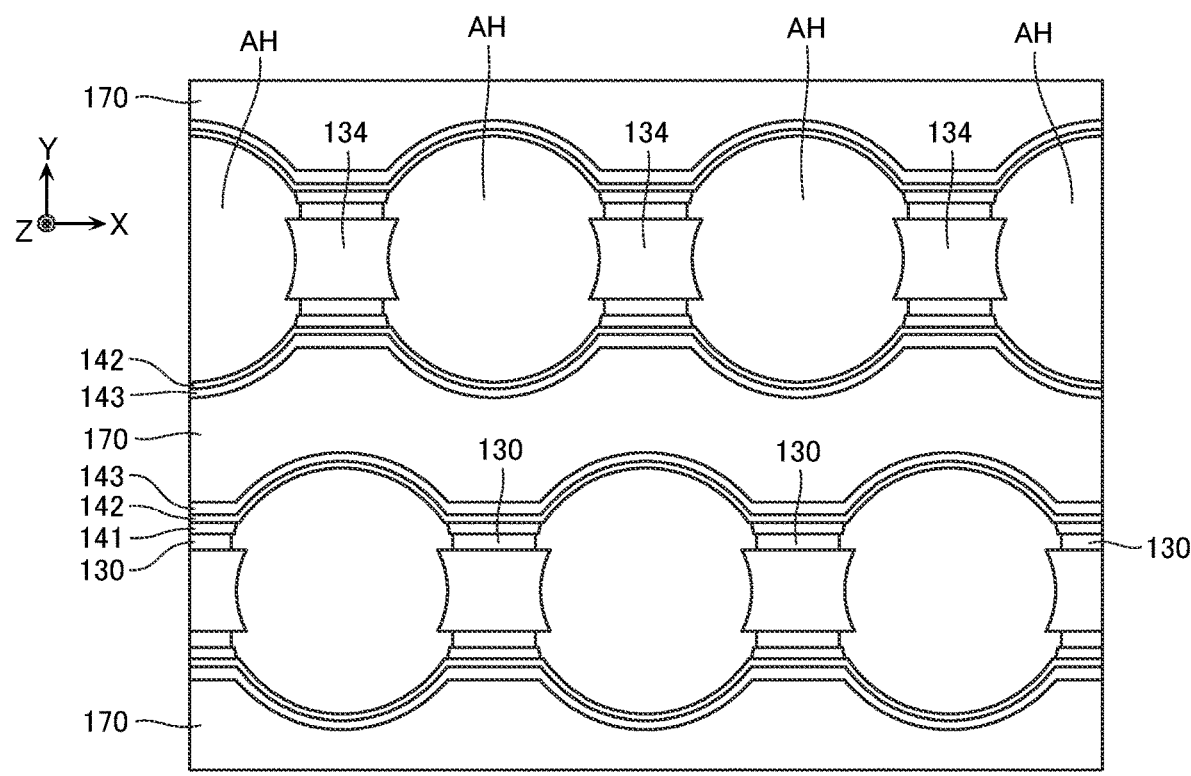
FIG. 28 is a schematic cross-sectional view showing the method for manufacturing the same.

Then, as shown in FIGS. 26-28, a part of the tunneling insulating film 141 is removed to expose the charge accumulation film 142 on the circumferential inside surface of each opening AH. This process is achieved, for example, by wet etching through the openings AH. This process divides the tunneling insulating film 141 in the X direction.

Figure 29:
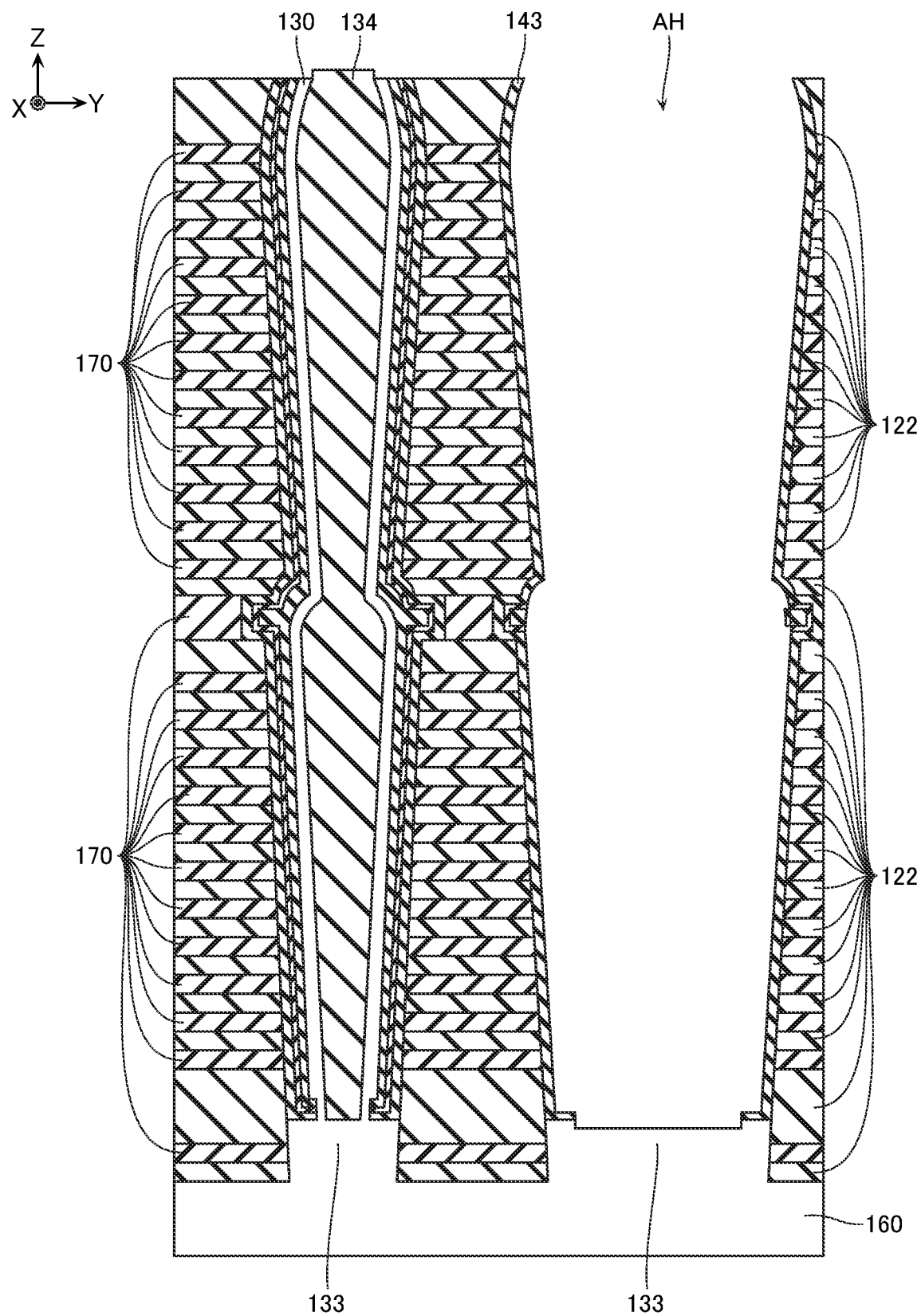
FIG. 29 is a schematic cross-sectional view showing the method for manufacturing the same.
Figure 30:
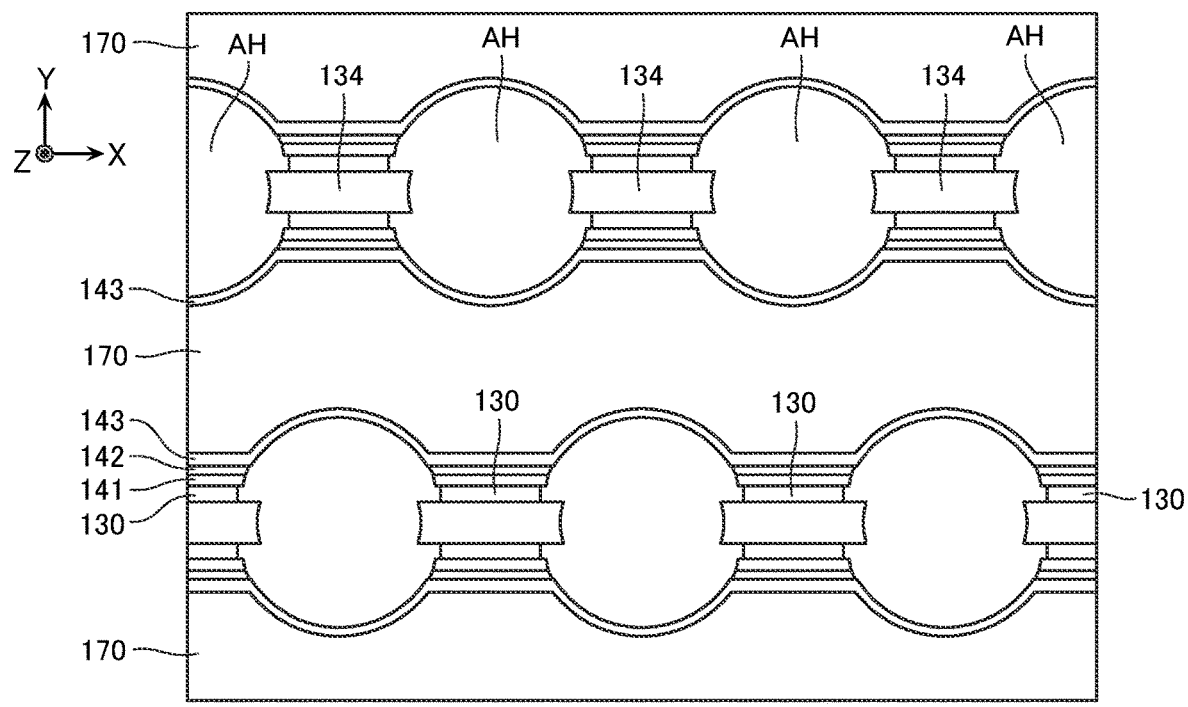
FIG. 30 is a schematic cross-sectional view showing the method for manufacturing the same.
Figure 31:
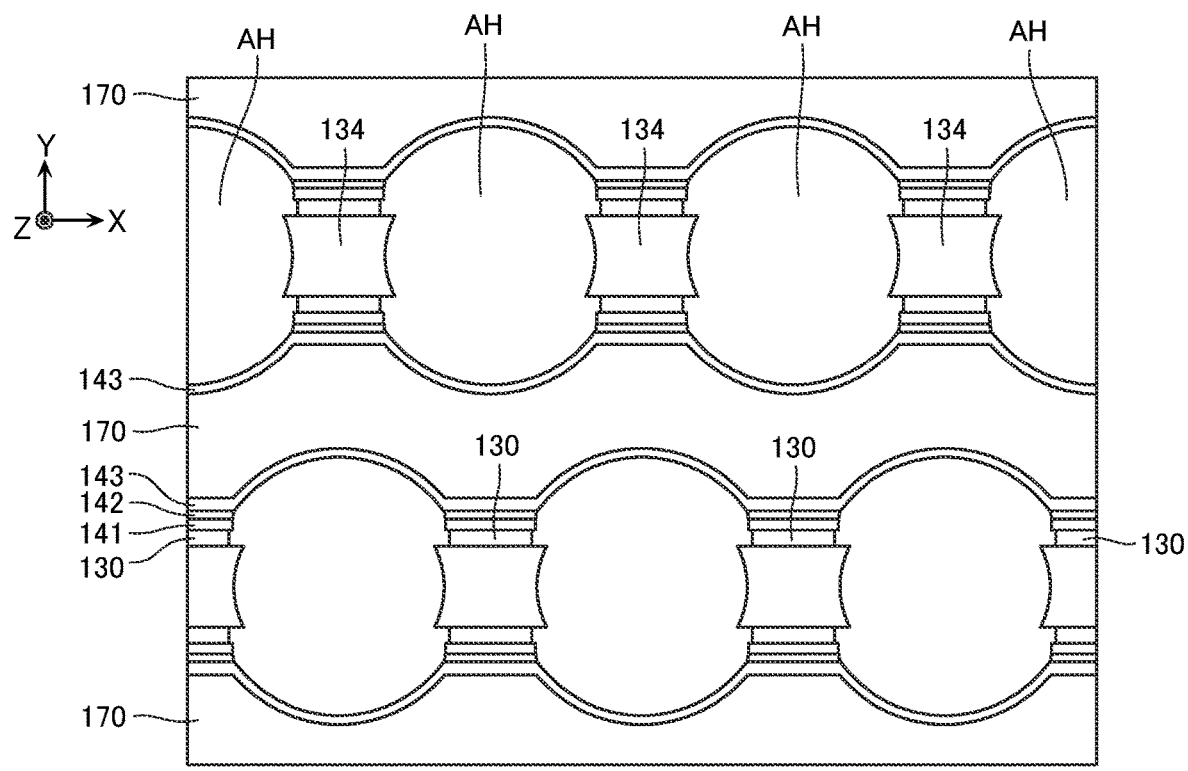
FIG. 31 is a schematic cross-sectional view showing the method for manufacturing the same.

Then, as shown in FIGS. 29-31, a part of the charge accumulation film 142 is removed to expose the blocking insulating film 143 on the circumferential inside surface of each opening AH. This process is achieved, for example, by wet etching through the openings AH. This process divides the charge accumulation film 142 in the X direction.

Figure 32:
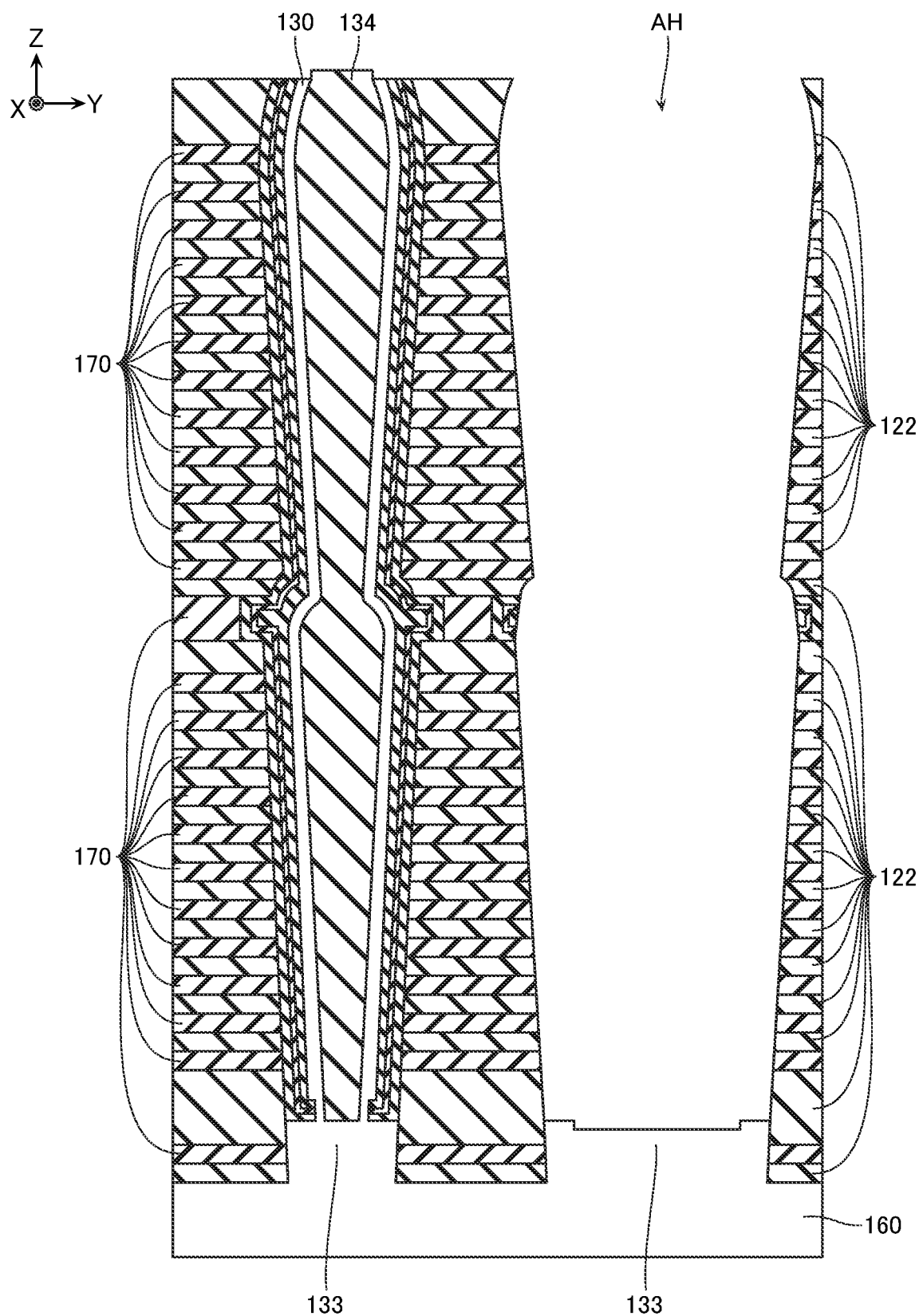
FIG. 32 is a schematic cross-sectional view showing the method for manufacturing the same.
Figure 33:
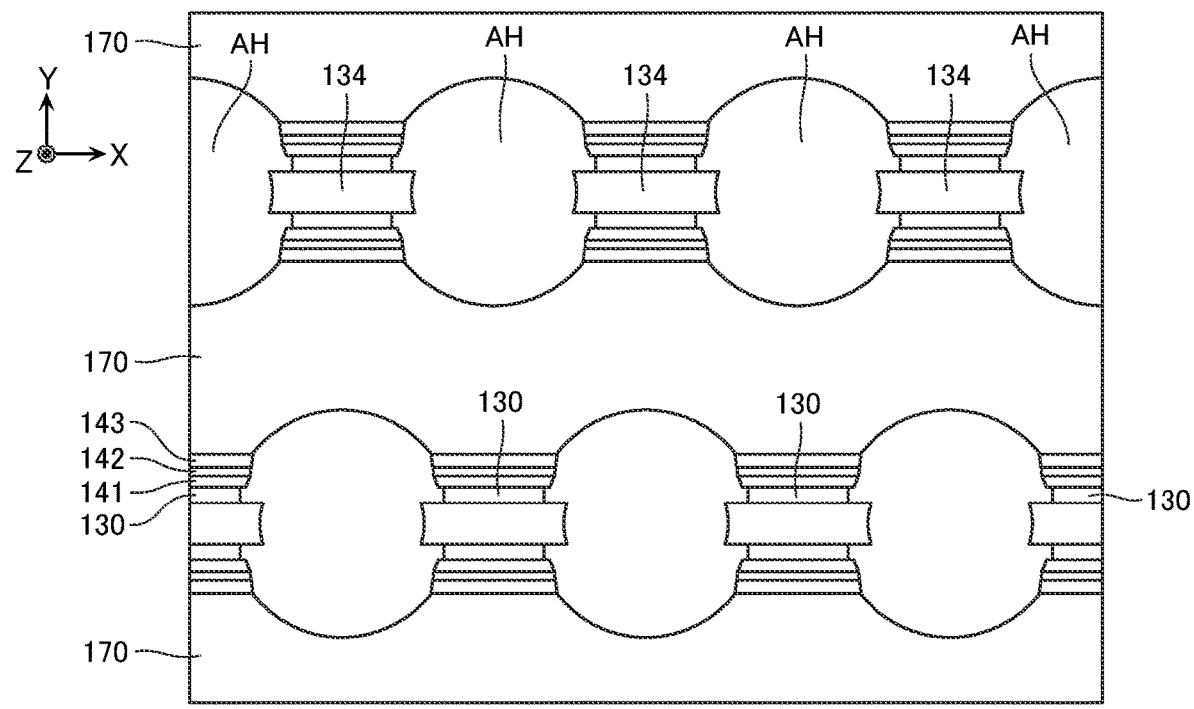
FIG. 33 is a schematic cross-sectional view showing the method for manufacturing the same.
Figure 34:
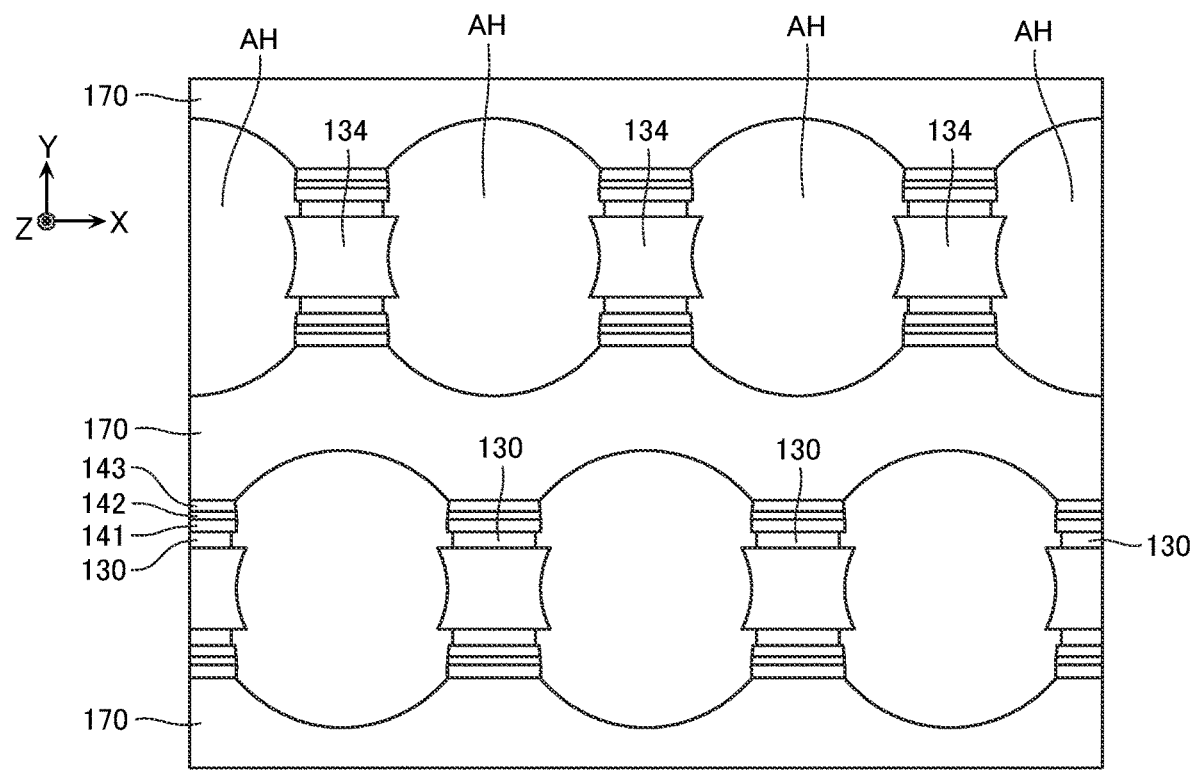
FIG. 34 is a schematic cross-sectional view showing the method for manufacturing the same.

Then, as shown in FIGS. 32-34, a part of the blocking insulating film 143 is removed to expose the plurality of insulating layers 122 and the plurality of sacrificial layers 170 on the circumferential inside surface of each opening AH. This process is achieved, for example, by wet etching through the openings AH. This process divides the blocking insulating film 143 in the X direction.

Then, a part of the semiconductor layer 133 (FIG. 32) is removed, for example, by RIE to expose the lowermost sacrificial layer 170 on the circumferential inside surface of each opening AH. Then, the plurality of sacrificial layers 170 are removed by, for example, wet etching or the like through the opening AH. In addition, the insulating layer 135 (FIG. 2) is formed on a lateral surface of the semiconductor layer 133 by oxidation or the like through the opening AH. In addition, the conductive layers 120 each between the insulating layers 122 set in line in the Z direction are formed by CVD and wet etching, or the like, through the opening AH.

In addition, the insulating layer 150 is formed in the opening AH by CVD or the like. This makes the structure as shown in FIG. 2.

Advantages

A semiconductor memory device comprising a substrate, a plurality of gate electrodes stacked in a first direction intersecting with a surface of the substrate, a semiconductor layer extending in the first direction and facing the plurality of gate electrodes, and a gate insulating film provided between the gate electrodes and the semiconductor layer, is known. The gate insulating film has a memory portion which can store data, such as a silicon nitride film (SiN) or a floating gate.

In the manufacturing of such a semiconductor memory device, for example, a plurality of layers of film corresponding to a plurality of gate electrodes are stacked on a substrate; a memory hole penetrating the plurality of films is formed; and a gate insulting film and a semiconductor layer are formed on the circumferential inside surface of the memory hole. This forms a surround-gate structure in which a semiconductor layer formed in one memory hole corresponds to one memory string.

For such semiconductor memory devices, various methods for increasing the storage capacity have been proposed.

For example, the number of memory cells in a memory hole can be increased by increasing the number of gate electrodes stacked. Increasing the aspect ratio of the memory hole is an idea for achieving it; however, this may not be easy in some ways.

Another idea is that all the films corresponding to a gate electrode be not provided with a memory hole at one time, but films and a memory hole be formed at more than one time on a divided basis. This would make it possible to increase the number of gate electrodes stacked without increasing the aspect ratio of the memory hole. However, if semiconductor layers are formed on a divided basis at more than one time, semiconductor layers formed in different steps may have large contact resistances between them.

In view of the above, in this embodiment, a memory trench MTa is processed in the process shown in FIG. 8, and a memory trench MTb is processed in the process shown in FIG. 12. Gate insulting films (141-143), and an amorphous silicon film (130A), are formed at one time on lateral walls of the memory trench MTa, lying below, and on lateral walls of the memory trench MTb, lying above, on the process shown in FIG. 14 and FIG. 16. This method can avoid the occurrence of increased contact resistances as mentioned above because the amorphous silicon film 130A is formed at once.

An idea of a method to increase the storage capacity of a semiconductor memory device may be two memory strings formed in a memory hole. To achieve this configuration, a plurality of gate electrodes corresponding to one memory string may well be made electrically independent of another plurality of gate electrodes corresponding to the other memory string. In that case, it is preferable that a semiconductor layer corresponding to one memory string be electrically independent of another semiconductor layer corresponding to the other memory string. This is to inhibit current leakage from one memory string to the other.

For example, a method for achieving the abovementioned configuration may be, for example: forming a plurality of memory holes arranged in the X direction; forming semiconductor layers, etc., inside the memory holes; and forming a trench extending in the X direction to divide the semiconductor layers, etc., in the Y direction. Another method may be, for example: forming a memory trench extending in the X direction; forming a semiconductor layer, etc., inside the memory trench; and forming a plurality of holes arranged in the direction X to divide the semiconductor layer, etc., in the X direction.

However, if films corresponding to gate electrodes, and a memory hole or a memory trench are formed at more than one time on a divided basis, and a semiconductor layer is formed on the trench or the hole, the trench or the hole to divide the semiconductor layer needs to be formed at once. This may not be easy in some ways.

In view of the above, in this embodiment, as shown in FIG. 9, etc., a memory trench MTa and a memory trench MTb comprise a plurality of narrow portions mt1 and a plurality of wide portions mt2, disposed alternately in the X direction. In the process shown in FIGS. 14-18, an amorphous silicon film 130A, etc., (141-143, 130A and 134) are formed with such a thickness that the narrow portions mt1 are filled, and also the wide portions mt2 are not filled. This makes openings AH each extending in the Z direction formed inside the wide portions mt2 in a self-aligned manner. Accordingly, the semiconductor layer 130B, etc., can be preferably divided by the openings AH.

To fill each narrow portion mt1, as shown in FIG. 16, it is preferable that the thickness of the amorphous silicon film 130A, etc., (141-143, 130A and 134) be at least a half of the largest width D2 in the Y direction of the narrow portion mt1 (D2/2). It is also preferable that the thickness of the amorphous silicon film 130A, etc., (141-143, 130A and 134) be smaller than the smallest distance D1 from the center point "p" of a wide portion mt2 to the sacrificial layer 170 to have the opening AH in the wide portion mgt formed in a self-aligned manner. Accordingly, it is preferable that the relationship 2D1>D2 be satisfied between abovementioned D2 and D1.

For a semiconductor memory device produced under the abovementioned conditions, the relationship 2D1>D2 is satisfied between the smallest distance D1 from the center point "p" of the insulating layer 150 to a conductive layer 120 on the first cross-section (FIG. 5), and the distance D2 in the Y direction between conductive layers 120 on the second cross-section (FIG. 6).

In addition, in the process described with reference to FIGS. 20-34, the insulating layer 134, the semiconductor layer 130B, the tunneling insulating film 141, the charge accumulation film 142, and the blocking insulating film 143 are sequentially divided by each opening AH. These films are divided selectively one by one by means of, for example, wet etching or the like. Accordingly, the width in the X direction of the semiconductor portion 130 may be different from the width in the X direction of the gate insulating film 140, as described with reference to FIGS. 5 and 6. For example, the widths W1, W1' in the X direction of the semiconductor portion 130 may be larger than the widths W2, W2' in the X direction of the gate insulating film 140, respectively. The widths W1, W1' of the semiconductor portion 130 may also be smaller than the widths W2, W2' in the X direction of the gate insulating film 140, respectively.

Note that in this embodiment, a patterning process (exposure process) for the memory trench MTa, and a patterning process for the memory trench MTb, are performed separately. Accordingly, the memory trench MTa and the memory trench MTb could be misaligned with each other in the X or Y direction. Therefore, in this embodiment, the connection portion J (FIG. 2) is provided between the first semiconductor portion P1 and the second semiconductor portion P2 of the semiconductor portion 130. With such a configuration, if there occurs a misalignment in the Y direction between the memory trench MTa and the memory trench MTb, the first semiconductor portion P1 and the second semiconductor portion P2 of the semiconductor portion 130 will be connected to each other in a good manner.

Figure 35:
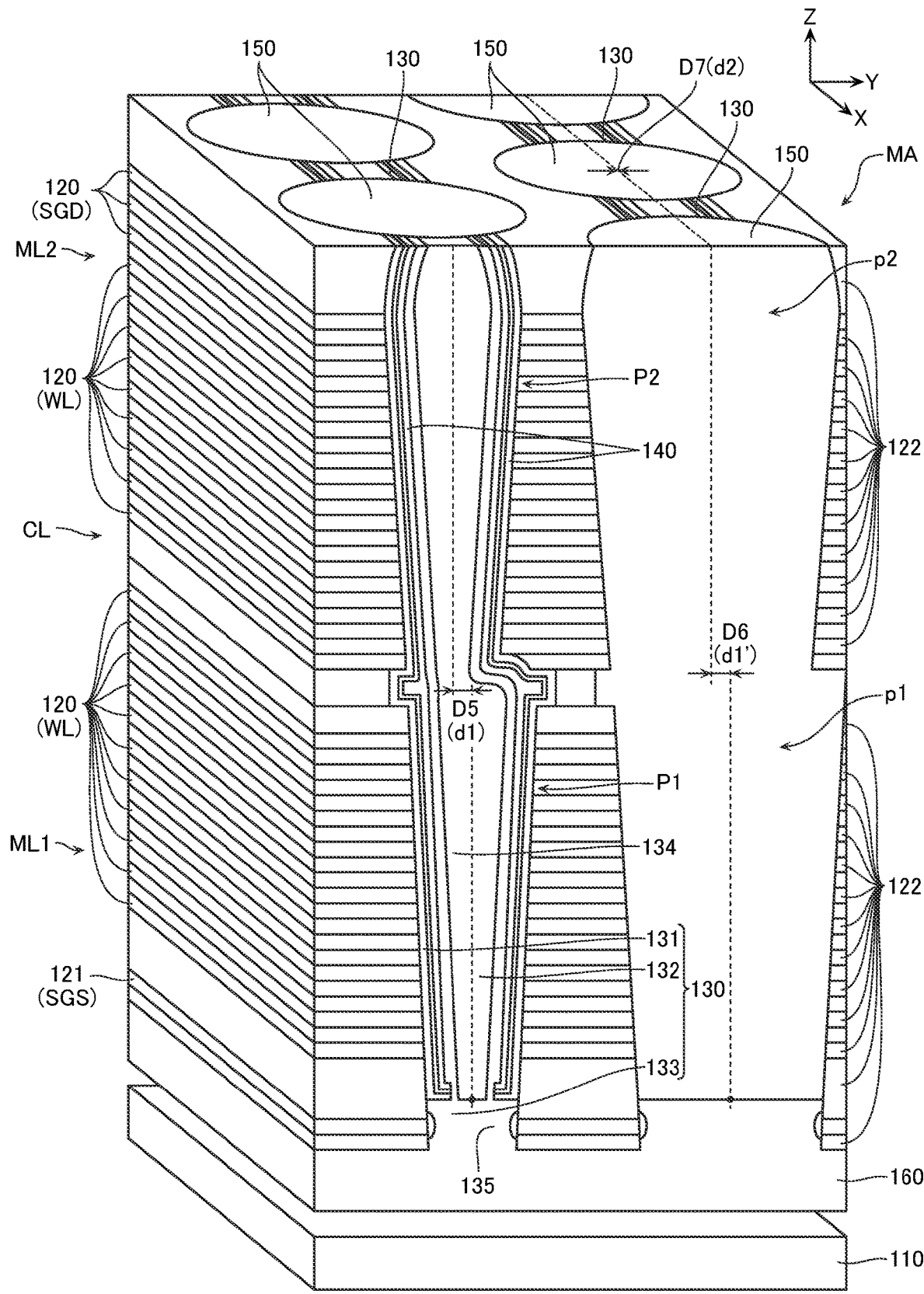
FIG. 35 represents a variation of the configuration shown in FIG. 2.

If such a misalignment occurs, the manufactured semiconductor memory device might be in a shape shown in FIG. 35. Refer, there, to a distance between the center position in the Y direction of the first semiconductor portion P1 and the center position in the Y direction of the second semiconductor portion P2 as D5 (d1), for example. Also refer to a distance between the center position in the Y direction of the first insulating portion p1 and the center position in the Y direction of the second insulating portion p2 as D6 (d1'), for example. Also refer to a distance between the center position in the Y direction of the second semiconductor portion P2 and the center position in the Y direction of the second insulating portion p2 as D7 (d2), for example.

If there occurs a misalignment between the memory trench MTa and the memory trench MTb, the distance D5 (d1) could be close to the distance D6 (d1'). In the patterning process for the memory trench MTa and the patterning process for the memory trench MTb, the patterning for the narrow portions mt1 and the wide portions mt2 can be performed at once. In that case, the distance D7 (d2) would be almost zero. The distance D7 (d2) would be at least smaller than distances D5 (d1) and D6 (d1'). Although not shown in the drawings, the same applies to the first semiconductor portion P1 of the semiconductor portion 130 and the first insulating portion p1 of the insulating layer 150.

Note that the larger the width in the Y direction of the connection portion J is, the more the effect of a misalignment between the memory trench MTa and the memory trench MTb is controlled. For example, the width in the Y direction of the connection portion J might be larger than the distance D2 in FIG. 2. In such a case, if the width in the Y direction and the width in the Z direction of the connection portion J are larger than those of the amorphous silicon film 130A, etc., (141-143, 130A and 134) formed in the processes shown in FIGS. 14-18, it is impossible to fill the narrow portions mt1 of the memory trench MTa in the connection layer CL, and thus, there will be an opening formed there. As a result, the insulating layer 134 is divided in the Z direction in the process shown in FIGS. 20-22, and the semiconductor layer 130B is also divided in the Z direction in the process shown in FIGS. 23-25.

Therefore, in this embodiment, the relationship between the width W3 in the Z direction of the connection layer CL (the width in the Z direction of the connection portion J) and the distance D2 in the Y direction between the first conductive layer 120a and the second conductive layer 120b on the second cross-section, is defined as D2>W3. This makes it possible to fill the narrow portions mt1 of the memory trench MTa in the connection layer CL in a good manner independently of the width in the Y direction of the connection portion J in the process shown in FIGS. 16-18.

Figure 36:
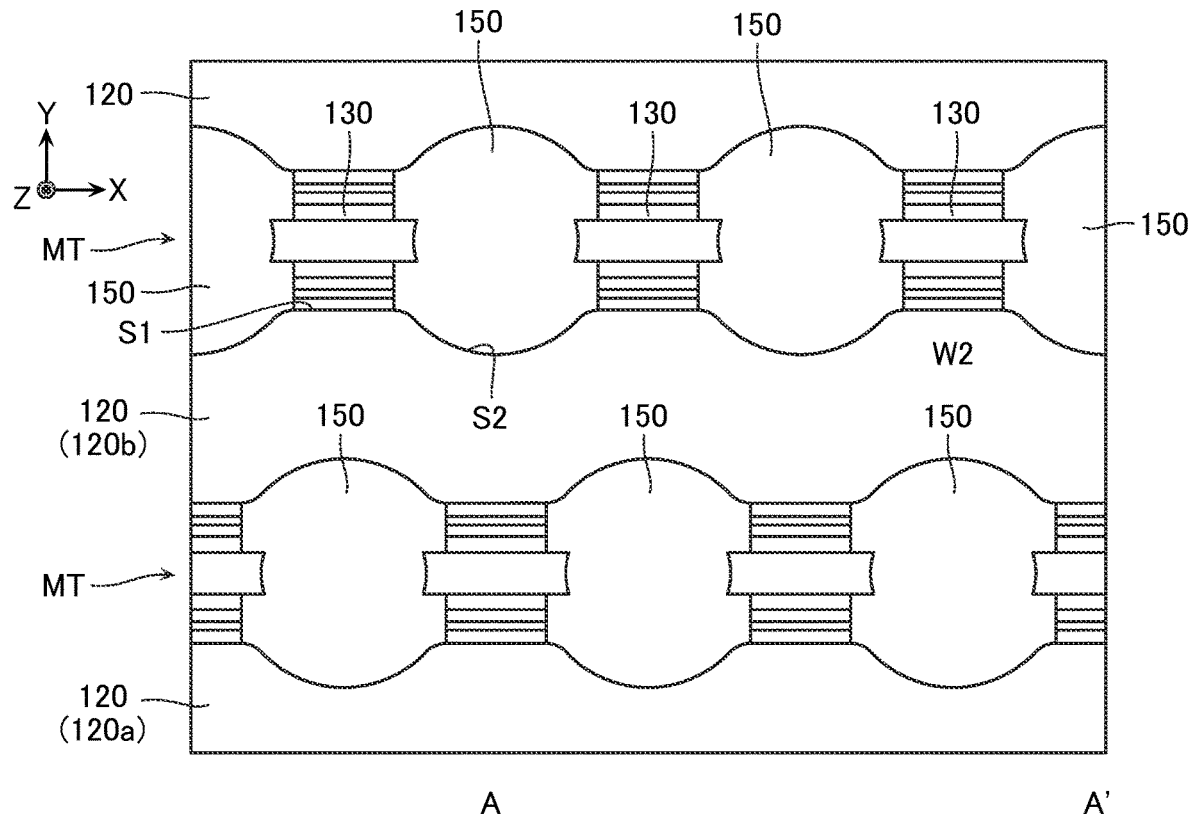
FIG. 36 represents a variation of the configuration shown in FIG. 5.

In this embodiment, the memory trench MTa and the memory trench MTb comprise the plurality of narrow portions mt1 and the plurality of wide portions mt2 disposed alternately in the X direction. However, under some conditions for processing, etc., this configuration could not be achieved. In particular, in the vicinity of the bottom surfaces of the memory trench MTa and the memory trench MTb, such a configuration could more easily collapse in the process. In that case, for example, as shown in FIG. 36, an angled part in the boundary between a narrow portion mt1 and a wide portion mt2 might be smoothed to some degree. In that case, for example, the contact surface S1 of the conductive layer 120 with a gate insulating film 140, and the contact surface S2 of the conductive layer 120 with an insulating layer 150, on the first cross-section (FIG. 36) might form a continuously curved surface.

Second Embodiment

Next, a semiconductor memory device according to a second embodiment will be described with reference to FIGS. 37 and 38. Note that in the following description, the same signs as in the first embodiment are used to indicate components identical or corresponding to those in the first embodiment, without any description of those signs.

The semiconductor memory device according to this embodiment is basically in the same configuration as the first embodiment, except that the charge accumulation film of the memory cell MC is not a silicon nitride (SiN) film but a floating gate.

Figure 37:
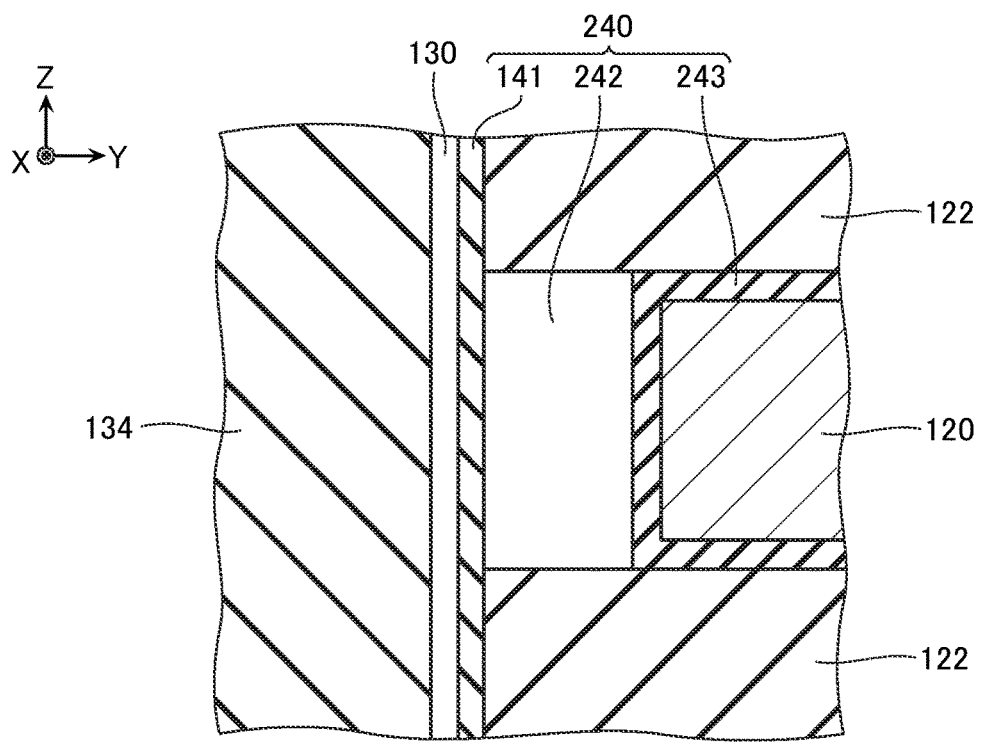
FIG. 37 is a schematic cross-sectional view showing a configuration of a semiconductor memory device according to a second embodiment.

In an example shown in FIG. 37, a gate insulating film 240 comprises the tunneling insulating film 141, a charge accumulation film 242 and a blocking insulating film 243, for example. The charge accumulation film 242 is a floating gate of polycrystalline silicone (p-Si) or the like injected with an impurity such as phosphorus (P) or boron (B). The blocking insulating film 243 comprises, for example, silicon oxide ($SiO_2$) or the like. The blocking insulating film 243 covers an upper surface and a lower surface of a conductive layer 120. The charge accumulation film 242 and the blocking insulating film 243 are each divided for each memory cell MC.

Figure 38:
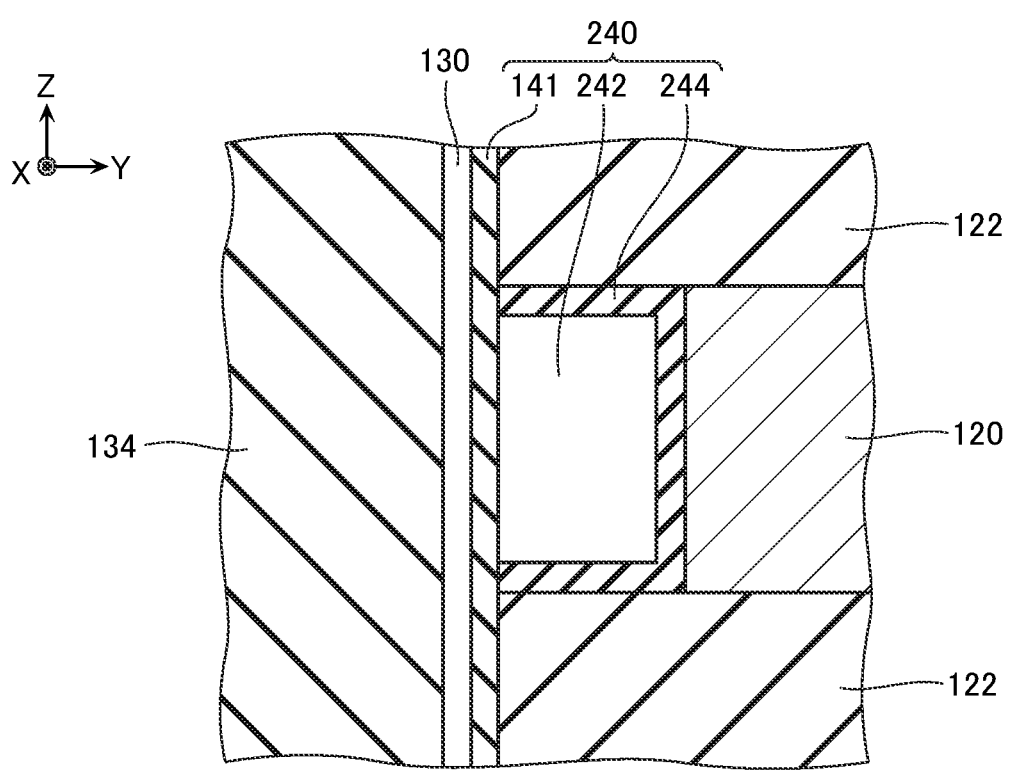
FIG. 38 represents a variation of the configuration shown in FIG. 37.

In an example shown in FIG. 38, the gate insulating film 240 comprises the tunneling insulating film 141, the charge accumulation film 242 and a blocking insulating film 244. The blocking insulating film 244 is configured almost the same as the blocking insulating film 243 (FIG. 37), but covers an upper surface and a lower surface of the charge accumulation film 242.

[Method for Manufacturing]

Next, a method for manufacturing the semiconductor memory device according to this embodiment will be described.

In this method for manufacturing it, the processes described with reference to FIGS. 7-13 are performed.

Figure 39:
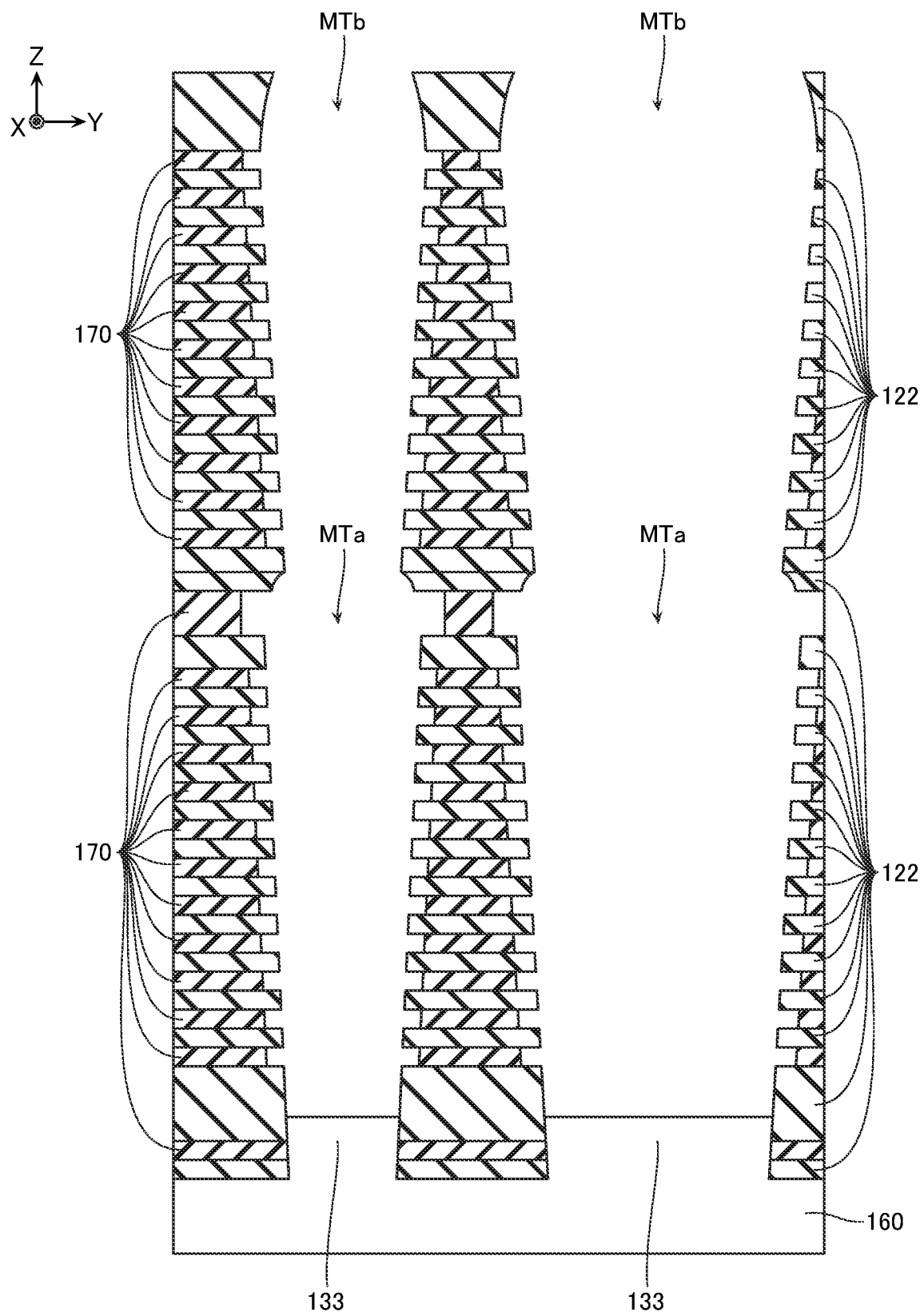
FIG. 39 is a schematic cross-sectional view showing a method for manufacturing the semiconductor memory device according to the second embodiment.

Then, as shown in FIG. 39, a part of the sacrificial layer 170 is selectively removed through the memory trench MTa and the memory trench MTb to form a plurality of recess portions. This process is achieved by wet etching, or the like.

Figure 40:
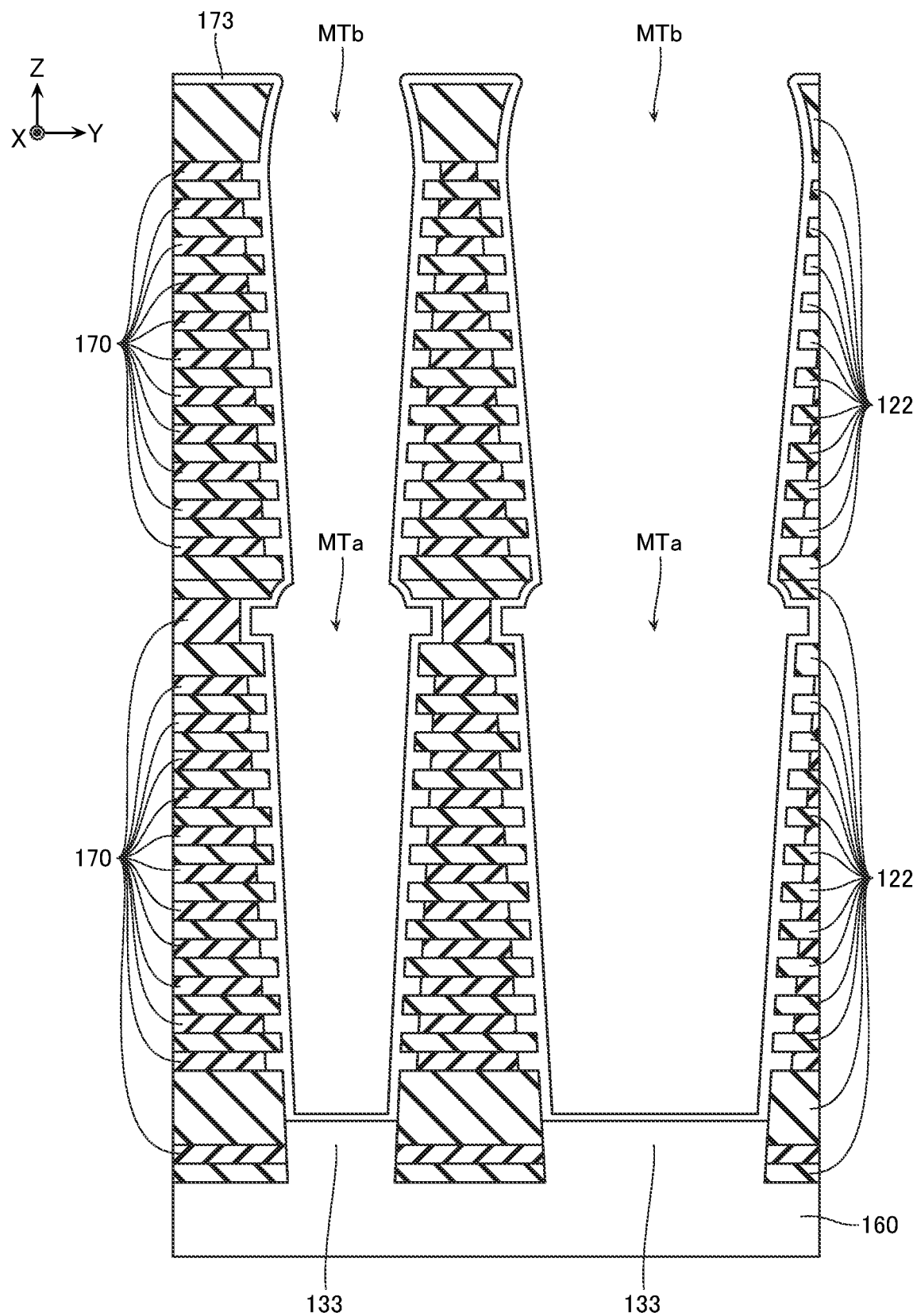
FIG. 40 is a schematic cross-sectional view showing the method for manufacturing the same.

Then, as shown in FIG. 40, a film 173 is formed to fill the plurality of recess portions. In forming an example of the configuration as shown in FIG. 37, the film 173 is a semiconductor layer of amorphous silicon or the like (a-Si). In forming the configuration as shown in FIG. 38 as an example, the film 173 is a stacked film comprising the blocking insulating film 244 and a semiconductor layer of amorphous silicon or the like (a-Si). Note that the film 173 has such a thickness as not to fully fill the memory trench MTa and the memory trench MTb. This process is performed by means of CVD or the like.

Figure 41:
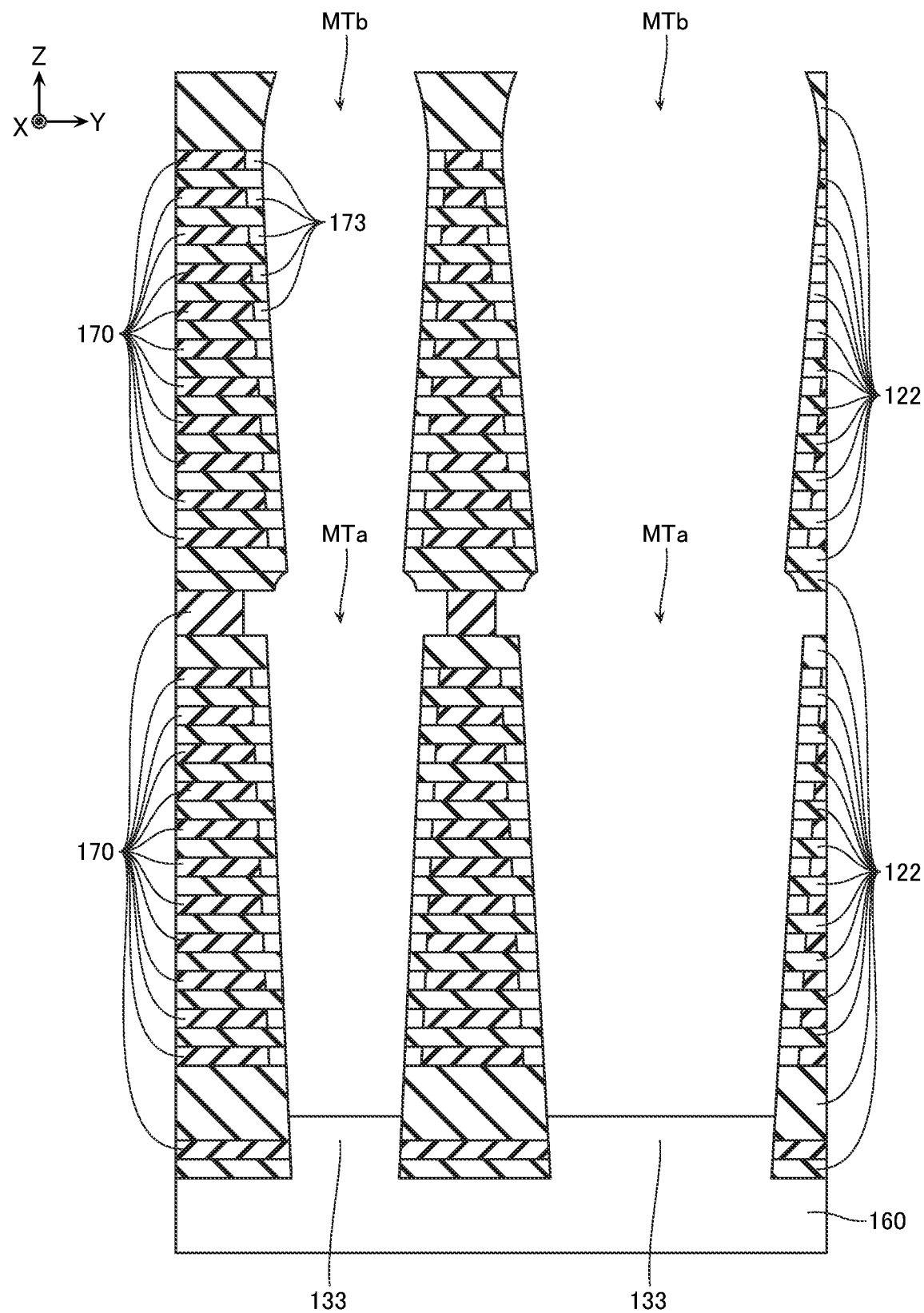
FIG. 41 is a schematic cross-sectional view showing the method for manufacturing the same.

Then, as shown in FIG. 41, a part of the film 173 is removed to divide the film 173 in the Z direction. This process is achieved by wet etching or the like.

Figure 42:
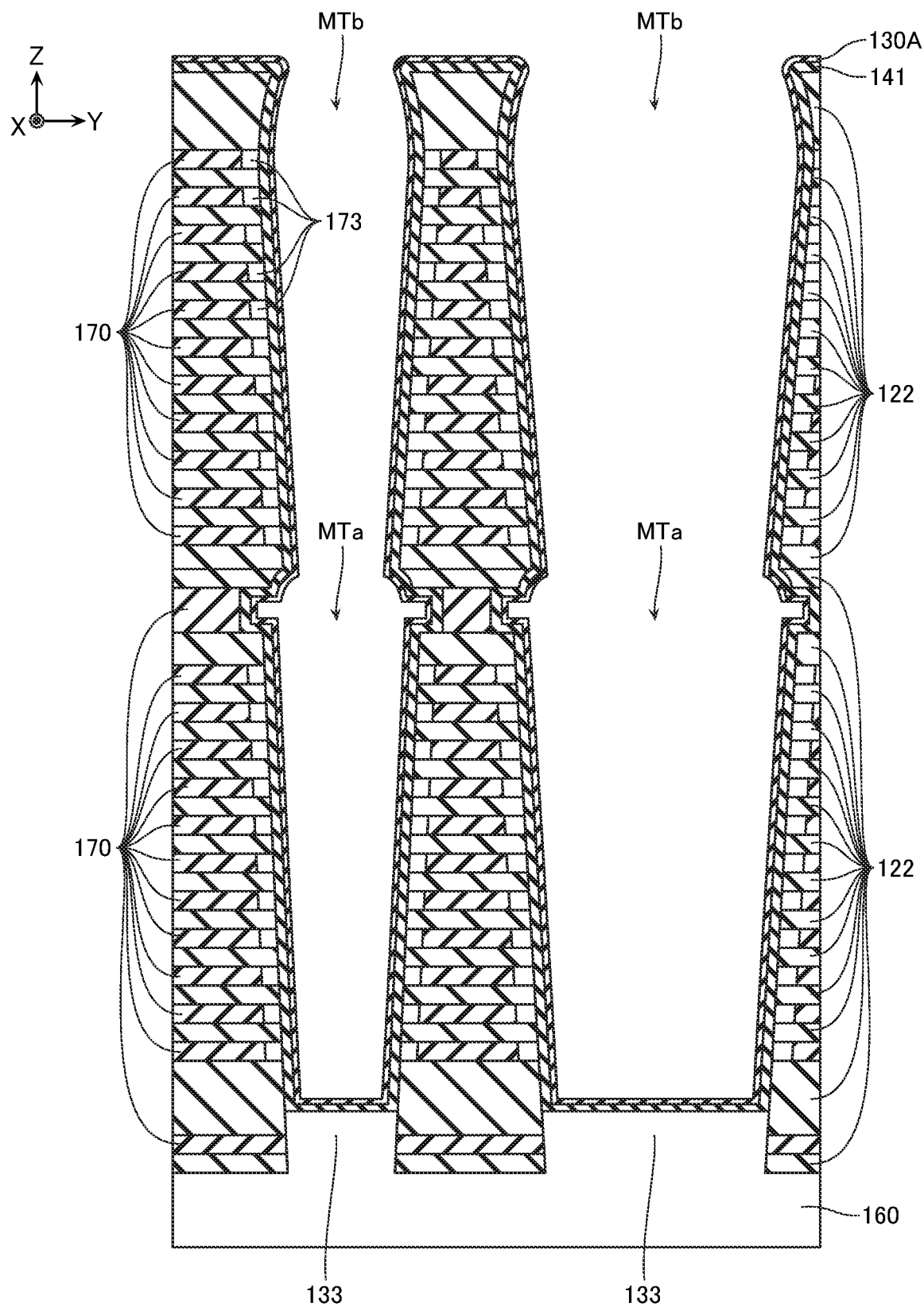
FIG. 42 is a schematic cross-sectional view showing the method for manufacturing the same.

Then, as shown in FIG. 42, the tunneling insulating film 141 and the amorphous silicon film 130A are formed on lateral surfaces of the memory trench MTa and memory trench MTb. This process is, for example, performed by means of CVD or the like. It is performed in the same way as the process described with reference to FIG. 14, for example.

Then, the processes as described with reference to FIG. 15 and drawings thereafter are performed. However, in forming the configuration as shown in FIG. 37 as an example, the blocking insulating film 243 is formed before the conducive layer 120 is formed. In this way, the semiconductor memory device according to this embodiment is formed.

Third Embodiment

Figure 43:
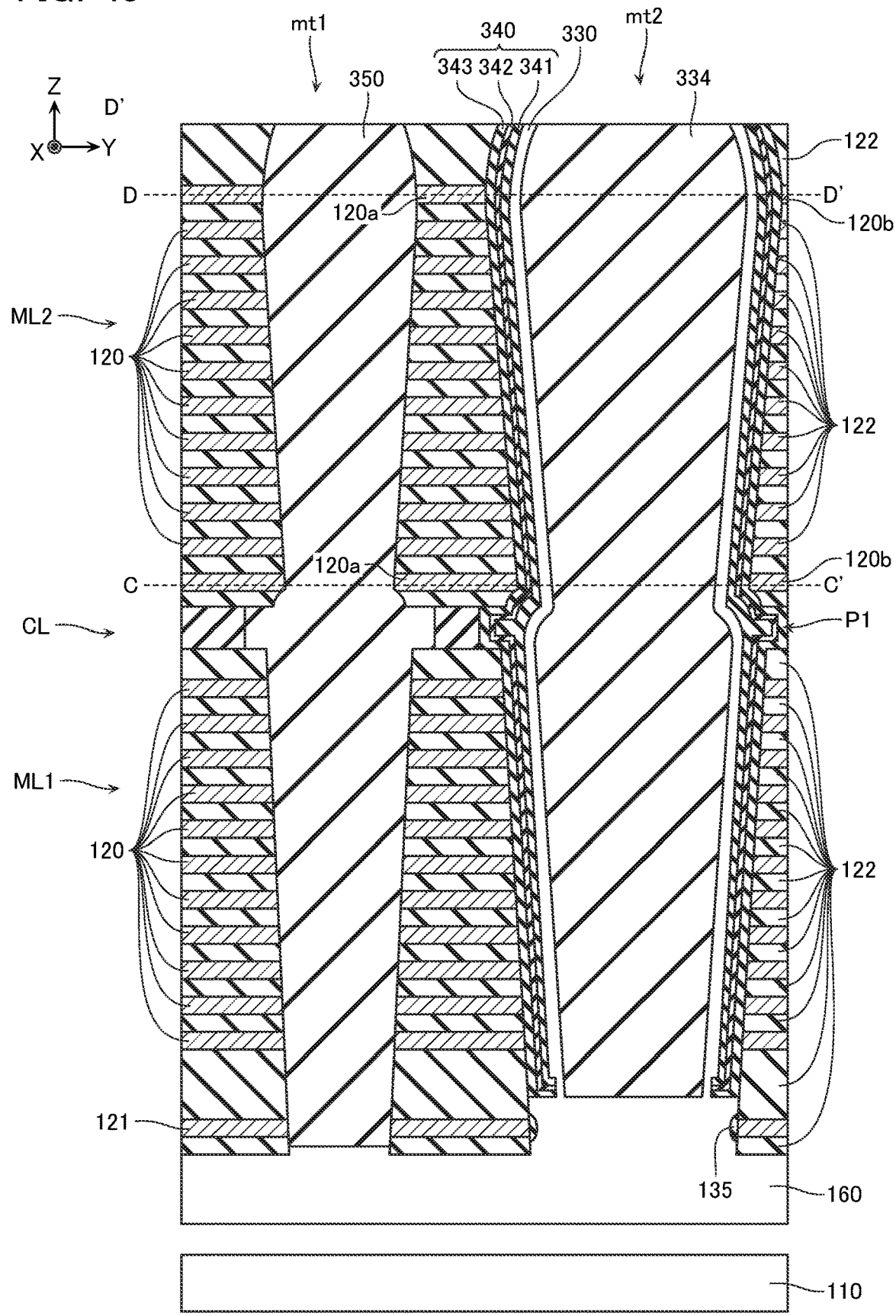
FIG. 43 is a schematic perspective view of a semiconductor memory device according to a third embodiment.

Next, a semiconductor memory device according to a third embodiment will be described with reference to FIGS. 43-45. Note that in the following description, the same signs as in the first embodiment are used to indicate components identical or corresponding to those in the first embodiment, without any description of those signs.

In the first embodiment, each narrow portion mt1 of the memory trench MT is provided with the semiconductor portion 130 and the gate insulating film 140, and each wide portion mt2 of the memory trench MT is provided with the insulating layer 150. On the other hand, in this embodiment, each wide portion mt2 of the memory trench MT is provided with a semiconductor portion 330 and a gate insulating film 340, and each narrow portion mt1 of the memory trench MT is provided with an insulating layer 350.

In this embodiment, the gate insulating film 340 is provided on parts of both lateral surfaces in the Y direction of the conductive layer 120, the parts corresponding to the wide portions mt2, and the insulating layer 350 is provided on parts corresponding to the narrow portions mt1.

The semiconductor portion 330, the insulating layer 334 and the gate insulating film 340 according to this embodiment are basically configured the same as the semiconductor portion 130, the insulating layer 134 and the gate insulating film 140 according to the first embodiment. However, the semiconductor portion 330, the insulating layer 334 and the gate insulating film 340 form an almost columnar structure extending in the Z direction. The width in the Y direction of this columnar structure is larger than the width in the Y direction of the narrow portion mt1.

Next, the widths of, and the distances between, components, etc., will be described with reference to FIGS. 44 and 45, etc. FIG. 44 is a cross-sectional view that corresponds to a cross-section indicated by a line C-C' (first cross-section) in FIG. 43. FIG. 45 is a cross-sectional view that corresponds to a cross-section indicated by a line D-D' (second cross-section) in FIG. 2.

The sign "p" (FIG. 44) indicates a center point of a semiconductor portion 330 on the first cross-section. The center point "p" may be, for example, a geometrical center of gravity of the semiconductor portion 330. In that case, the geometrical center of gravity may be that of the semiconductor portion 330 that appears on the first cross-section on the assumption that the layer is uniform in terms of weight per area. It may also be a point indicated by the X coordinate value that indicates the center position in the X direction of the semiconductor portion 330 and the Y coordinate value that indicates the center position in the Y direction of the semiconductor portion 330. The center point "p" may also be determined by applying a circular, elliptical, rectangular, or other shape line to the contours of the semiconductor portion 330, and defining the center point of the applied shape as the center point.

D1 (FIG. 44) indicates the smallest distance from the center point "p" to the conductive layer 120 on the first cross-section. If the smallest distance from the point "p" to the first conductive layer 120a is different from the smallest distance from the center point "p" to the second conductive layer 120b, for example, the smaller of the two may be taken as D1.

D2 (FIG. 45) indicates the distance in the Y direction between the first conductive layer 120a and the second conductive layer 120b on the second cross-section. In this embodiment, the relationship 2D1>D2 is satisfied.

Figure 44:
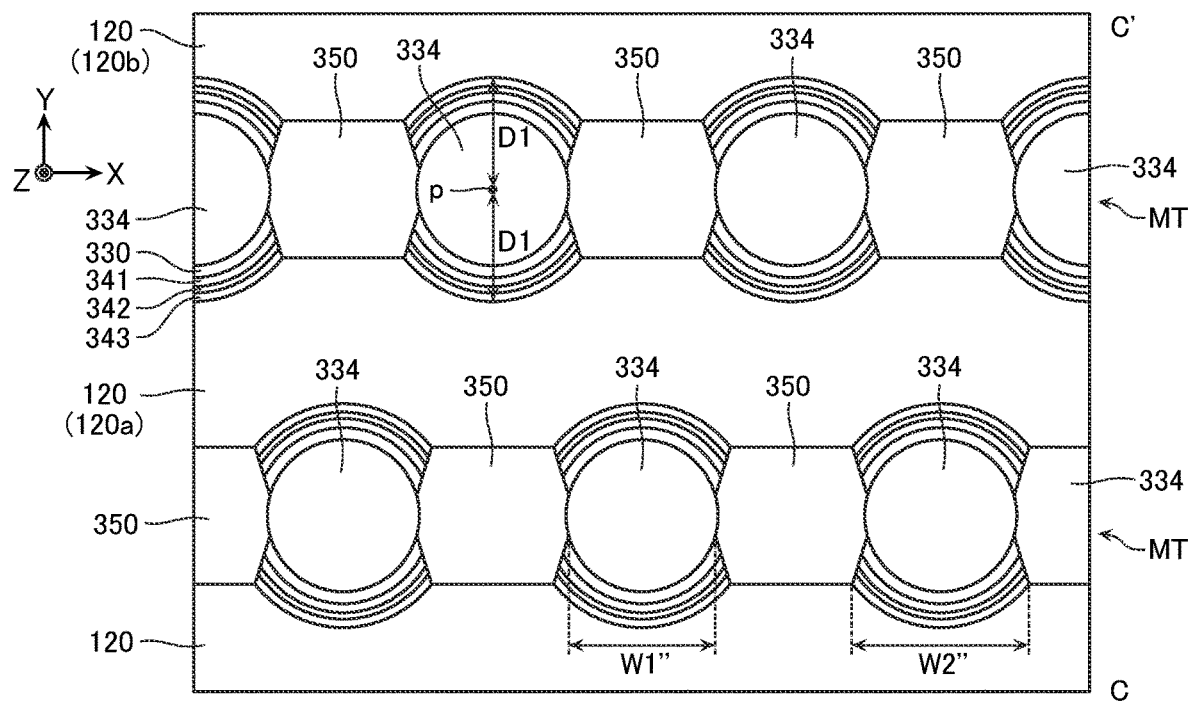
FIG. 44 is a schematic cross-sectional view that corresponds to a cutting plane indicated by a line C-C' in FIG. 43.
Figure 45:
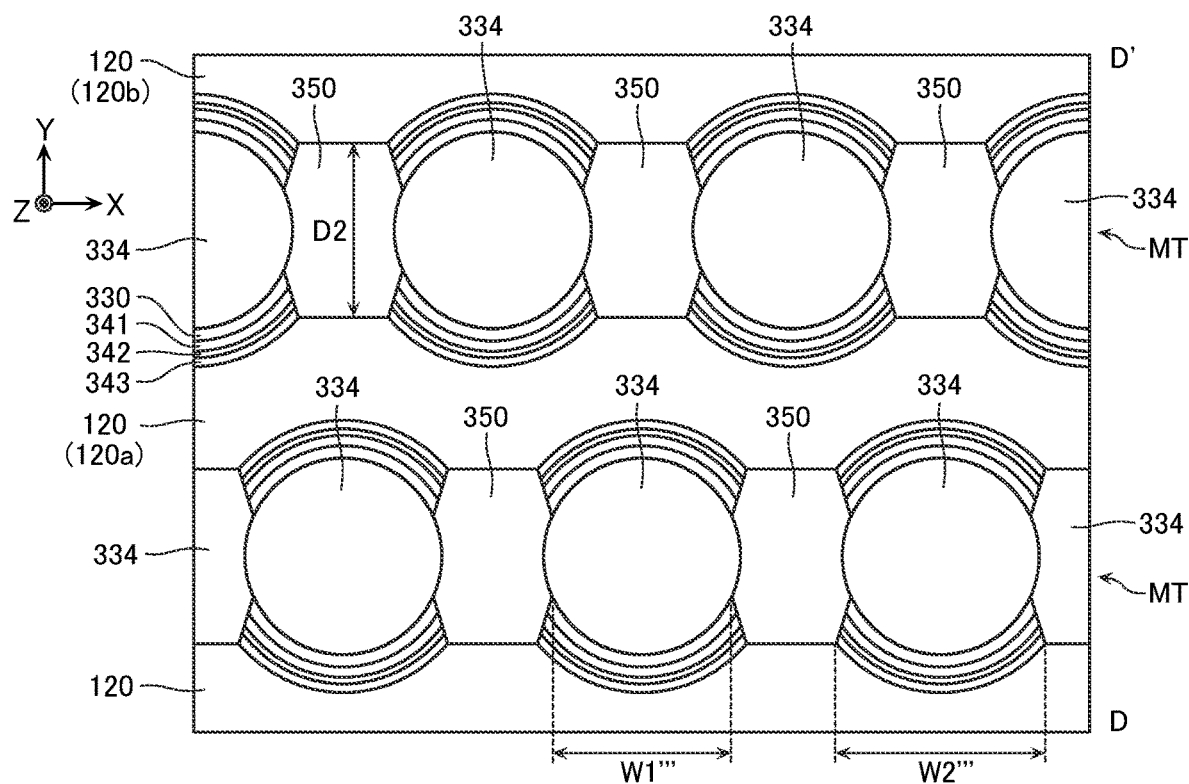
FIG. 45 is a schematic cross-sectional view that corresponds to a cutting plane indicated by a line D-D' in FIG. 43.

In addition, as shown in FIGS. 44 and 45, in this embodiment, widths W1", W1'" (<W1") in the X direction of the semiconductor portion 330 are smaller than widths W2", W2'" (<W2") in the X direction of the gate insulating film 340, respectively. However, the widths W1", W1'" of the semiconductor portion 330 may be larger than the widths W2", W2'" in the X direction of the gate insulating film 340, respectively.

[Method for Manufacturing]

Next, a method for manufacturing the semiconductor memory device according to this embodiment will be described.

In the method for manufacturing, the processes described with reference to FIGS. 7-12 are performed.

Figure 46:
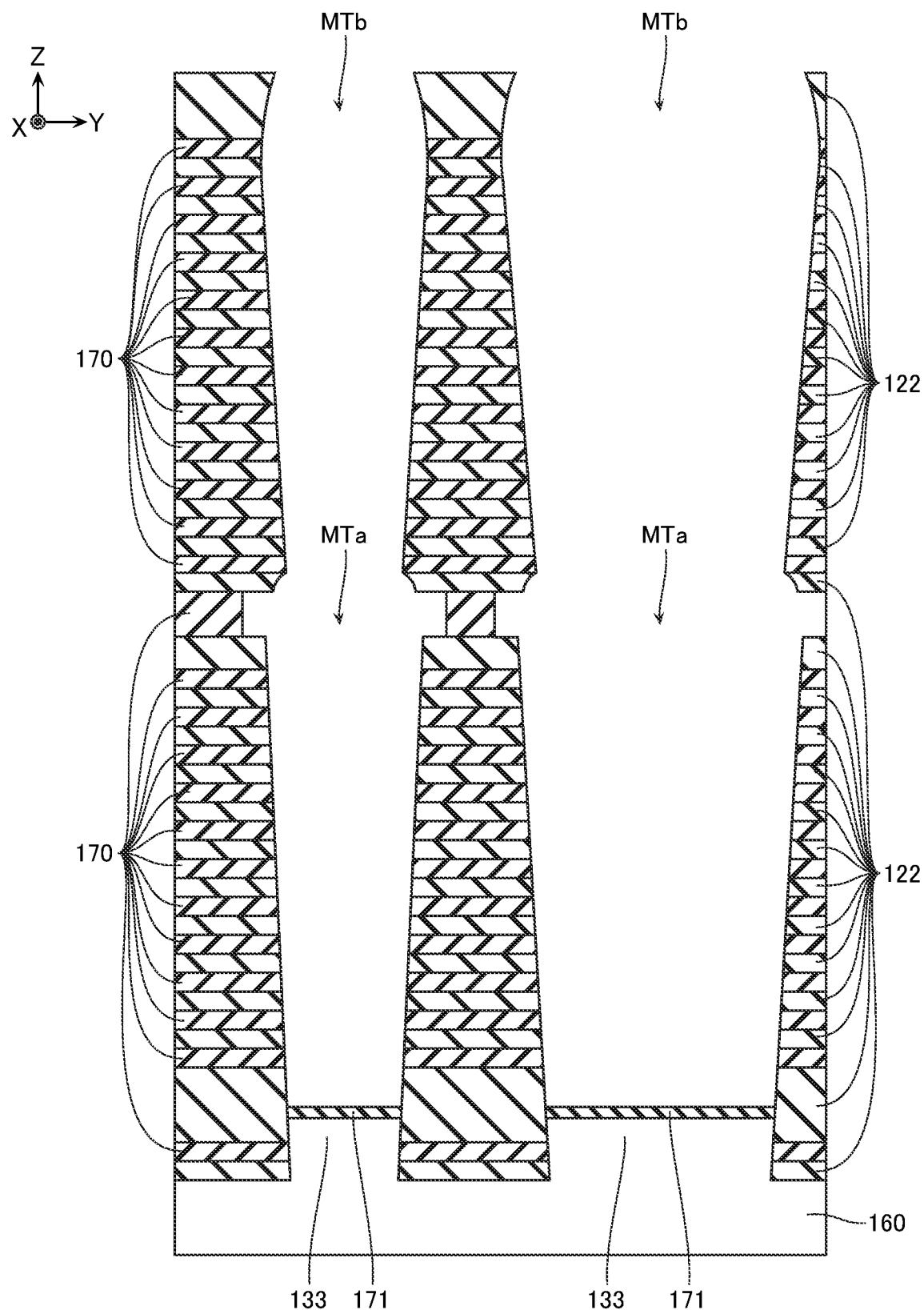
FIG. 46 is a schematic cross-sectional view showing a method for manufacturing the semiconductor memory device according to the third embodiment.

Then, as shown in FIG. 46, the sacrificial layer 172 is removed through the memory trench MTb to expose lateral surfaces of the memory trench MTa. This process is performed by means of wet etching or the like.

Figure 47:
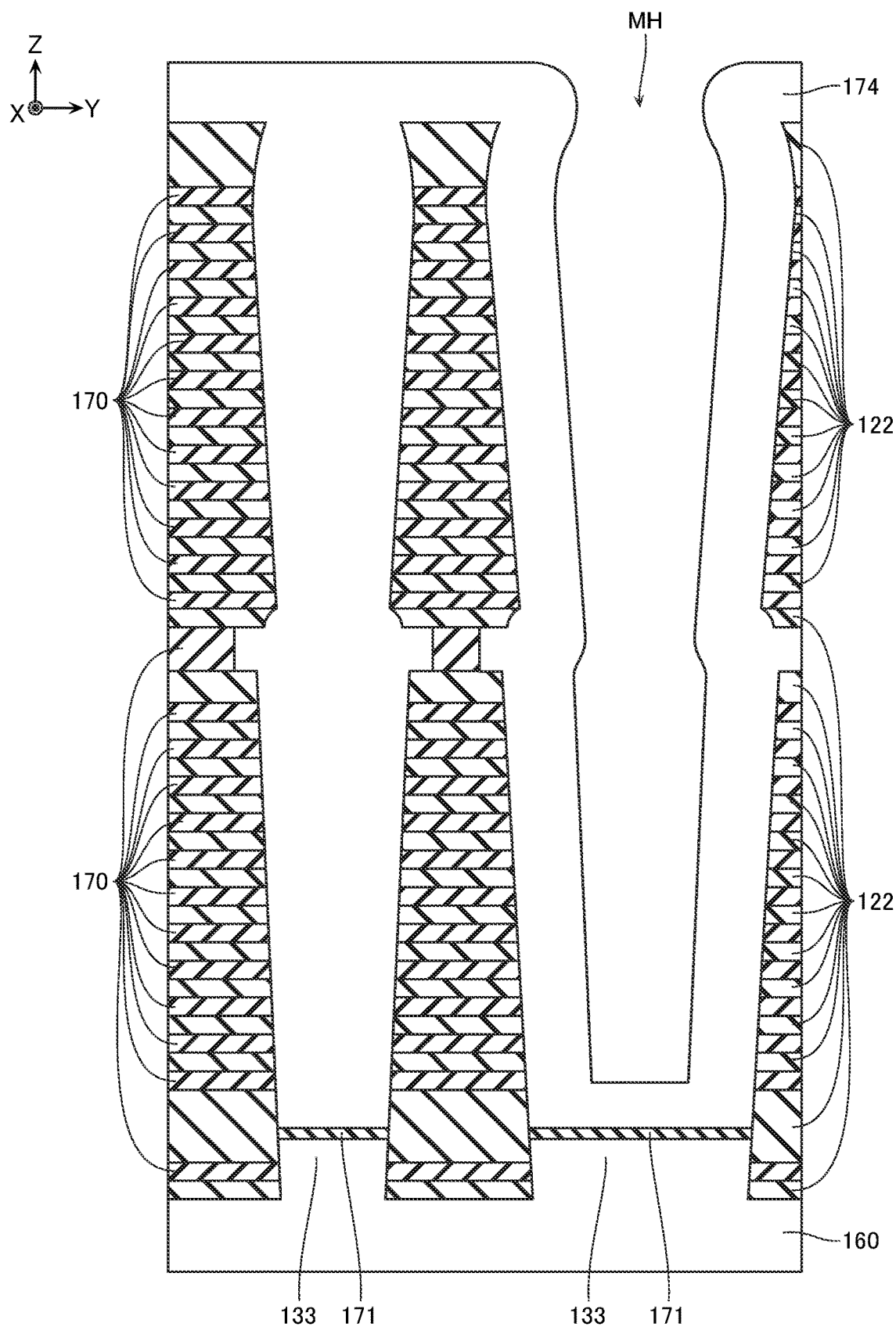
FIG. 47 is a schematic cross-sectional view showing the method for manufacturing the same.
Figure 48:
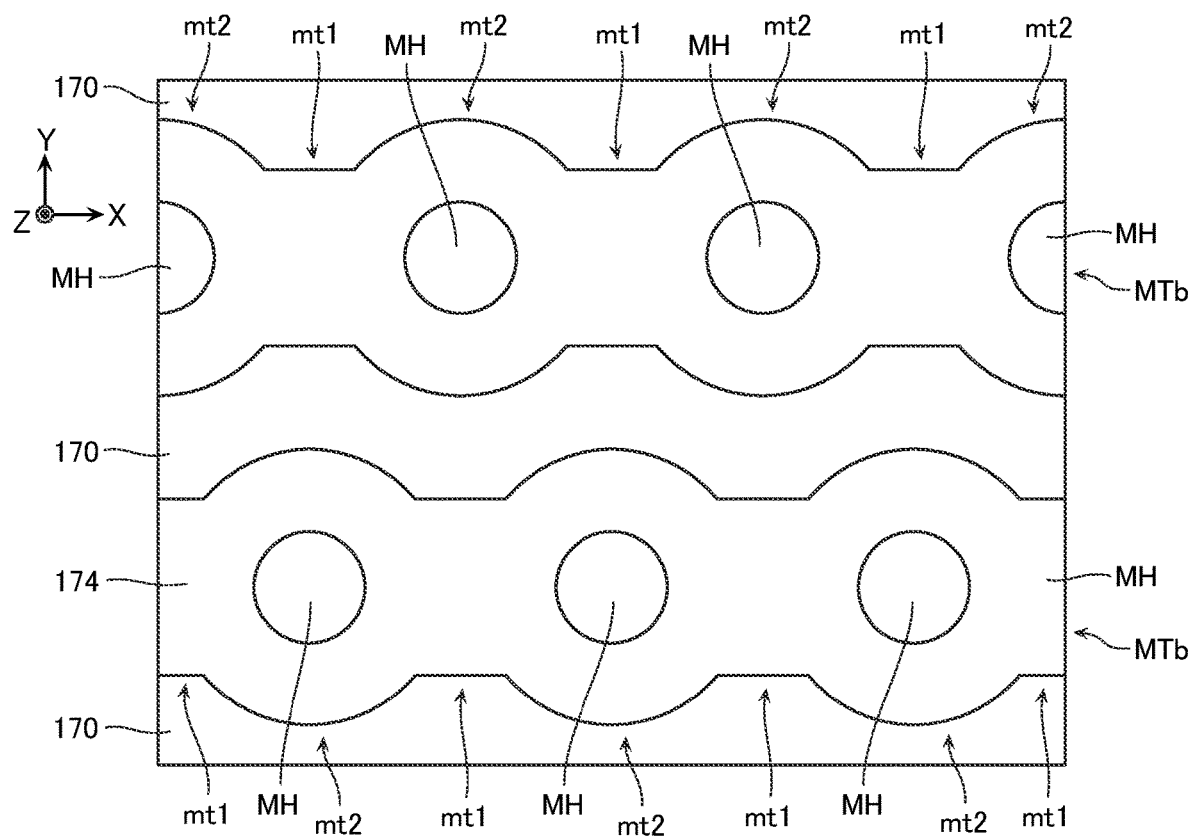
FIG. 48 is a schematic cross-sectional view showing the method for manufacturing the same.

Then, as shown in FIGS. 47 and 48, a sacrificial film 174 is formed inside the memory trench MTa and the memory trench MTb. At this time, the narrow portions mt1 of the memory trench MTa and the memory trench MTb are filled with the sacrificial film 174. On the other hand, the wide portions mt2 of the memory trench MTa and the memory trench MTb are not filled with the sacrificial film 174. Accordingly, the memory holes MH each extending in the Z direction are formed in the wide portions mt2 in a self-aligned manner.

Figure 49:
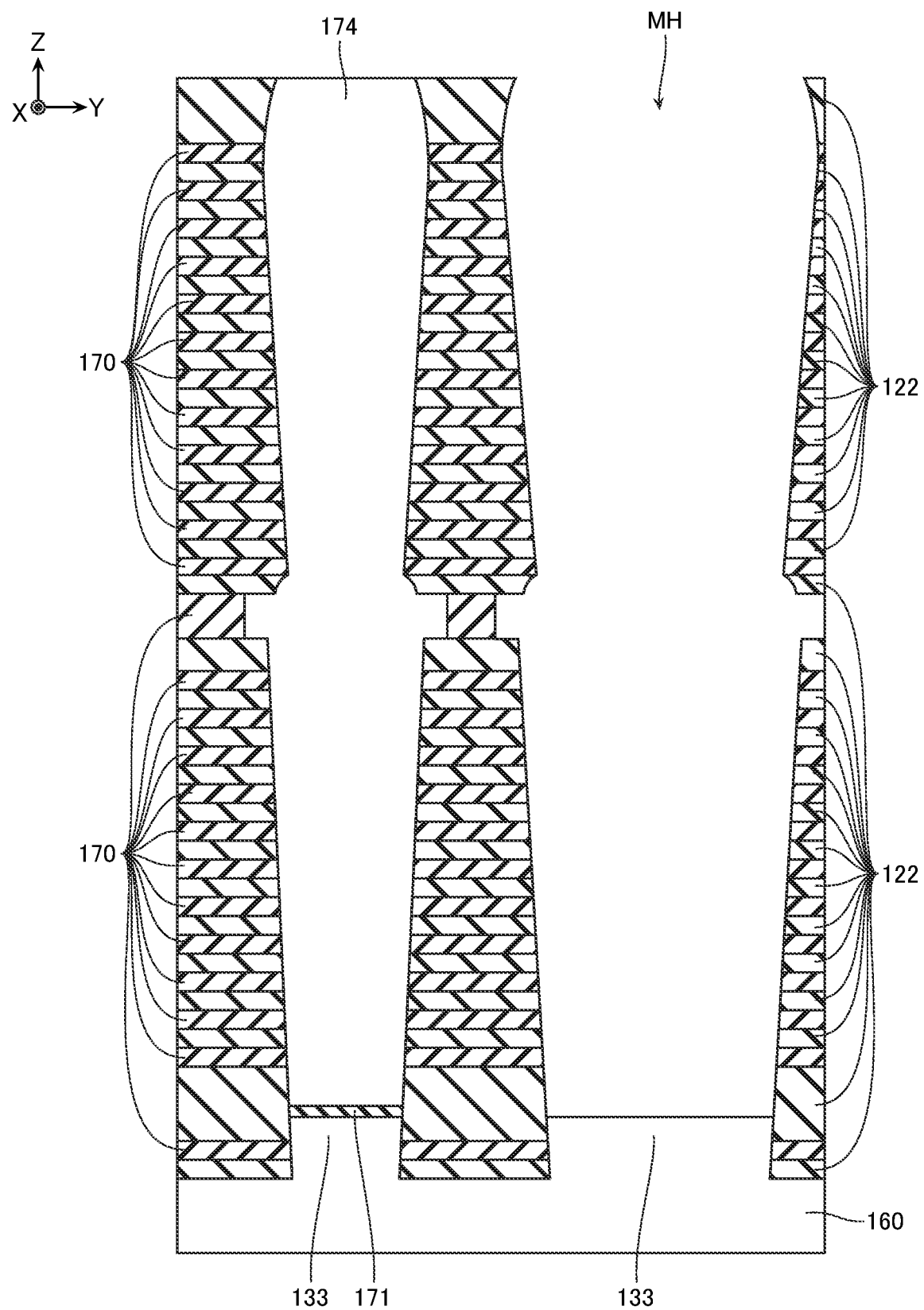
FIG. 49 is a schematic cross-sectional view showing the method for manufacturing the same.
Figure 50:
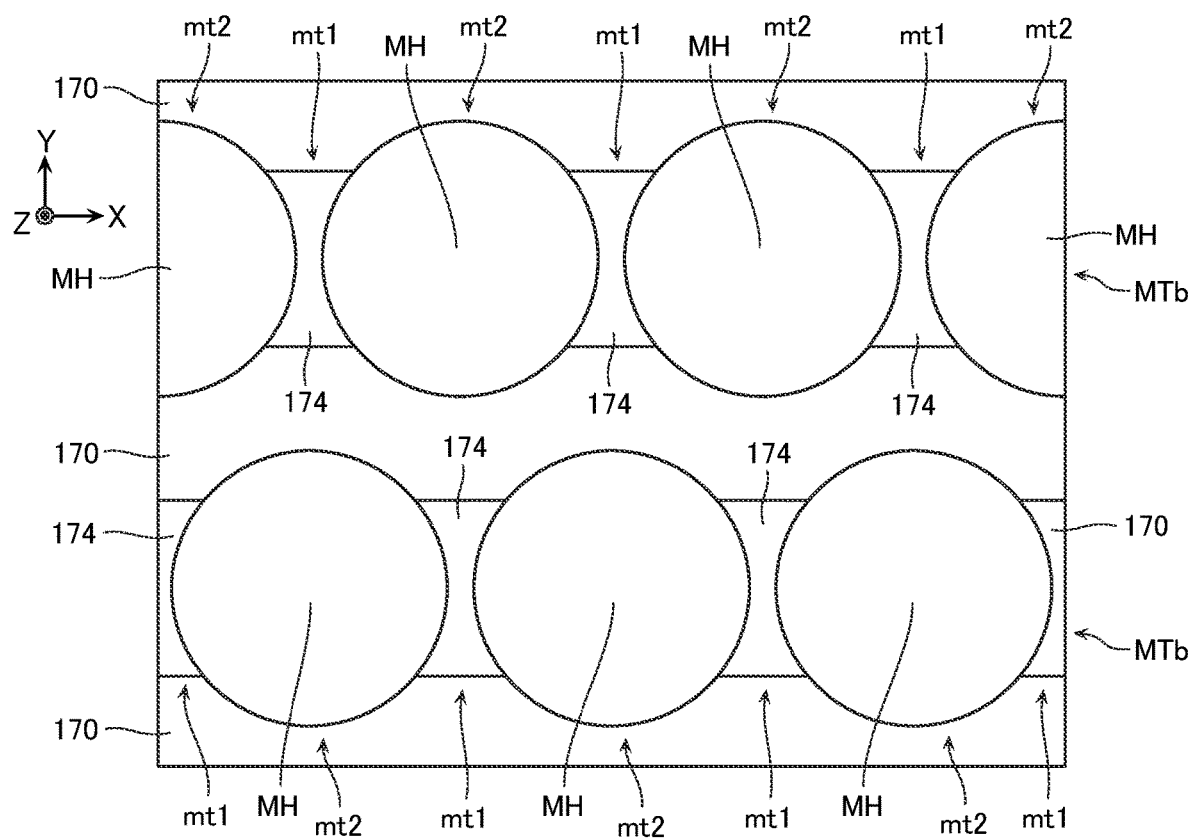
FIG. 50 is a schematic cross-sectional view showing the method for manufacturing the same.

Then, as shown in FIGS. 49 and 50, a part of the sacrificial film 174 is removed to expose the plurality of insulating layers 122 and the plurality of sacrificial layers 170 on the circumferential inside surfaces of the memory hole MH. In addition, the sacrificial layer 171 is removed to expose the semiconductor layer 133 on the bottom surface of the memory hole MH. This process is performed through the memory hole MH by means of wet etching or the like.

Figure 51:
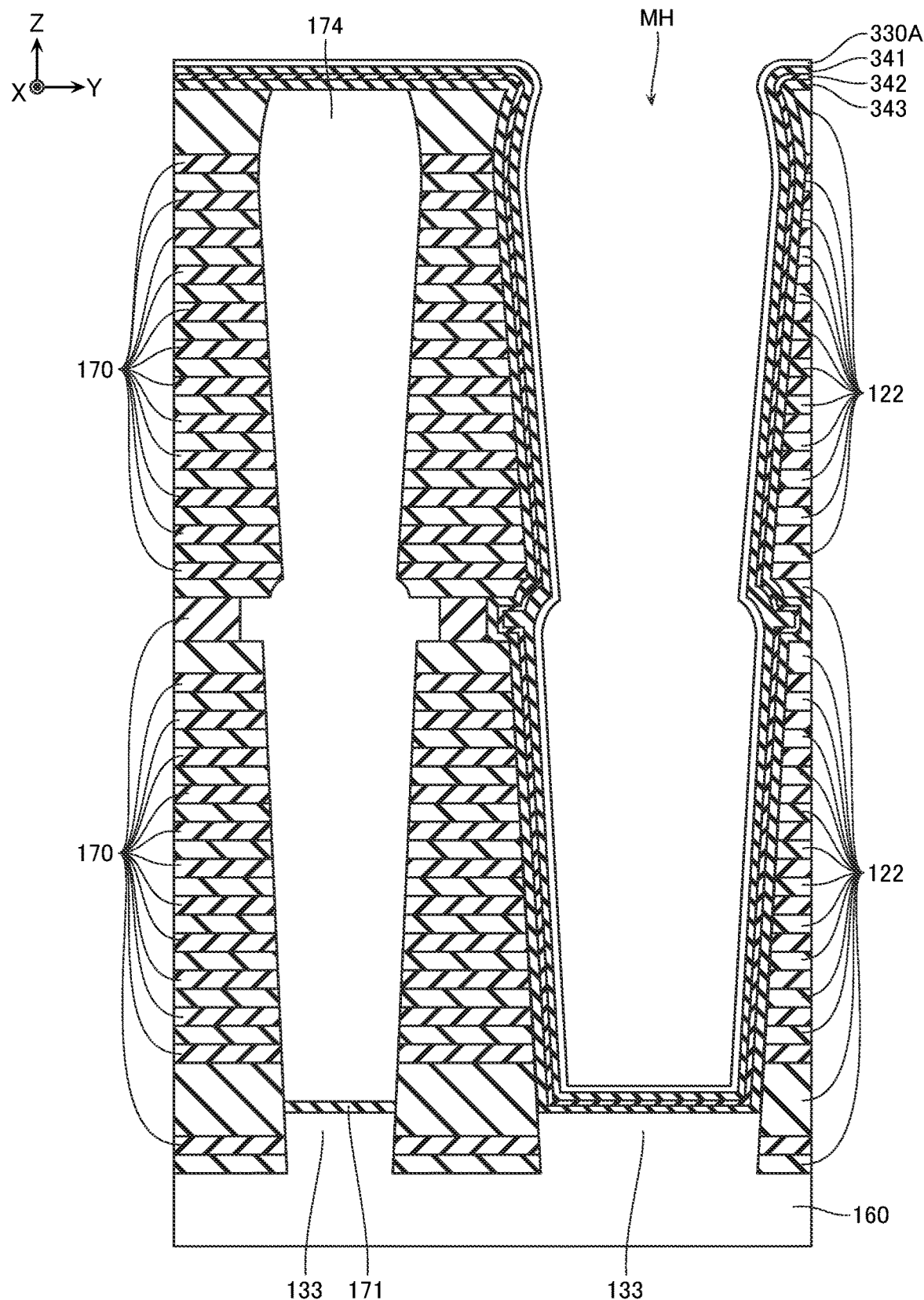
FIG. 51 is a schematic cross-sectional view showing the method for manufacturing the same.

Then, as shown in FIG. 51, a blocking insulating film 343, a charge accumulation film 342, a tunneling insulating film 341, and an amorphous silicon film 330A are formed on the bottom and lateral surfaces of the memory hole MH. This process is performed by means of, e.g., CVD.

Figure 52:
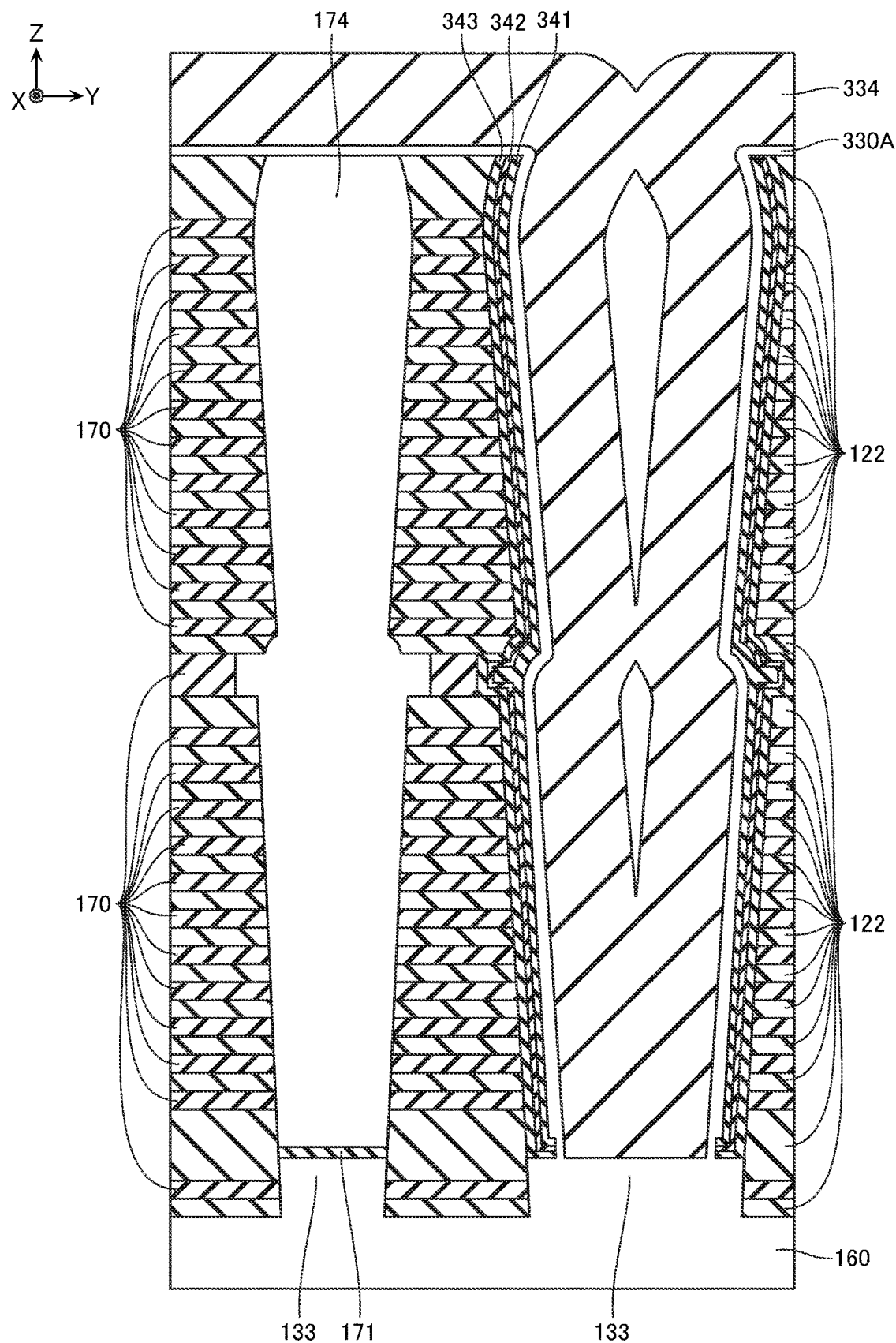
FIG. 52 is a schematic cross-sectional view showing the method for manufacturing the same.
Figure 53:
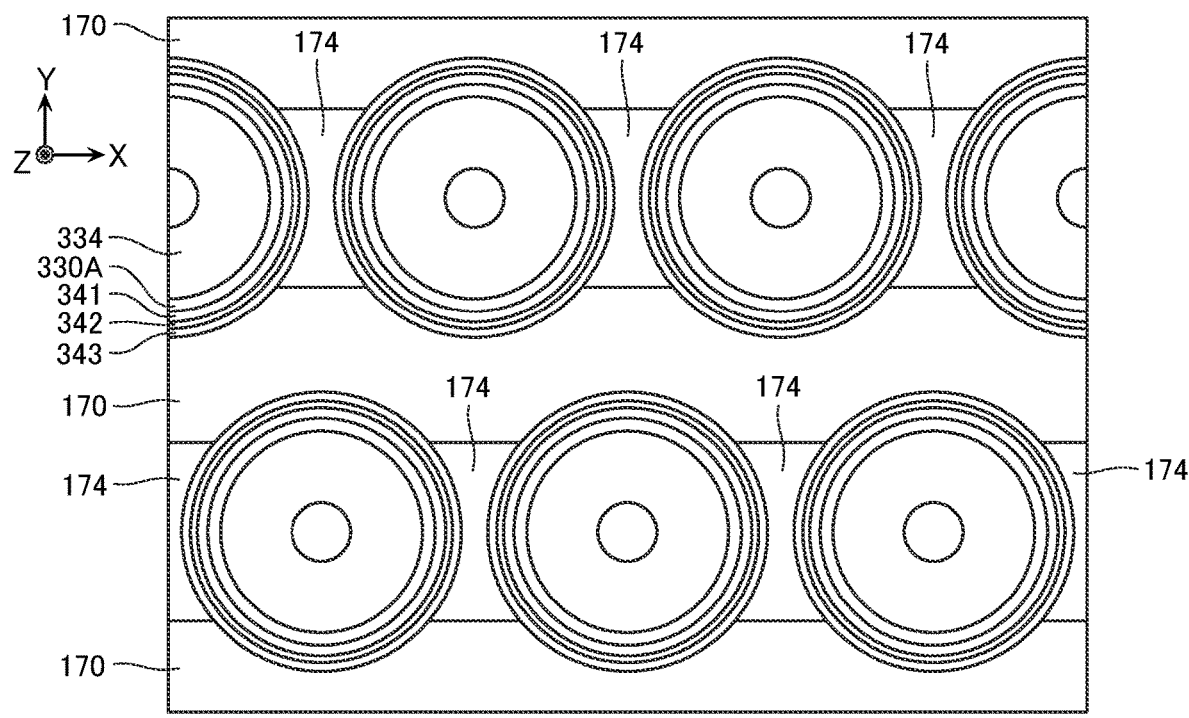
FIG. 53 is a schematic cross-sectional view showing the method for manufacturing the same.

Then, the processes described with reference to FIGS. 15-18 are performed to form a structure shown in FIGS. 52 and 53. However, in the processes described with reference to FIGS. 16-18, upper ends of the memory holes MH are closed by an insulating layer 334. Thus, the thickness of the films of the insulating layer 134, etc., (343, 342, 341, 330A, and 334) is adjusted to be larger than the radius of the upper end of the memory hole MH.

Figure 54:
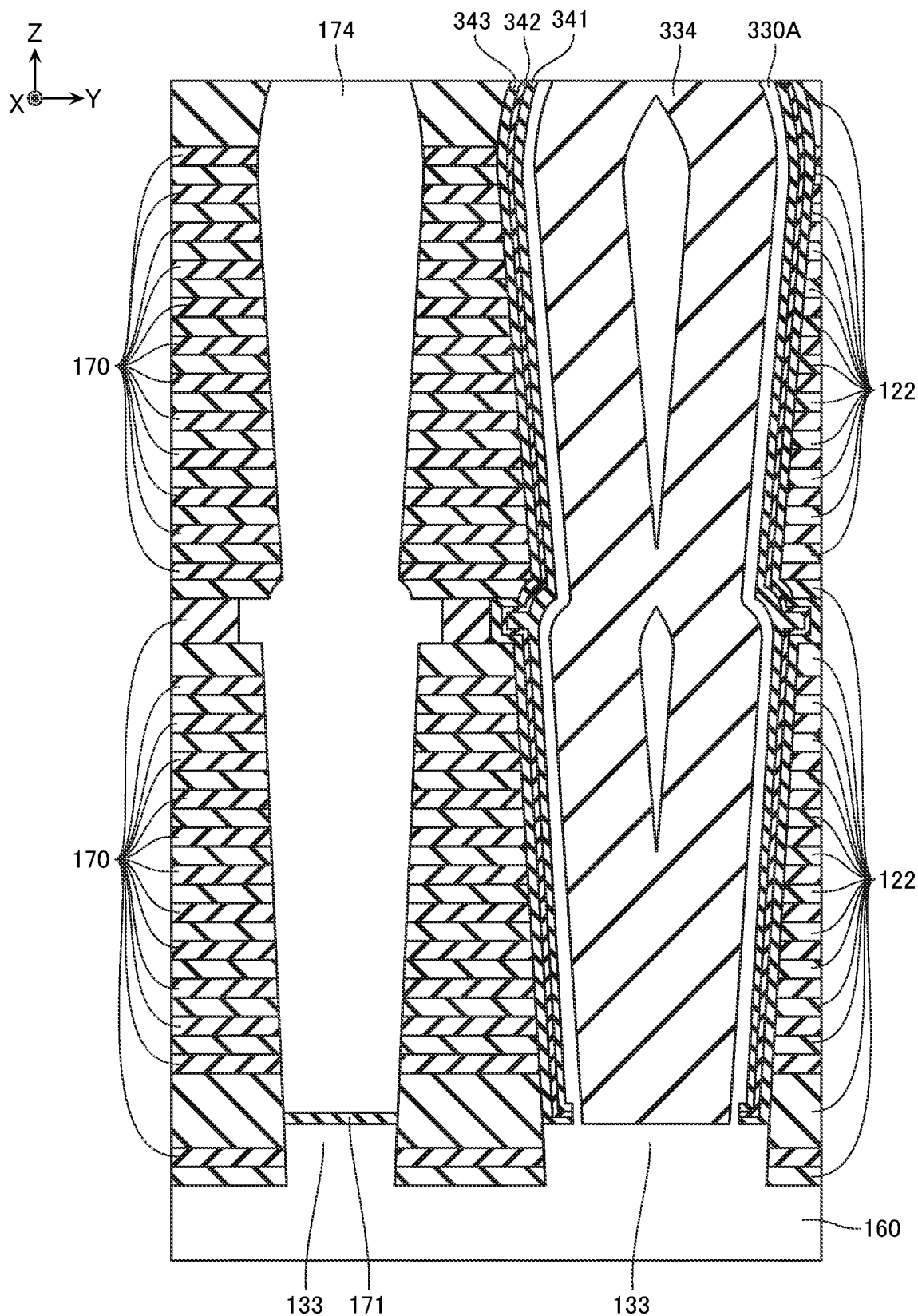
FIG. 54 is a schematic cross-sectional view showing the method for manufacturing the same.

Then, as shown in FIG. 54, parts of the insulating layer 334 and the amorphous silicon film 330A are removed to expose the upper surface of the sacrificial film 174. This process is performed by means of RIE, or the like.

Figure 55:
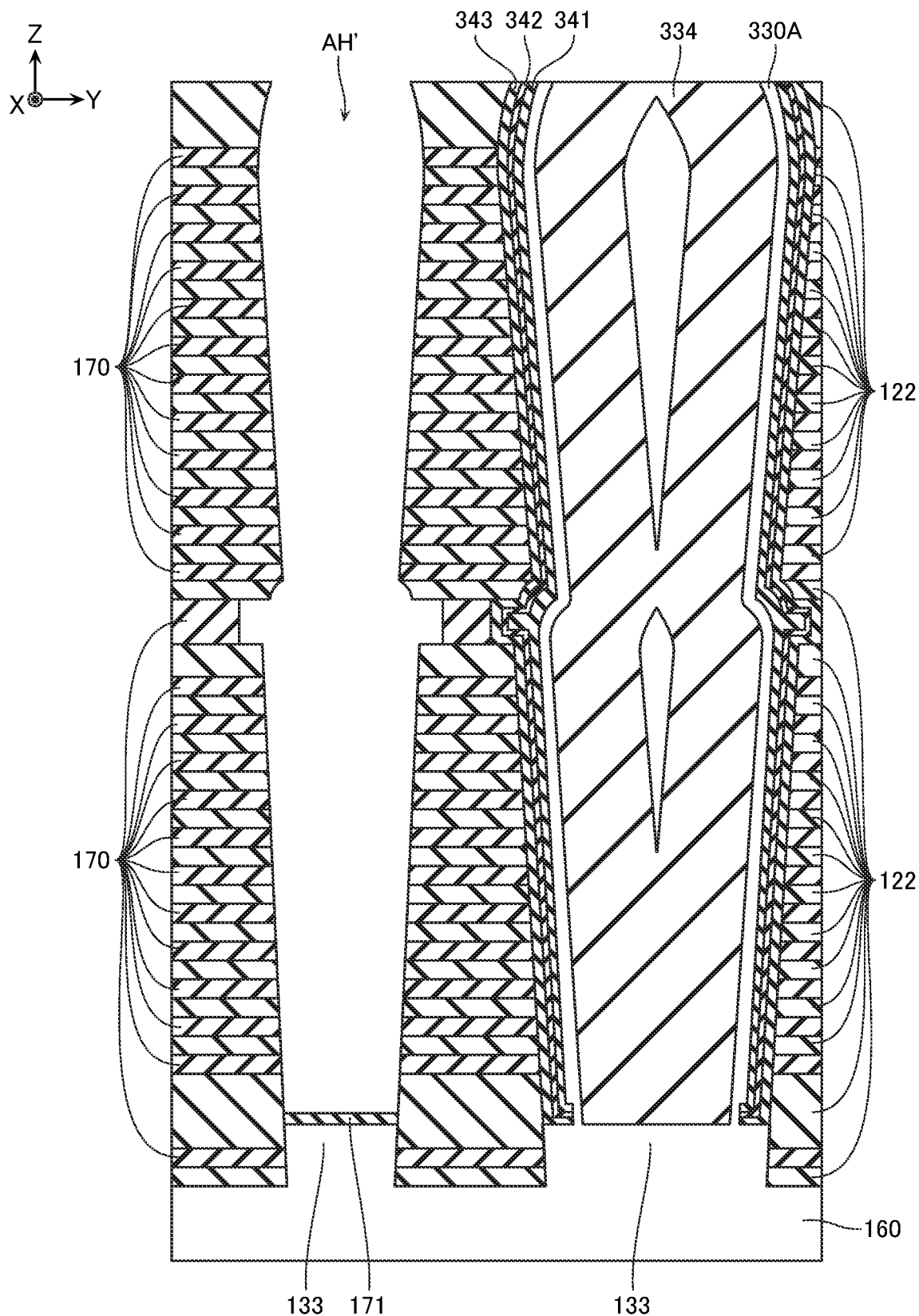
FIG. 55 is a schematic cross-sectional view showing the method for manufacturing the same.
Figure 56:
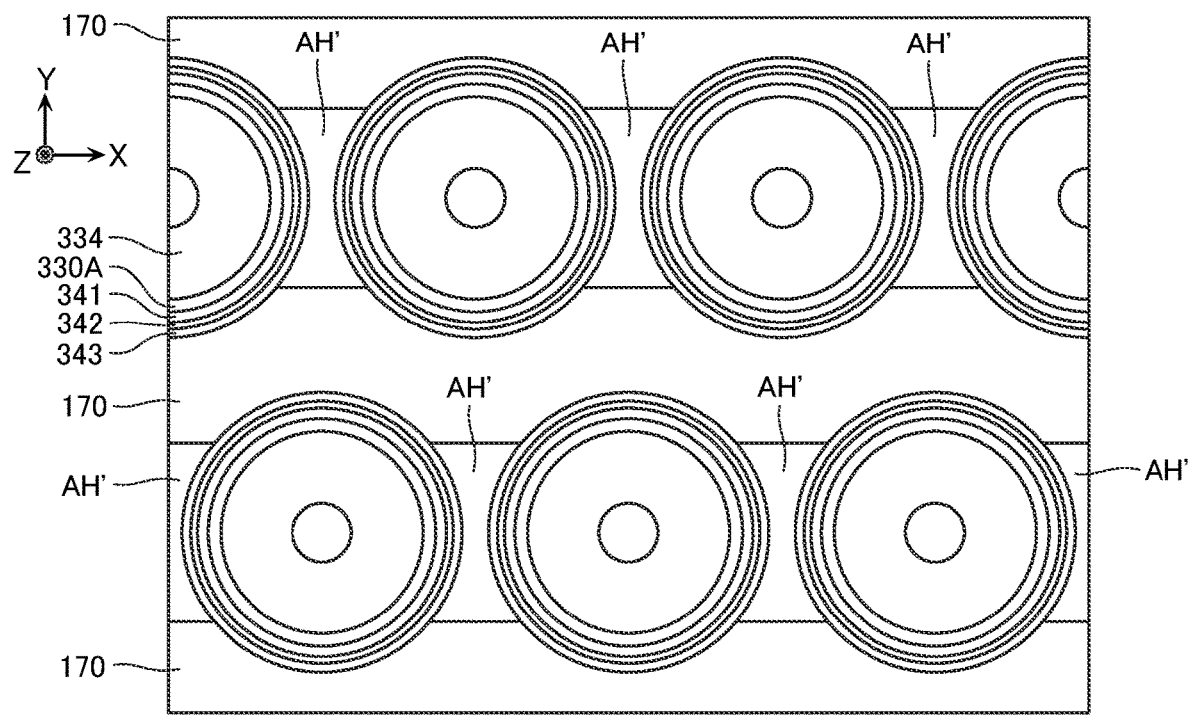
FIG. 56 is a schematic cross-sectional view showing the method for manufacturing the same.

Then, as shown in FIG. 55 and FIG. 56, the sacrificial film 174 is removed to form an opening AH'. The opening AH', extending in the Z direction, exposes lateral surfaces of the blocking insulating film 343. This process is performed, for example, by means of wet etching, or the like.

Figure 57:
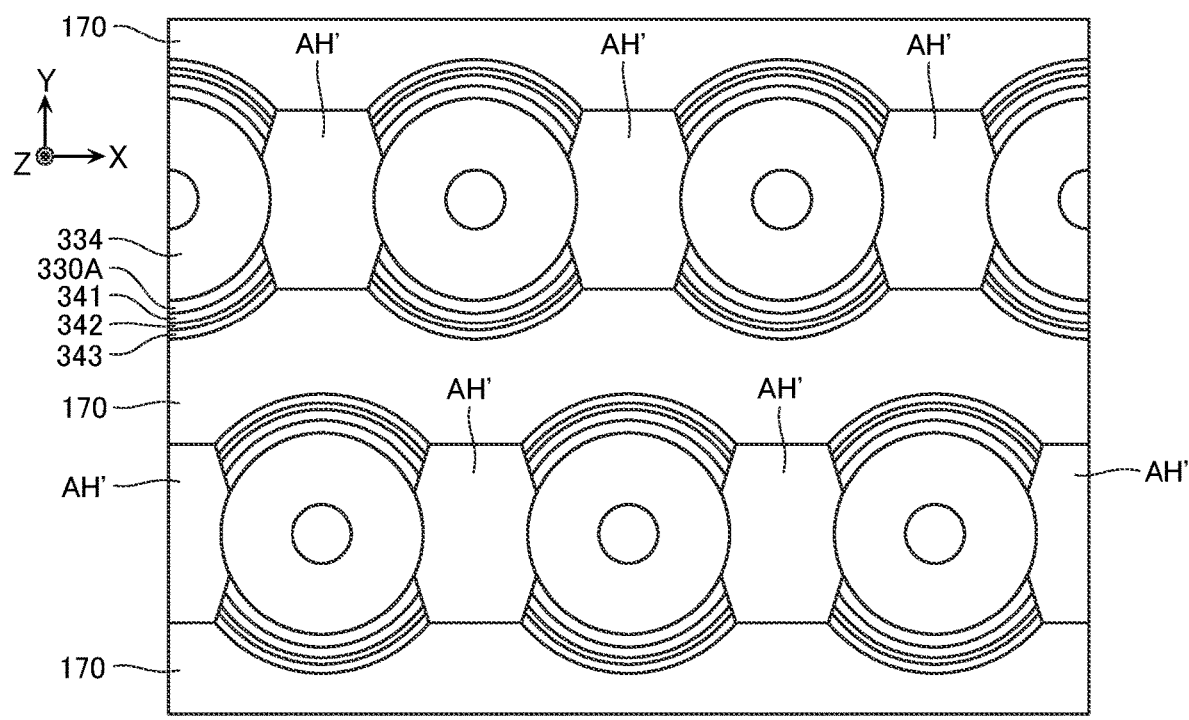
FIG. 57 is a schematic cross-sectional view showing the method for manufacturing the same.

Then, as shown in FIG. 57, parts of the blocking insulating film 343, the charge accumulation film 342, the tunneling insulating film 341, and the amorphous silicon film 330A are removed through the opening AH' to divide these films in the Y direction. This process is performed, for example, through the opening AH' by means of wet etching, or the like.

Then, the amorphous silicon film 330A is put through, for example, thermal treatment or the like to reform its crystal structure to form a semiconductor portion 330 of polycrystalline silicon (p-Si) or the like. The processes following this are the same as the first embodiment. As a result, a structure shown in FIG. 43 is formed.

Other Embodiments

In the third embodiment, the charge accumulation layer of the memory cell MC is a silicon nitride (SiN) film. However, in the third embodiment, a floating gate may be used as the charge accumulation layer.

The semiconductor memory devices according to the first to third embodiments each comprise the first memory layer ML1 and the second memory layer ML2 (FIG. 2). However, the semiconductor memory device may comprise three or more memory layers disposed in the Z direction. In that case, a connection layer CL may be provided between each two memory layers adjacent in the Z direction.

OTHERS

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a first stacked body comprising a plurality of first conductive layers stacked in a first direction intersecting with a surface of the substrate;
a second stacked body comprising a plurality of second conductive layers stacked in the first direction, and being adjacent to the first stacked body in a second direction intersecting with the first direction;
a plurality of semiconductor portions provided between the first stacked body and the second stacked body and arranged in a third direction intersecting with the first and second directions, the plurality of semiconductor portions comprising a first semiconductor layer facing the plurality of first conductive layers, a second semiconductor layer facing the plurality of second conductive layers, and a first insulating layer provided between the first semiconductor layer and the second semiconductor layer;
a first memory portion storing information between the first conductive layer and the first semiconductor layer;
a second memory portion storing information between the second conductive layer and the second semiconductor layer; and
a second insulating layer provided between the semiconductor portions adjacent to each other in the third direction,
wherein the width in the second direction of the first insulating layer has local maxima at a first position in the first direction and a second position in the first direction different from the first position,
wherein, referring to a cross-section which intersects with the first direction and on which a width in the second direction of at least one of the first insulating layers is the smallest in the range between the first and second positions as a first cross-section;
the smallest distance from a geometrical center of gravity of the second insulating layer to the first or second stacked body on the first cross-section being represented by D1;
referring to a cross-section which intersects with the first direction and on which a width in the second direction of at least one of the first insulating layers is the largest as a second cross-section;
a distance from a surface of the first stacked body facing a predetermined one of the semiconductor portions to a surface of the second stacked body facing the predetermined one of the semiconductor portions on the second cross-section being represented by D2,
a relationship 2D1>D2 is satisfied.

2. The semiconductor memory device according to claim 1 wherein the width in the second direction of the first insulating layer has local maxima at a plurality of positions in the first direction,
among the plurality of positions at which the width in the second direction of the first insulating layer has local maxima, one of the plurality of the positions being closest to the substrate, is the first position, and one of the plurality of the positions being farthest from the substrate, is the second position.

3. The semiconductor memory device according to claim 1 wherein
the first insulating layer comprises a first insulating portion extending in the first direction, and a second insulating portion extending in the first direction farther from the substrate than the first insulating portion;
the second insulating layer comprises a third insulating portion extending in the first direction, and a fourth insulating portion extending in the first direction farther from the substrate than the third insulating portion; and
referring to a distance between a center position in the second direction of the first insulating portion and a center position in the second direction of the second insulating portion as d1, and
referring to a distance between the center position in the second direction of the second insulating portion and a center position in the second direction of the fourth insulating portion as d2,
the relationship d1>d2 is satisfied.

4. The semiconductor memory device according to claim 1 wherein
the first insulating layer comprises a first insulating portion extending in the first direction, and a second insulating portion extending in the first direction farther from the substrate than the first insulating portion;
the second insulating layer comprises a third insulating portion extending in the first direction, and a fourth insulating portion extending in the first direction farther from the substrate than the third insulating portion;

the first insulating portion is connected to the second insulating portion; and the third insulating portion is connected to the fourth insulating portion.

5. The semiconductor memory device according to claim 1 wherein on the first cross-section, at least one of the first stacked body and the second stacked body comprises a first surface facing the semiconductor portions, and a second surface in contact with the second insulating layer, wherein the first usrface and the second surface forms a continuous curved surface.

6. The semiconductor memory device according to claim 1, comprising a third insulating layer provided between the first stacked body and the first semiconductor layer, and containing the first memory portion, and a fourth insulating layer provided between the second stacked body and the second semiconductor layer, and containing the second memory portion, wherein the distance D2 on the second cross-section is defined as a distance from an interface between the first stacked body and the third insulating layer to an interface between the second stacked body and the fourth insulating layer.

7. The semiconductor memory device according to claim 1, wherein each of the semiconductor portions comprises a first portion extending in the first direction, a second portion extending in the first direction and being farther from the substrate than the first portion, and a connection portion connected to an end portion of an opposite side from the substrate of the first portion and an end portion of the substrate side of the second portion, a width in the second direction of the connection portion being larger than a largest width in the second direction of the first portion and the second portion, wherein, referring to a width in the first direction of the connection portion as W3, the relationship D2>W3 is satisfied.

8. The semiconductor memory device according to claim 1, wherein the first memory portion is a first charge accumulation film, has an insulating property, is provided between the first stacked body and the first semiconductor layer, and the second memory portion is a second charge accumulation film, having an insulating property, provided between the second stacked body and the second semiconductor layer.

9. The semiconductor memory device according to claim 1, wherein the first memory portion is a first floating gate contained in the first stacked body, and the second memory portion is a second floating gate contained in the second stacked body.

10. A semiconductor memory device comprising:

a substrate;

a first stacked body comprising a plurality of first conductive layers stacked in a first direction intersecting with a surface of the substrate;

a second stacked body comprising a plurality of second conductive layers stacked in the first direction, and being adjacent to the first stacked body in a second direction intersecting with the first direction;

a plurality of semiconductor portions provided between the first stacked body and the second stacked body and arranged in a third direction intersecting with the first and second directions, the plurality of semiconductor portions comprising a first semiconductor layer facing the plurality of first conductive layers, a second semiconductor layer facing the plurality of second conductive layers, and a first insulating layer provided between the first semiconductor layer and the second semiconductor layer;

a first memory portion storing information between the first conductive layer and the first semiconductor layer;

a second memory portion storing information between the second conductive layer and the second semiconductor layer; and a second insulating layer provided between the semiconductor portions adjacent to each other in the third direction, wherein the first insulating layer comprises a first insulating portion extending in the first direction, and a second insulating portion extending in the first direction farther from the substrate than the first insulating portion, and the second insulating layer comprises a third insulating portion extending in the first direction, and a fourth insulating portion extending in the first direction farther from the substrate than the third insulating portion, wherein, referring to a distance between a center position in the second direction of the first insulating portion and a center position in the second direction of the second insulating portion as d1, referring to a distance between the center position in the second direction of the second insulating portion and a center position in the second direction of the fourth insulating portion as d2, the relationship d1>d2 is satisfied.

11. The semiconductor memory device according to claim 10, wherein the first insulating portion is connected to the second insulating portion, and the third insulating portion is connected to the fourth insulating portion.

12. The semiconductor memory device according to claim 10, wherein the first memory portion is a first charge accumulation film, has an insulating property, is provided between the first stacked body and the first semiconductor layer, and the second memory portion is a second charge accumulation film, has an insulating property, is provided between the second stacked body and the second semiconductor layer.

13. The semiconductor memory device according to claim 10, wherein the first memory portion is a first floating gate contained in the first stacked body, and the second memory portion is a second floating gate contained in the second stacked body.

\* \* \* \* \*